United States Patent
Jeong et al.

(10) Patent No.: US 8,976,894 B2
(45) Date of Patent: Mar. 10, 2015

(54) DIGITAL BROADCASTING TRANSMITTER, DIGITAL BROADCASTING RECEIVER, AND STREAM CONFIGURATION AND METHOD FOR PROCESSING SAME

(75) Inventors: Jin-hee Jeong, Yongin-si (KR); Jung-jin Kim, Yongin-si (KR); Yong-Sik Kwon, Suwon-si (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 82 days.

(21) Appl. No.: 13/698,792

(22) PCT Filed: May 13, 2011

(86) PCT No.: PCT/KR2011/003566
§ 371 (c)(1),
(2), (4) Date: Nov. 19, 2012

(87) PCT Pub. No.: WO2011/145841
PCT Pub. Date: Nov. 24, 2011

(65) Prior Publication Data
US 2013/0064280 A1 Mar. 14, 2013

Related U.S. Application Data

(60) Provisional application No. 61/344,065, filed on May 17, 2010.

(51) Int. Cl.
*H04L 25/03* (2006.01)
*H04H 60/11* (2008.01)
*H04H 20/42* (2008.01)
*H03M 13/27* (2006.01)
(Continued)

(52) U.S. Cl.
CPC ............... *H04H 60/11* (2013.01); *H04H 20/42*
(2013.01); *H03M 13/2721* (2013.01); *H03M 13/2933* (2013.01); *H03M 13/2945* (2013.01); *H03M 13/356* (2013.01); *H04L 1/0057* (2013.01); *H04L 1/006* (2013.01); *H04L 1/0065* (2013.01); *H04L 1/007* (2013.01); *H03M 13/09* (2013.01);
(Continued)

(58) Field of Classification Search
CPC .... H04L 1/0064; H04L 1/0041; H04L 1/0065
USPC .................. 375/296; 714/701, 738, 739, 755
See application file for complete search history.

(56) References Cited

U.S. PATENT DOCUMENTS

2006/0062185 A1* 3/2006 Darwood et al. ............. 370/335
2006/0244865 A1 11/2006 Simon
(Continued)

OTHER PUBLICATIONS

International Search Report (PCT/ISA/210) dated Dec. 14, 2011, issued in International Application No. PCT/KR2011/003566.

*Primary Examiner* — Kevin Kim
(74) *Attorney, Agent, or Firm* — Sughrue Mion, PLLC

(57) ABSTRACT

Provided are a digital broadcast transmitter, a digital broadcast receiver, a stream-processing method for the digital broadcasting transmitter, and a stream-processing method for the digital broadcast receiver. The stream-processing method for the digital broadcasting transmitter includes: configuring a stream in which slots including a plurality of blocks are continuously disposed; and encoding and interleaving the stream to be output as a transport stream, wherein the configuring the stream includes, if slots of a block extension mode 00 are continuously placed, connecting known data placed in predetermined locations of adjacent slots to each other in order to generate a long training sequence.

24 Claims, 65 Drawing Sheets

(51) Int. Cl.
*H03M 13/29* (2006.01)
*H03M 13/35* (2006.01)
*H04L 1/00* (2006.01)
*H03M 13/09* (2006.01)
*H03M 13/15* (2006.01)
*H03M 13/23* (2006.01)

(52) U.S. Cl.
CPC ........... *H03M 13/1515* (2013.01); *H03M 13/23* (2013.01)

USPC .......................................... 375/296; 714/738

(56) References Cited

U.S. PATENT DOCUMENTS

2007/0092032 A1* 4/2007 Yu et al. .................... 375/295
2008/0069147 A1 3/2008 Lee et al.
2009/0034556 A1 2/2009 Song et al.
2010/0054361 A1 3/2010 Yu et al.

* cited by examiner

FIG. 41

| Type 1 |
|---|
| Type 0 |
| Type 0 |
| Type 0 |
| Type 1 |
| Type 0 |
| Type 0 |
| Type 0 |
| Type 1 |
| Type 0 |
| Type 0 |
| Type 0 |

FIG. 42

| ex 1 | ex 2 | ex 3 | ex 4 | ex 5 | ex 6 |
|---|---|---|---|---|---|
| Type 0 | Type 1-4 | Type 1-4 | Type 1-4 | Type 1-4 | Type 1-4 |
| Type 1-1 | Type 0 | Type 0 | Type 1-2 | Type 1-2 | Type 1-4 |
| Type 1-2 | Type 1-4 | Type 1-3 | Type 1-3 | Type 1-3 | Type 1-4 |
| Type 1-3 | Type 0 | Type 0 | Type 0 | Type 1-1 | Type 1-4 |
| Type 1-4 | Type 1-4 | Type 1-4 | Type 1-4 | Type 1-4 | Type 1-4 |
| Type 0 | Type 0 | Type 0 | Type 1-2 | Type 1-2 | Type 1-4 |
| Type 1-1 | Type 1-4 | Type 1-3 | Type 1-3 | Type 1-3 | Type 1-4 |
| Type 1-2 | Type 0 | Type 0 | Type 0 | Type 1-1 | Type 1-4 |
| Type 1-3 | Type 1-4 | Type 1-4 | Type 1-4 | Type 1-4 | Type 1-4 |
| Type 1-4 | Type 0 | Type 0 | Type 1-2 | Type 1-2 | Type 1-4 |
| Type | Type 0 | Type 0 | Type 0 | Type 1-1 | Type 1-4 |
| Type 1-2 | Type 1-4 | Type 1-4 | Type 1-4 | Type 1-4 | Type 1-4 |
| Type 1-3 | Type 0 | Type 0 | Type 1-2 | Type 1-2 | Type 1-4 |
| Type 1-4 | Type 1-4 | Type 1-3 | Type 1-3 | Type 1-3 | Type 1-4 |
| Type 0 | Type 0 | Type 0 | Type 0 | Type 1-1 | Type 1-4 | orphan

DIGITAL BROADCASTING TRANSMITTER, DIGITAL BROADCASTING RECEIVER, AND STREAM CONFIGURATION AND METHOD FOR PROCESSING SAME

CROSS-REFERENCE TO RELATED APPLICATIONS

This application is a National Stage application under 35 U.S.C. §371 of International Application No. PCT/KR2011/003566, filed on May 13, 2011, and claims the benefit of U.S. Provisional Application No. 61/344,065, filed on May 17, 2010 in the United States Patent and Trademark Office, the disclosures of which are incorporated herein by reference in their entireties.

BACKGROUND

1. Field

Systems and methods consistent with exemplary embodiments relate to a digital broadcast transmitter, a digital broadcast receiver, and methods for configuring and processing a stream thereof, and more particularly, to a digital broadcast transmitter, which configures a transport stream including mobile data along with normal data and transmits the transport stream, a digital broadcast receiver, which receives and processes the transport stream, and methods thereof.

2. Description of the Related Art

As digital broadcasting has come into wide use, various types of electronic apparatuses support digital broadcasting services. In particular, in addition to apparatuses provided in general households such as a digital broadcasting TV or a set-top box, portable apparatuses which are easy to carry, such as a mobile phone, a navigation system, a personal digital assistance (PDA), a multimedia player (e.g., an MP3 player), etc., are equipped with a function of supporting digital broadcasting services.

Therefore, digital broadcasting standards for providing digital broadcasting services to such a portable apparatus have been under discussion.

One of the standards is the ATSC-Mobile/Handheld (MH) standard. The ATSC-MH standard discloses a technology for placing mobile data in a transport stream, which is to transmit data for general digital broadcasting services, that is, normal data, and transmitting the mobile data.

Since the mobile data is received and processed by a portable apparatus, the mobile data is processed in a format robust against an error in comparison to the normal data due to mobility of the portable apparatus and is included in the transport stream.

FIG. 1 illustrates an example of a transport stream configuration including mobile data and normal data.

Section (A) of FIG. 1 illustrates a stream in which mobile data and normal data are placed in packets allocated thereto respectively and multiplexed.

The stream of section (A) of FIG. 1 is converted into a stream of section (B) of FIG. 1 by interleaving. As shown in section (B) of FIG. 1, MH, that is, mobile data may be divided into regions A and B by interleaving. Region A is a region that falls within a predetermined range with reference to a portion where mobile data greater than a predetermined size are gathered in a plurality of transmission units, and region B is a region other than region A. The mobile data is divided into regions A and B by way of an example and may be divided in a different way. That is, in section (B) of FIG. 1, a portion which does not include normal data may be set to region A and a portion corresponding to a transmission unit in which normal data is at least placed may be set to region B.

There is a problem that region B is relatively vulnerable to an error in comparison to region A. That is, digital broadcast data may include known data, for example, a training sequence, to be appropriately demodulated and equalized by a receiver to correct an error. According to the related-art ATSC-MH standard, the known data is not placed in region B and thus there is a problem that region B is vulnerable to an error.

Also, the stream defined as shown in FIG. 1 may limit a transmission of mobile data. That is, the number of broadcasting stations and apparatuses for supporting mobile broadcasting services has been increased, but, a portion allocated to the normal data on the stream shown in FIG. 1 is unavailable and thus efficiency of the stream deteriorates.

Therefore, there is a demand for a method for using a transport stream efficiently.

SUMMARY

Aspects of one or more exemplary embodiments provide a digital broadcast transmitter, a digital broadcast receiver, and methods for configuring and processing a stream thereof, which can utilize packets of a transport stream allocated to normal data in various ways, thereby diversifying transmission efficiency of mobile data and also improving performance in receiving the transport stream.

According to an aspect of an exemplary embodiment, there is provided a method for processing a stream of a digital broadcast transmitter, the method including: configuring a stream in which slots including a plurality of blocks are placed; and encoding and interleaving the stream and transmitting the stream as a transport stream, wherein the configuring the stream includes, if slots of a block extension mode 00 are continuously placed, connecting known data placed in predetermined locations of adjacent slots to each other in order to generate a long training sequence.

First known data which is placed in a tail portion of a preceding slot of the adjacent slots and second known data which is placed in a head portion of a following slot of the adjacent slots may be alternately connected to each other on a boundary, and a value of the first known data and a value of the second known data may be predetermined values to generate a long training sequence which is known to the digital broadcast transmitter and a digital broadcast receiver.

The known data may have a same sequence as a long training sequence that is used in a slot of a block extension mode 01 in which some block of a corresponding slot is provided to another slot.

The transmitting may include initializing a trellis encoder before known data corresponding to an initial portion of the long training sequence is trellis-encoded.

The transmitting may include, if slots of different block extension modes are continuously placed, initializing a trellis encoder before known data which is placed in a sawtooth portion of a boundary between the continuously placed slots is trellis encoded.

According to an aspect of another exemplary embodiment, there is provided a digital broadcast transmitter including: a stream configuration unit which configures a stream in which slots including a plurality of blocks are placed; and an exciter unit which encodes and interleaves the stream and transmits the stream as a transport stream.

If slots of a block extension mode 00 in which all blocks of a corresponding slot are used are continuously placed, the stream configuration unit may place known data in predetermined segments of adjacent slots in order to generate a long training sequence on a boundary between the adjacent slots engaged with a saw-toothed configuration.

First known data which is placed in a tail portion of a preceding slot of the adjacent slots and second known data which is placed in a head portion of a following slot of the adjacent slots may be alternately connected to each other on the boundary, and a value of the first known data and a value of the second known data may be predetermined values to generate a long training sequence which is known to the digital broadcast transmitter and a digital broadcast receiver.

The known data may have a same sequence as a long training sequence that is used in a slot of a block extension mode 01, in which some block of a corresponding slot is provided to another slot.

The exciter unit may include: an encoding unit which encodes the stream, an interleaver unit which interleaves the encoded stream, and a trellis encoder unit which trellis-encodes the interleaved stream.

The trellis encoder unit may be initialized before known data corresponding to an initial portion of the long training sequence is trellis-encoded.

If slots of different block extension modes are continuously placed, the trellis encoder unit may be initialized before known data which is placed in a sawtooth portion of a boundary between the continuously placed slots is trellis encoded.

According to an aspect of another exemplary embodiment, there is provided a method for processing a stream of a digital broadcast receiver, the method including: receiving a transport stream which is encoded and interleaved if slots including a plurality of blocks are placed; demodulating the received transport stream; equalizing the demodulated transport stream; and decoding new mobile data from the equalized stream.

Each slot of the transport stream may include at least one of normal data, existing mobile data, and new mobile data, and, if slots of a block extension mode 00 are continuously placed, in the transport stream, known data which is placed in predetermined locations of adjacent slots may be connected to each other in order to generate a long training sequence.

First known data which is placed in a tail portion of a preceding slot of the adjacent slots and second known data which is placed in a head portion of a following slot of the adjacent slots may be alternately connected to each other on a boundary, and a value of the first known data and a value of the second known data may be predetermined values to generate a long training sequence which is known to a digital broadcast transmitter and the digital broadcast receiver.

The known data may have a same sequence as a long training sequence that is used in a slot of a block extension mode 01, in which some block of a corresponding slot is provided to another slot.

The method may further include decoding signaling data of each slot and identifying a block extension mode of each of the slots.

The method may further include, if decoding of signaling data of the following slot of the adjacent slots is completed and it is identified that a block extension mode of the following slot is 00, detecting the known data placed in the sawtooth portion of the boundary between the adjacent slots as the long training sequence and processing the known data.

The method may further include decoding signaling data of the preceding slot of the adjacent slots and identifying block extension modes of both the preceding slot and the following slot.

According to an aspect of another exemplary embodiment, there is provided a digital broadcast receiver including: a receiving unit which receives a transport stream which is encoded and interleaved if slots including a plurality of blocks are placed; a demodulator which demodulates the received transport stream; an equalizer which equalizes the demodulated transport stream; and a decoding unit which decodes new mobile data from the equalized stream.

Each slot of the transport stream may include at least one of normal data, existing mobile data, and new mobile data, and, if slots of a block extension mode 00 are continuously placed, in the transport stream, known data which is placed in predetermined locations of adjacent slots may be connected to each other in order to generate a long training sequence.

First known data which is placed in a tail portion of a preceding slot of the adjacent slots and second known data which is placed in a head portion of a following slot of the adjacent slots may be alternately connected to each other on a boundary, and a value of the first known data and a value of the second known data may be predetermined values to generate a long training sequence which is known to a digital broadcast transmitter and the digital broadcast receiver.

The long training sequence may have a same sequence as a long training sequence that is used in a slot of a block extension mode 01, in which some block of a corresponding slot is provided to another slot.

The digital broadcast receiver may further include a signaling decoder which decodes signaling data of each slot and identifies a block extension mode of each of the slots.

The digital broadcast receiver may further include a detection unit which, if decoding of signaling data of the following slot of the adjacent slots is completed and it is identified that a block extension mode of the following slot is 00, detects the known data placed in a sawtooth portion of the boundary between the adjacent slots as the long training sequence and processing the known data.

The digital broadcast may further include a signaling decoder which decodes signaling data of the preceding slot of the adjacent slots and identifies block extension modes of both the preceding slot and the following slot.

According to aspects of various exemplary embodiments, a transport stream is transmitted in various formats, so that a receiver can receive various types of mobile data.

Additional aspects and advantages of exemplary embodiments will be set forth in the detailed description, will be obvious from the detailed description, or may be learned by practicing exemplary embodiments.

BRIEF DESCRIPTION OF THE DRAWINGS

The above and/or other aspects will become and more readily appreciated from the following description of exemplary embodiments, taken in conjunction with the accompanying drawings of which:

FIGS. 41 to 43 are views illustrating various types of slots which are repeatedly placed in sequence, according to exemplary embodiments;

DETAILED DESCRIPTION OF EXEMPLARY EMBODIMENTS

Figure 1:
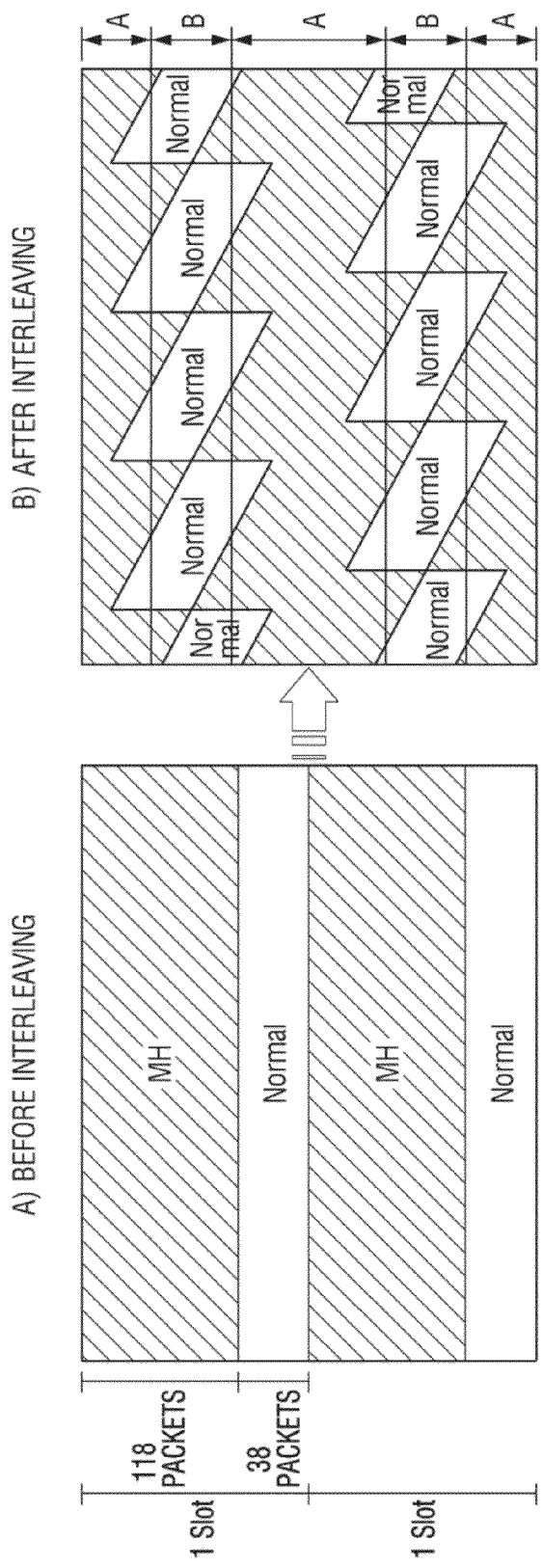
FIG. 1 illustrates an example of a transport stream configuration according to a related-art ATSC-MH standard.

Reference will now be made in detail to exemplary embodiments, examples of which are illustrated in the accompanying drawings, wherein like reference numerals refer to the like elements throughout. Exemplary embodiments are described below with reference to the drawings.

[Digital Broadcast Transmitter]

Figure 2:
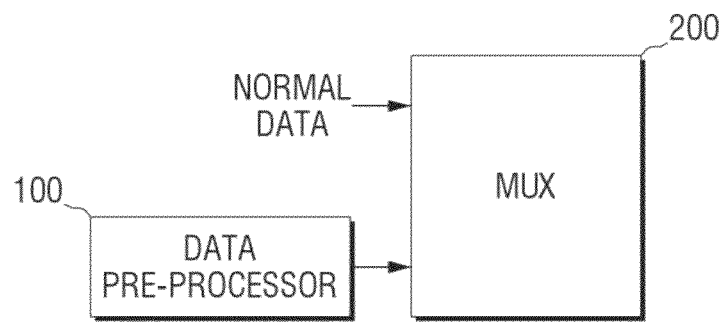
FIGS. 2 to 4 are block diagrams illustrating a digital broadcast transmitter according to various exemplary embodiments.

Referring to FIG. 2, a digital broadcast transmitter according to an exemplary embodiment includes a data pre-processor 100 and a multiplexer 200.

The data pre-processor 100 receives an input of mobile data, processes the mobile data appropriately, and converts the mobile data into data of a format suitable for transmission.

The multiplexer 200 configures a transport stream including the mobile data output from the data pre-processor 100. If normal data is to be transmitted, the multiplexer 200 configures a transport stream by multiplexing the mobile data and the normal data.

The data pre-processor 100 may process the mobile data so that the mobile data is placed in all or some of the packets of the entire stream allocated to the normal data.

That is, as explained with reference to FIG. 1, some of the packets are allocated to the normal data according to the ATSC-MH standard. Specifically, as shown in FIG. 1, the stream may be divided into a plurality of slots based on a unit of time and one slot may include 156 packets. Among these packets, 38 packets may be allocated to the normal data and the remaining 118 packets may be allocated to the mobile data. For the convenience of explanation, the 118 packets is referred to as a region allocated to the mobile data or a first region, and the 38 packets is referred to as a region allocated to the normal data or a second region. The normal data refers to various types of related art data that can be received and processed by a general television (TV), and the mobile data refers to data that can be received and processed by a mobile apparatus. The mobile data may be expressed by various terms, such as robust data, turbo data, additional data, etc.

The data pre-processor 100 may place the mobile data in a packet region allocated to the mobile data, and separately, may place the mobile data in all or some of the packets allocated to the normal data. For the convenience of explanation, the mobile data placed in the packets allocated to the mobile data is referred to as existing mobile data or first mobile data, and the region allocated to the existing mobile data is referred to as the first region as described above. On the other hand, the mobile data placed in the second region, that is, the packets allocated to the normal data, is referred to as new mobile data, mobile data, or second mobile data for the convenience of explanation. The existing mobile data and the mobile data may be the same data or may be different types of data.

The data pre-processor 100 may place the mobile data in various patterns according to a setting condition such as a frame mode or a set mode. The patterns in which the mobile data is placed will be explained below with reference to the drawings.

The multiplexer 200 multiplexes the stream and the normal data output from the data pre-processor 100, thereby configuring a transport stream.

Figure 3:
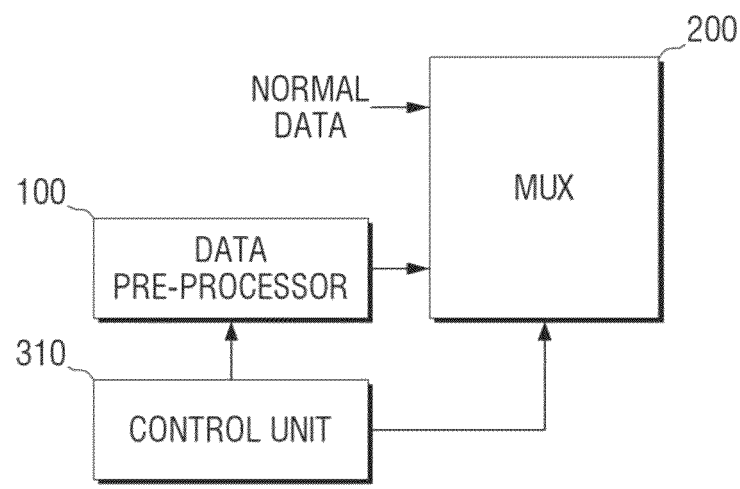

FIG. 3 illustrates an exemplary embodiment in which a controller 310 is added to the digital broadcast transmitter of FIG. 2. Referring to FIG. 3, the controller 310 provided in the digital broadcast transmitter determines a setting condition of a frame mode and controls an operation of the data pre-processor 100.

Specifically, if it is determined that a first frame mode is set, the controller 310 controls the data pre-processor 100 to place the mobile data only in the first region without placing the mobile data in all of the packets allocated to the normal data. That is, the data pre-processor 100 outputs the stream including only the existing mobile data. Accordingly, the normal data is placed in the packets allocated to the normal data by the multiplexer 200 so that a transport stream is configured.

On the other hand, if it is determined that a second frame mode is set, the controller 310 controls the data pre-processor 100 to place the existing mobile data in the packets allocated to the mobile data, that is, the first region, and to place the mobile data in at least some of the packets allocated to the normal data, that is, at least a part of the second region.

In this case, the controller 310 may determine a setting condition of a separate mode other than the frame mode, that is, a mode indicating the number of packets where the mobile data is to be placed from among the packets allocated to the normal data. Accordingly, the controller 310 may control the data pre-processor 100 to place the mobile data in the packets as many as the number corresponding to the setting condition of the mode, from among the entire packets allocated to the normal data.

The mode referred to herein may be provided in various forms. For example, the mode may include at least one compatible mode and an incompatible mode. The compatible mode refers to a mode in which compatibility with an existing normal data receiver, which receives and processes normal data, is maintained, and the incompatible mode refers to a mode in which compatibility is not maintained.

Specifically, the compatible mode may include a plurality of compatible modes in which new mobile data is placed at least a part of the second region. For example, the compatible mode may be either one of a first compatible mode in which the mobile data is placed in only some of the packets allocated to the normal data, or a second compatible mode in which the mobile data is placed in all of the packets allocated to the normal data.

The first compatible mode may be a mode in which the mobile data is placed in only a part of each data region of some packets in the second region. That is, the mobile data may be placed in a part of the entire data region of some packets, and the normal data may be placed in the other data region.

Also, the first compatible mode may be a mode in which the mobile data is placed in the entire data region of some packets in the second region.

The mode may be provided in various forms considering the number of packets allocated to the normal data, a size of mobile data, a type of mobile data, a transmission time, and a transmission environment.

For instance, as shown in FIG. 1, if 38 packets are allocated to the normal data, the first compatible mode may include:
1) a first mode in which new mobile data is placed in the 38 packets at a ratio of 1/4;
2) a second mode in which new mobile data is placed in the 38 packets at a ratio of 2/4;
3) a third mode in which new mobile data is placed in the 38 packets at a ratio of 3/4; and
4) a fourth mode in which new mobile data is placed in all of the 38 packets.

In the first mode, the new mobile data may be placed in a sum of 2 of the 38 packets and 9 packets which corresponds to the quotient of the remaining 36 packets divided by 4, that is, 11 packets in total. In the second mode, the new mobile data may be placed in a sum of 2 of the 38 packets and 18 packets which corresponds to the quotient of the remaining 36 packets divided by 2, that is, 20 packets in total. In the third mode, the new mobile data may be placed in a sum of 2 of the 38 packets and 27 packets which is the remaining 36 packets multiplied by 3/4, that is, 29 packets in total. In the fourth mode, the new mobile data may be placed in all of the 38 packets.

On the other hand, the incompatible mode refers to a mode in which a transmission capacity of the new mobile data can increase regardless of compatibility with the receiver receiving the normal data. Specifically, the incompatible mode may be a mode in which the new mobile data is placed using an MPEG header and Reed Solomon (RS) parity region of the first region in addition to the entire second region.

As a result, the data pre-processor 100 of FIG. 2 or FIG. 3 may configure a transport stream by placing the new mobile data according to various modes as follows:
1) a first mode in which new mobile data is placed in 11 packets in total from among the 38 packets allocated to the normal data;
2) a second mode in which new mobile data is placed in 20 packets in total from among the 38 packets allocated to the normal data;
3) a third mode in which new mobile data is placed in 29 packets in total from among the 38 packets allocated to the normal data;
4) a fourth mode in which new mobile data is placed in all of the 38 packets allocated to the normal data; and
5) a fifth mode in which new mobile data is placed in all of the 38 packets allocated to the normal data and in a region corresponding to an MPEG header and a parity of a region allocated to the existing mobile data.

Although the fifth mode is referred to as an incompatible mode and the first to the fourth modes are referred to as compatible modes in the present exemplary embodiment for the convenience of explanation, each mode may be differently named. Also, although there are five modes in total including four compatible modes and one incompatible mode in the above-described exemplary embodiment, the number of compatible modes may be changed variously. For example, the first to the third modes may be used as compatible modes as described above, and the fourth mode may be set to the fifth mode, that is, the incompatible mode.

The data pre-processor 100 may insert known data in addition to the mobile data. The known data described herein refers to a sequence that is commonly known to the digital broadcast transmitter and the digital broadcast receiver. The digital broadcast receiver receives known data transmitted from the digital broadcast transmitter and identifies a difference from a sequence known previously, and then grasps a degree of error correction. The known data may be expressed by various terms such as training data, a training sequence, a reference signal, an additional reference signal, etc. However, the term "known data" will be used throughout the specification for convenience of description.

The data pre-processor 100 inserts at least one of the mobile data and the known data into various portions of the entire transport stream, thereby improving reception performance.

That is, referring to the stream configuration shown in section (B) of FIG. 1, MH, that is, mobile data is gathered in region A and is formed in region B in a conical configuration. Therefore, region A may be referred to as a body region and region B may be referred to as a head/tail region. Since known data is not placed in the head/tail region, there is a problem in the related art that data does not show good performance in comparison to data of the body region.

Accordingly, the data pre-processor 100 inserts known data into an appropriate location to be placed in the head/tail region. The known data may be placed in a long training sequence format in which data greater than a predetermined size is continuously placed, or may be placed in a discontinuously distributed format.

The mobile data and the known data may be inserted in various formats according to an exemplary embodiment. This will be explained in detail with reference to the accompanying drawings. However, a detailed configuration of a digital broadcast transmitter will be explained first in more detail.

[Detailed Configuration of Digital Broadcast Transmitter]

Figure 4:
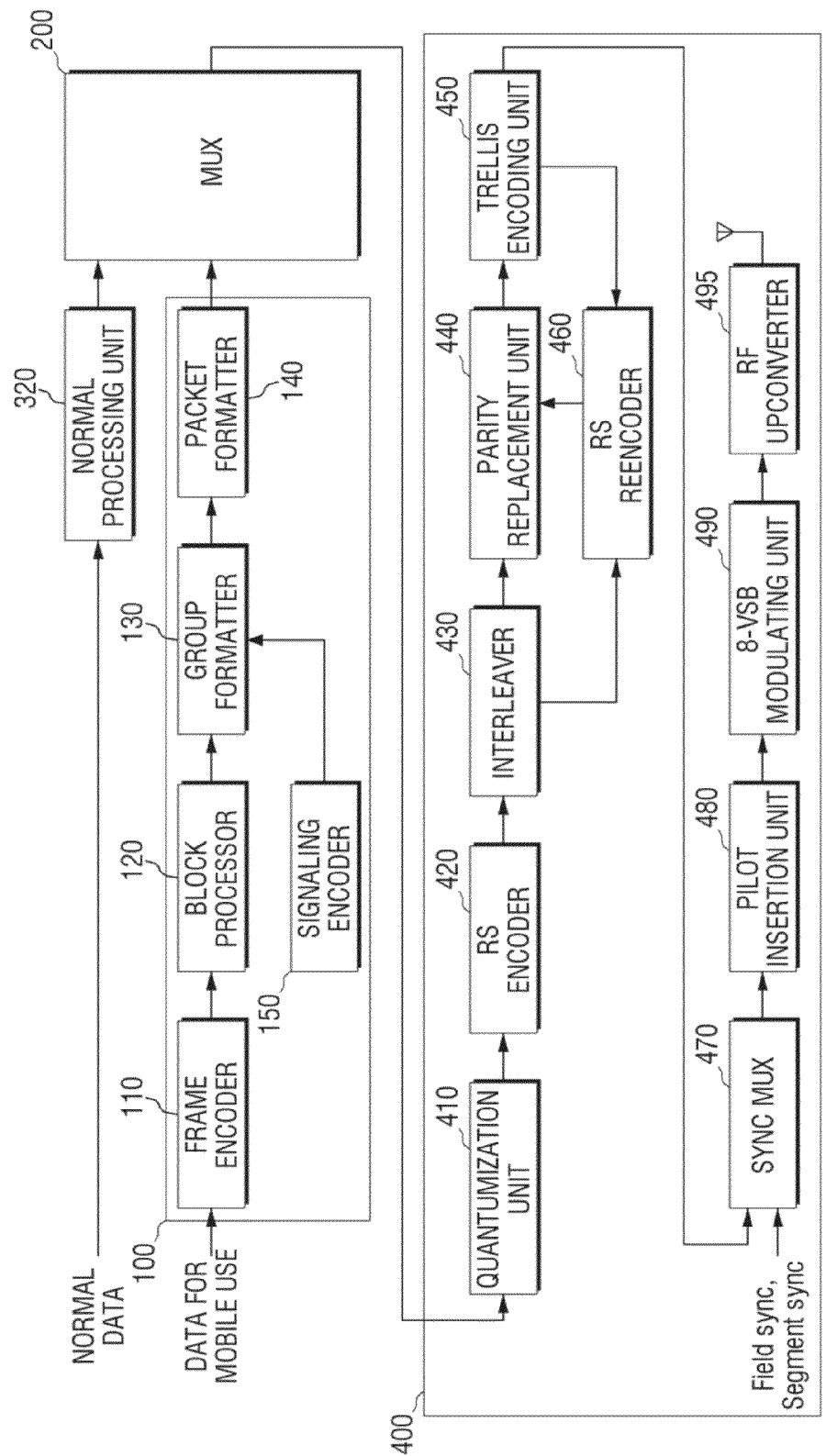

FIG. 4 is a block diagram illustrating, in detail, a digital broadcast transmitter according to an exemplary embodiment. Referring to FIG. 4, the digital broadcast transmitter may include a normal processor 320 and an exciter unit 400 (e.g., exciter) in addition to the data pre-processor 100 and the multiplexer 200. For the convenience of explanation, a unit including the data pre-processor 100, the normal processor 320, and the multiplexer 200 may be referred to as a stream configuration unit or a stream configurator.

In FIG. 4, the controller 310 shown in FIG. 3 is omitted. However, it is understood that the controller 310 may be included in the digital broadcast transmitter. Also, one or more elements of the digital broadcast transmitter shown in FIG. 4 may be deleted or a new element may be added when necessary, and an arrangement order of the elements and the number of elements may be changed variously.

Referring to FIG. 4, the normal processor 320 receives normal data and converts the received normal data into data of an appropriate format suitable to a transport stream configuration. That is, since the digital broadcast transmitter configures a transport stream including normal data and mobile data and transmits the configured transport stream, a receiver which receives normal data should receive and process the normal data appropriately. Accordingly, the normal processor 320 adjusts a packet timing and a program clock reference (PCR) of the normal data (or main service data) to have a format suitable to the MPEG/ATSC standard, which is used for normal data decoding. A detailed explanation thereof is disclosed in Annex B of the ATSC-MH (the entire disclosure of which is incorporated herein by reference) and thus is omitted here.

The data pre-processor 100 includes a frame encoder 110, a block processor 120, a group formatter 130, a packet formatter 140, and a signaling encoder 150.

The frame encoder 110 performs RS frame encoding. Specifically, the frame encoder 110 receives a single service and builds a predetermined number of RS frames. For example, if a single service is an M/H ensemble unit including a plurality of M/H parades, the frame encoder 110 builds a predetermined number of RS frames for each M/H parade. Specifically, the frame encoder 110 randomizes input mobile data, performs RS-CRC encoding, divides the mobile data into RS frames according to a predetermined frame mode, and outputs a predetermined of RS frames.

Figure 5:
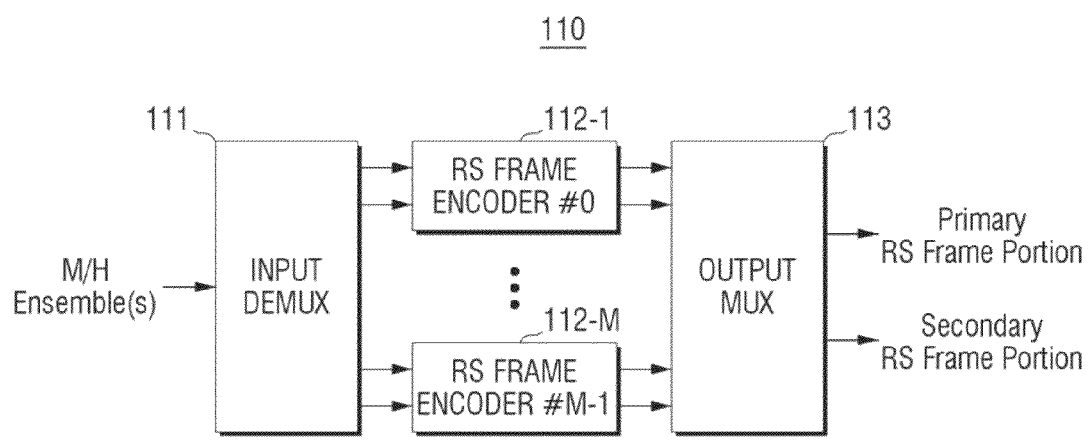
FIG. 5 is a block diagram illustrating a frame encoder according to an exemplary embodiment.

FIG. 5 is a block diagram illustrating an example of the frame encoder 110. Referring to FIG. 5, the frame encoder 110 includes an input de-multiplexer 111, a plurality of RS frame encoders 112-1~112-M, and an output multiplexer 113.

If mobile data of a predetermined service unit (for example, an M/H ensemble) is input, the input de-multiplexer 111 de-multiplexes the mobile data into a plurality of ensembles, for example, a primary ensemble and a secondary ensemble, according to pre-set configuration information, that is, a frame mode, and outputs the ensembles to the RS frame encoders 112-1~112-M. Each of the RS frame encoders 112-1~112-M performs randomization, RS-CRC encoding, and dividing with respect to the input ensembles, and outputs the ensembles to the output multiplexer 113. The output multiplexer 113 multiplexes frame portions output from the RS frame encoders 112-1~112-M, and outputs a primary RS frame portion and a secondary RS frame portion. In this case, only the primary RS frame portion may be output according to a setting condition of the frame mode.

Figure 6:
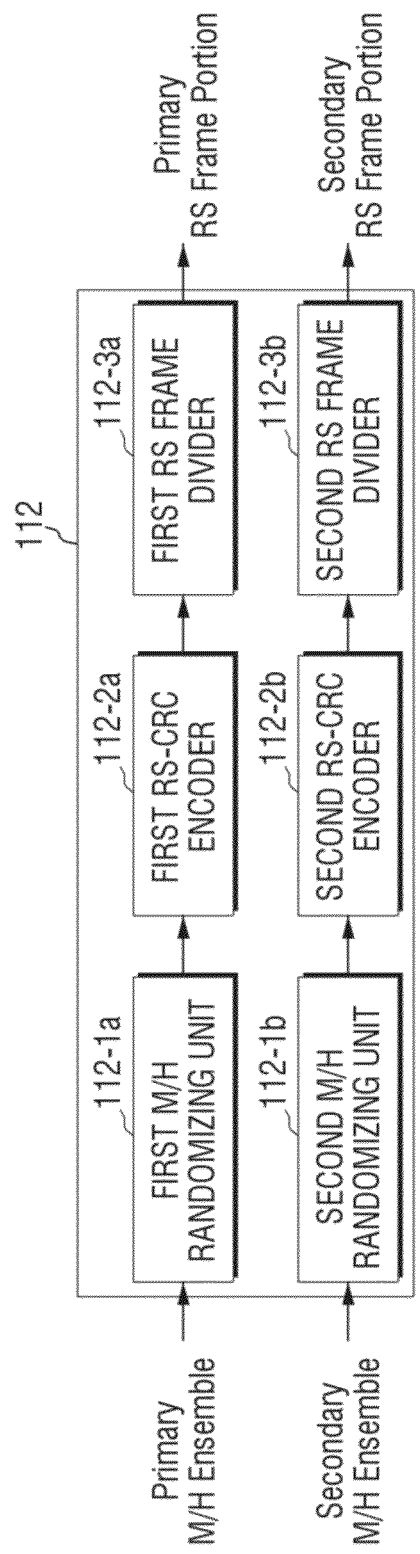
FIG. 6 is a block diagram illustrating an example of a Reed Solomon (RS) frame encoder of the frame encoder of FIG. 5.

FIG. 6 is a block diagram illustrating an example of an RS frame encoder which is one of the RS frame encoders 112-1~112-M. Referring to FIG. 6, the frame encoder 112 includes a plurality of M/H randomizers 112-1a and 112-1b, a plurality of RS-CRC encoders 112-2a and 112-2b, and a plurality of RS frame dividers 112-3a and 112-3b.

If the primary M/H ensemble and the secondary M/H ensemble are input from the input de-multiplexer 111, each of the M/H randomizers 112-1a and 112-1b performs randomization and each of the RS-CRC encoders 112-2a and 112-2b RS-CRC encodes the randomized data. Each of the RS frame dividers 112-3a and 112-3b divides data to be block-coded appropriately and outputs the data to the output multiplexer 113 so that the block processor 120 disposed at a rear end of the frame encoder 110 block-codes the data appropriately. The output multiplexer 113 multiplexes frame portions by combining them appropriately and outputs the frame portions to the block processor 120 so that the block processor 120 block-codes the data.

The block processor 120 codes the stream output from the frame encoder 110 in the unit of a block, that is, block-codes the stream.

Figure 7:
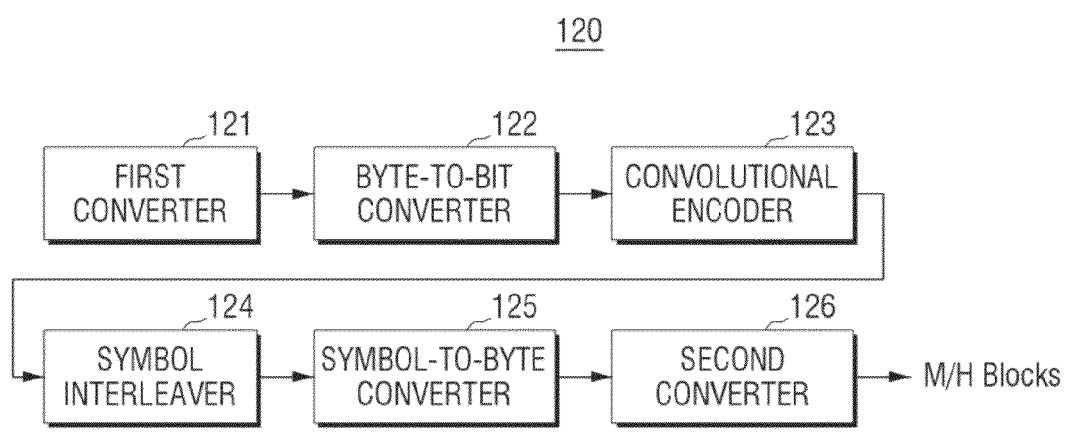
FIG. 7 is a block diagram illustrating a block processor according to an exemplary embodiment.

FIG. 7 is a block diagram illustrating an example of the block processor 120.

Referring to FIG. 7, the block processor 120 includes a first converter 121, a byte-to-bit converter 122, a convolutional encoder 123, a symbol interleaver 124, a symbol-to-byte converter 125, and a second converter 126.

The first converter 121 converts the RS frame input from the frame encoder 110 in the unit of the block. That is, the first converter 121 combines mobile data in the RS frame according to a predetermined block mode and outputs a serially concatenated convolutional code (SCCC) block.

For example, if the block mode is "00", a single M/H block becomes a single SCCC block as it is.

Figure 8:
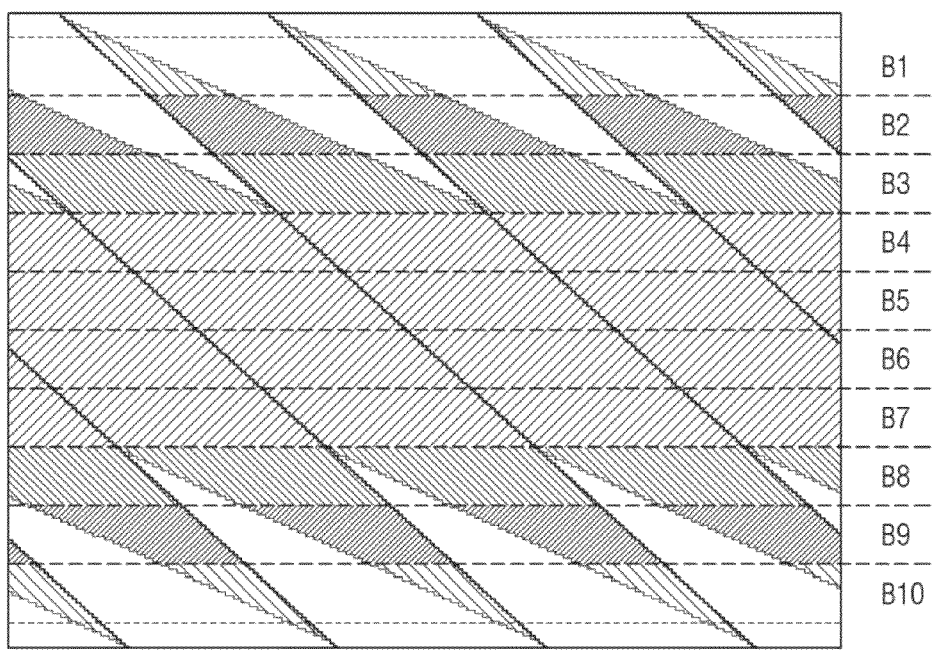
FIG. 8 is a view to explain an example of a method of dividing a stream into blocks according to an exemplary embodiment.

FIG. 8 is a view illustrating mobile data which is divided into M/H blocks in the unit of a block. Referring to FIG. 8, a single mobile data unit, for example, an M/H group, may be divided into 10 blocks (B1 to B10). If the block mode is "00", each block B1 to B10 is output as a SCCC block. On the other hand, if the block mode is "01", two M/H blocks are combined and output as a single SCCC block. The combination pattern may be set variously. For example, blocks B1 and B6 may be combined to form block SCB1, and blocks B2 and B7, blocks B3 and B8, blocks B4 and B9, and blocks B5 and B10 are combined to form blocks SCB2, SCB3, SCB4, and SCB5, respectively. The blocks may be combined in various ways and the number of combined blocks may be different according to other block modes.

The byte-to-bit converter 122 converts the SCCC block from a byte unit to a bit unit. This is because that the convolutional encoder 123 is operated in a bit unit. Accordingly, the convolutional encoder 123 convolutional-encodes the converted data.

After that, the symbol interleaver 124 performs symbol interleaving. The symbol interleaving may be performed in the same way as in a block interleaving. The symbol-interleaved data is converted into the byte unit by the symbol-to-byte converter 125, is re-converted into an M/H block unit by the second converter 126, and is output.

The group formatter 130 receives the stream processed by the block processor 120 and formats the stream in the unit of a group. Specifically, the group formatter 130 maps the data output from the block processor 120 into an appropriate location in the stream, and adds known data, signaling data, and initialization data to the stream. The group formatter 130 may add a place holder byte for normal data, an MPEG-2 header, and a non-systematic RS parity, and a dummy byte to conform to a group format.

The signaling data indicates a variety of information for processing the transport stream. The signaling data may be appropriately processed by the signaling encoder 150 and may be provided to the group formatter 130.

To transmit mobile data, a transmission parameter channel (TPC) and a fast information channel (FIC) may be used. The TPC is to provide various parameters such as forward error correction (FEC) mode information and M/H frame information, and the FIC is to obtain a fast service of the receiver and includes cross-layer information between a physical layer and an upper layer. If the TPC information and the FIC information are provided to the signaling encoder 150, the signaling encoder 150 processes the information appropriately and provides the information as signaling data.

Figure 9:
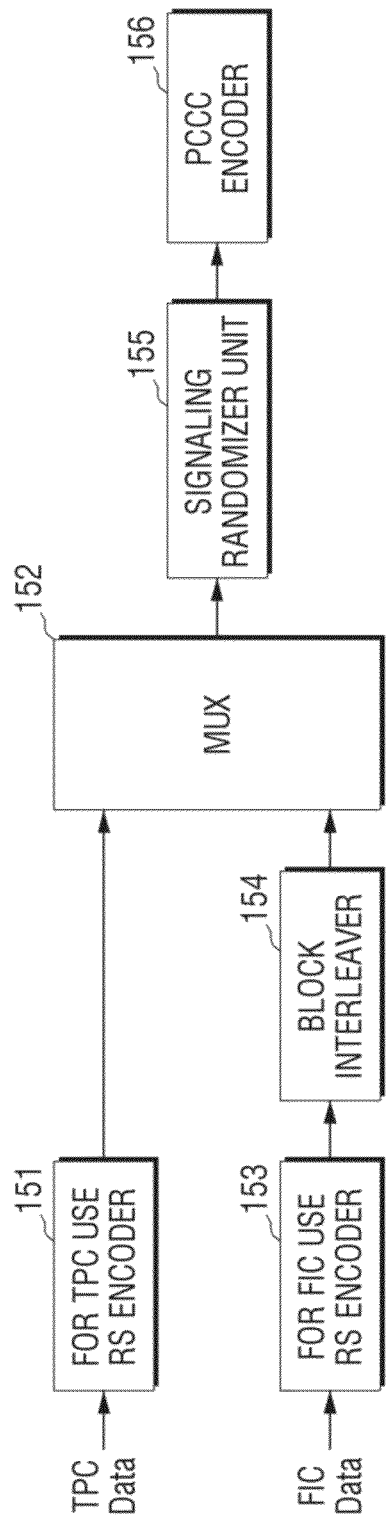
FIG. 9 is a block diagram illustrating a signaling encoder according to an exemplary embodiment.

FIG. 9 is a block diagram illustrating an example of the signaling encoder 150.

Referring to FIG. 9, the signaling encoder 150 includes an RS encoder 151 for a TPC, a multiplexer 152, an RS encoder 153 for an FIC, a block interleaver 154, a signaling randomizer 155, and a parallel concatenated convolutional code (PCCC) encoder 156. The RS encoder 151 for the TPC RS-encodes input TPC data and forms a TPC code word. The RS encoder 153 for the FIC and the block interleaver 154 RS-encodes and block-interleaves input FIC data and forms an FIC code word. The multiplexer 152 places the FIC code word after the TPC code word, thereby forming a series of sequences. The sequences are randomized by the signaling randomizer 155, are PCCC-coded by the PCCC encoder 156, and are output to the group formatter 130 as signaling data.

The known data refers to a sequence that is commonly known to the digital broadcast transmitter and the digital broadcast receiver as described above. The group formatter 130 inserts the known data into an appropriate location according to a control signal provided from a separately provided element (for example, the controller 310), so that the known data is placed in an appropriate location of the stream after being interleaved by the exciter unit 400. For example, the known data may be inserted into an appropriate location so that the known data can be placed in region B of the stream configuration of section (B) of FIG. 1. The group formatter 130 may determine a known data insertion location by itself, considering an interleaving rule.

The initialization data refers to data that is used by a trellis encoding unit 450 (e.g., trellis encoder) of the exciter unit 400 to initialize internal memories of the trellis encoding unit 450 at an appropriate time. This will be explained in detail when the exciter unit 400 is explained.

The group formatter 130 may include a group format configuration unit to configure the stream in a group format by inserting various regions and signals into the stream as described above, and a data de-interleaver to de-interleave the stream configured in the group format.

The data de-interleaver re-arranges data in the reverse order of that of an interleaver 430 which is disposed at a rear end of the stream. The stream de-interleaved by the data de-interleaver may be provided to the packet formatter 140.

The packet formatter 140 removes various place holders provided in the stream by the group formatter 130 and adds an MPEG header having a PID, which is a packet ID of mobile data. Accordingly, the packet formatter 140 outputs the stream in the unit of a predetermined number of packets for every group. For example, 118 TS packets may be output.

As described above, the data pre-processor 100 is realized in various configurations and configures the mobile data in an appropriate format. In particular, if a plurality of mobile services are provided, the number of elements included in the data pre-processor 100 may be plural.

The multiplexer 200 multiplexes a normal stream processed by the normal processor 320 and a mobile stream processed by the data pre-processor 100, thereby configuring a transport stream. The transport stream output from the multiplexer 200 may include the normal data and the mobile data and may further include known data to improve reception performance.

The exciter unit 400 performs encoding, interleaving, trellis encoding, and modulation with respect to the transport stream configured by the multiplexer 200, and outputs the transport stream. In some cases, the exciter unit 400 may be referred to as a data post-processor.

Referring to FIG. 4, the exciter unit 400 (e.g., exciter) includes a randomizer 410, an RS encoder 420, an interleaver 430, a parity replacing unit 440 (e.g., parity replacer), a trellis encoding unit 450 (e.g., trellis encoder), an RS re-encoder 460, a sync multiplexer 470, a pilot insertion unit 480 (e.g., pilot inserter), an 8-VSB modulator 490, and an RF up converter 495.

The randomizer 410 randomizes the transport stream output from the multiplexer 200. The randomizer 410 performs the same function as that of a randomizer according to the ATSC standard.

The randomizer 410 may XOR-calculate the MPEG header of the mobile data and the entire normal data with a maximum 16-bit length pseudo random binary sequence (PRBS), but may not XOR-calculate a payload byte of the mobile data. However, in this case, a PRBS generator may continue to shift a shift register. That is, the randomizer 410 bypasses a payload byte of the mobile data.

The RS encoder 420 performs RS encoding with respect to the randomized stream.

Specifically, if a portion corresponding to the normal data is input, the RS encoder 420 performs systematic RS encoding in the same way as in a related-art ATSC system. That is, the RS encoder 420 adds a 20-byte parity to an end portion of each of the packets of 187 bytes. On the other hand, if a portion corresponding to the mobile data is input, the RS encoder 420 performs non-systematic RS encoding. In this case, 20-byte RS FEC data, which is obtained by the non-systematic RS encoding, is placed in a predetermined parity byte location in each mobile data packet. Accordingly, the transmitter can have compatibility with a related-art ATSC standard receiver.

The interleaver 430 interleaves the stream encoded by the RS encoder 420. The interleaving may be performed in the same way as that of a related-art ATSC system. That is, the interleaver 430 writes and reads data, while selecting a plurality of paths, which include a different number of shift registers, in sequence using a switch, so that interleaving is performed as much as the number of shift registers on the path.

The parity replacing unit 440 corrects the parity which is changed due to the memory initialization performed by the trellis encoding unit 450 at the rear end.

That is, the trellis encoding unit 450 receives the interleaved stream and performs trellis encoding with respect to the stream. The trellis encoding unit 450 may use 12 trellis encoders. Accordingly, in this case, a de-multiplexer to divide the stream into 12 independent streams and input the streams into each trellis encoder, and a multiplexer to combine the streams trellis-encoded by the trellis encoders to form a single stream are used.

Each of the trellis encoders performs trellis encoding in a manner so as to logic-calculate a newly input value and a value pre-stored in an internal memory using a plurality of internal memories and to output a value.

As described above, the transport stream may include known data. The known data is a known sequence that is commonly known to the digital broadcast transmitter and the digital broadcast receiver. The digital broadcast receiver may determine a degree of error correction by identifying a state of the received known data. That is, the known data should be transmitted the way the receiver knows. However, since the value stored in the internal memory provided in the trellis encoder is not known, the internal memory is to be initialized to have a certain value before the known data is input. Accordingly, the trellis encoding unit 450 initializes the memory prior to trellis-encoding the known data. The memory initialization may be referred to as trellis reset.

Figure 10:
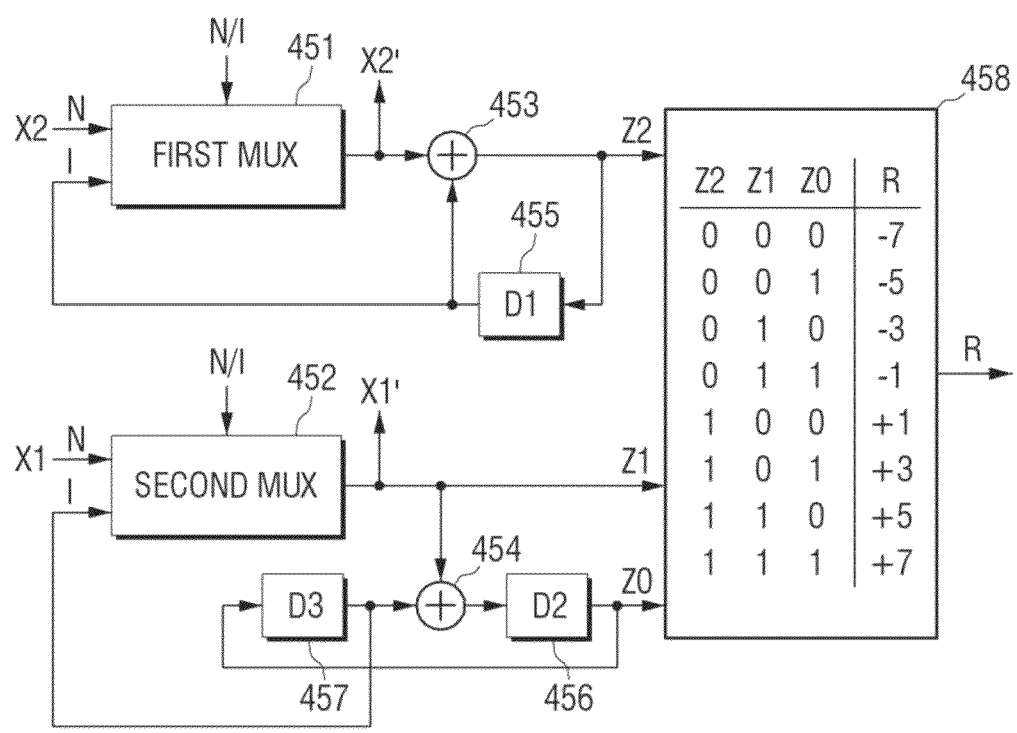
FIGS. 10 to 13 are views illustrating a trellis encoder according to various exemplary embodiments.

FIG. 10 is a view illustrating an example of one of the plurality trellis encoders provided in the trellis encoding unit 450.

Referring to 10, the trellis encoder includes first and second multiplexers 451 and 452, first and second adders 453 and 454, first to third memories 455, 456, and 457, and a mapper 458.

The first multiplexer 451 receives data N in the stream and a value I stored in the first memory 455, and outputs one value, that is, N or I, according to a control signal N/I. Specifically, a control signal which controls to select I when a value corresponding to an initialization data section is input is applied so that the first multiplexer 451 outputs I. In the other sections, N is output. Likewise, the second multiplexer 452 outputs I only when the value corresponding to the initialization data section is input.

Accordingly, the first multiplexer 451 outputs the interleaved value to a rear end as it is when a section other than the initialization data section is input, and the output value is input to the first adder 453 along with a value pre-stored in the first memory 455. The first adder 453 performs a logic operation, that is, an exclusive OR with respect to the input values, and outputs Z2. In this state, if the initialization data section is input, the value stored in the first memory 455 is selected by the first multiplexer 451 as it is and is output. Accordingly, since the two same values are input to the first adder 453, a logic operation value is always a constant value. That is, if the exclusive OR is performed, 0 is output. Since the output value of the first adder 453 is input to the first memory 455 as it is, the first memory 455 is initialized to have a value of 0.

If the initialization data section is input, the second multiplexer 452 selects a value stored in the third memory 457 as it is and outputs the value. The output value is input to the second adder 454 along with the value stored in the third memory 457. The second adder 454 performs a logic operation with respect to the two same values and outputs a resulting value to the second memory 456. As described above, since the input values of the second adder 454 are the same, a logic operation value for the same values, for example, 0 in the case of the exclusive OR is input to the second memory 456. Accordingly, the second memory 456 is initialized. The value stored in the second memory 456 is shifted and is stored in the third memory 457. Accordingly, when next initialization data is input, a current value of the second memory 456, that is, 0 is input to the third memory 457 as it as and thus the third memory 457 is also initialized.

The mapper 458 receives the output value of the first adder 453, the output value of the second multiplexer 452, and the output value of the second memory 456, and maps the values to a corresponding symbol value R and outputs the symbol value. For instance, if Z0, Z1, and Z2 are output as 0, 1, and 0, respectively, the mapper 458 outputs a −3 symbol.

Since the RS encoder 420 is located before the trellis encoder 450, the value input to the trellis encoder 450 contains a parity already added thereto. Therefore, as the trellis encoder 450 performs initialization and thus some value of the data are changed, the parity should also be changed.

The RS re-encoder 460 changes the value of the initialization data section using X1' and X2' which are output from the trellis encoding unit 450, thereby generating a new parity. The RS re-encoder 460 may be referred to as a non-systematic RS encoder.

Although the memory is initialized to have a value of 0 in FIG. 10, the memory may be initialized to have a value other than 0 in other exemplary embodiments.

Figure 11:
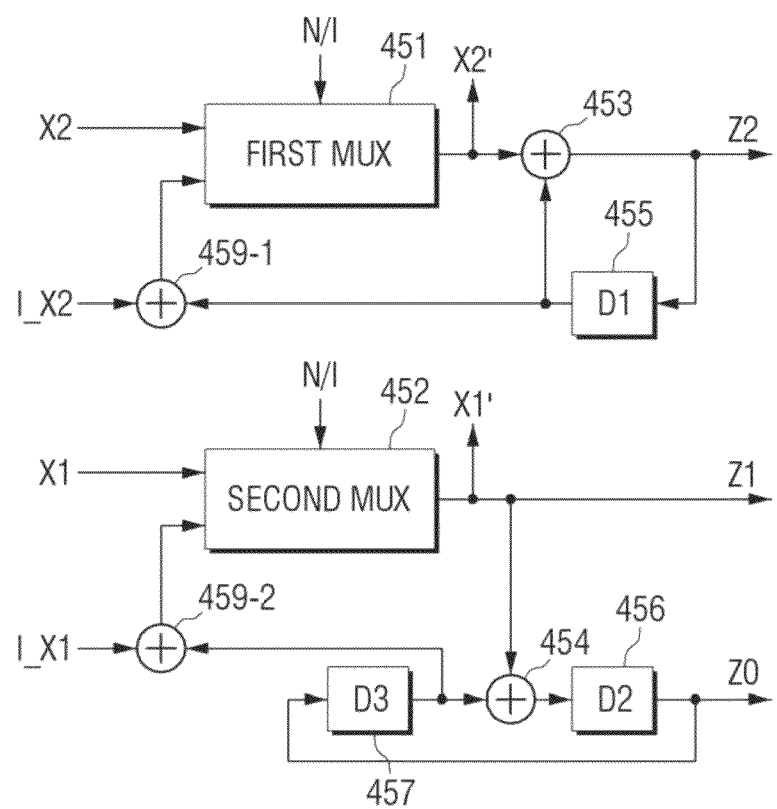

FIG. 11 is a view illustrating another example of the trellis encoder.

Referring to FIG. 11, the trellis encoder may include first and second multiplexers 451 and 452, first to fourth adders 453, 454, 459-1, and 459-2, and first to third memories 455, 456, and 457. The mapper 458 is omitted from FIG. 11.

Specifically, the first multiplexer 451 may output one of a stream input value X2 and a value of the third adder 459-1. A value I_X2 and a storage value of the first memory 455 are input to the third adder 459-1. The value I_X2 refers to a memory reset value input from an external source. For example, if the first memory 455 is to be initialized to have a value of 1, the value I_X2 is input as 1. If the storage value of the first memory 455 is 0, the output value of the third adder 459-1 is 1 and the first multiplexer 451 outputs 1. Accordingly, the first adder 453 performs an exclusive OR with respect to the output value of the first multiplexer 451, 1, and the storage value of the first memory 455, 0, and stores a resulting value, 1, in the first memory 455. As a result, the first memory 455 is initialized to have the value of 1.

If the initialization data section is input, the second multiplexer 452 selects an output value of the fourth adder 459-2 and outputs the value. The fourth adder 459-2 outputs a memory reset value I_X1 externally input and an exclusive OR value of the third memory 457. For example, if 1 and 0 are stored in the second and the third memories 456 and 457, respectively, and the two memories are to be initialized to have values of 1 and 1, respectively, the second multiplexer 452 outputs an exclusive OR value 1 of the value of 0 stored in the third memory 457 and the I_XI value of 1. The second adder 454 performs an exclusive OR with respect to the output value of 1 and the value of 0 stored in the third memory 457, and inputs a resulting value of 1 to the second memory 456. The value of 1 originally stored in the second memory 456 is shifted to the third memory 457 so that the value of the third memory 457 is 1. In this state, if the second I_X1 is input as 1, an exclusive OR operation is performed with respect to the I_XI and the value of 1 of the third memory 457, and a resulting value of 0 is output from the second multiplexer 452. If the second adder 454 performs an exclusive OR with respect to the value of 0 output from the second multiplexer 452 and the value of 1 stored in the third memory 457, a resulting value of 1 is input to the second memory 456 and the value of 1 stored in the second memory 456 is shifted to the third memory 457 and stored in the third memory 457. As a result, the second and the third memories 456 and 457 are initialized to have the value of 1.

Figure 12:
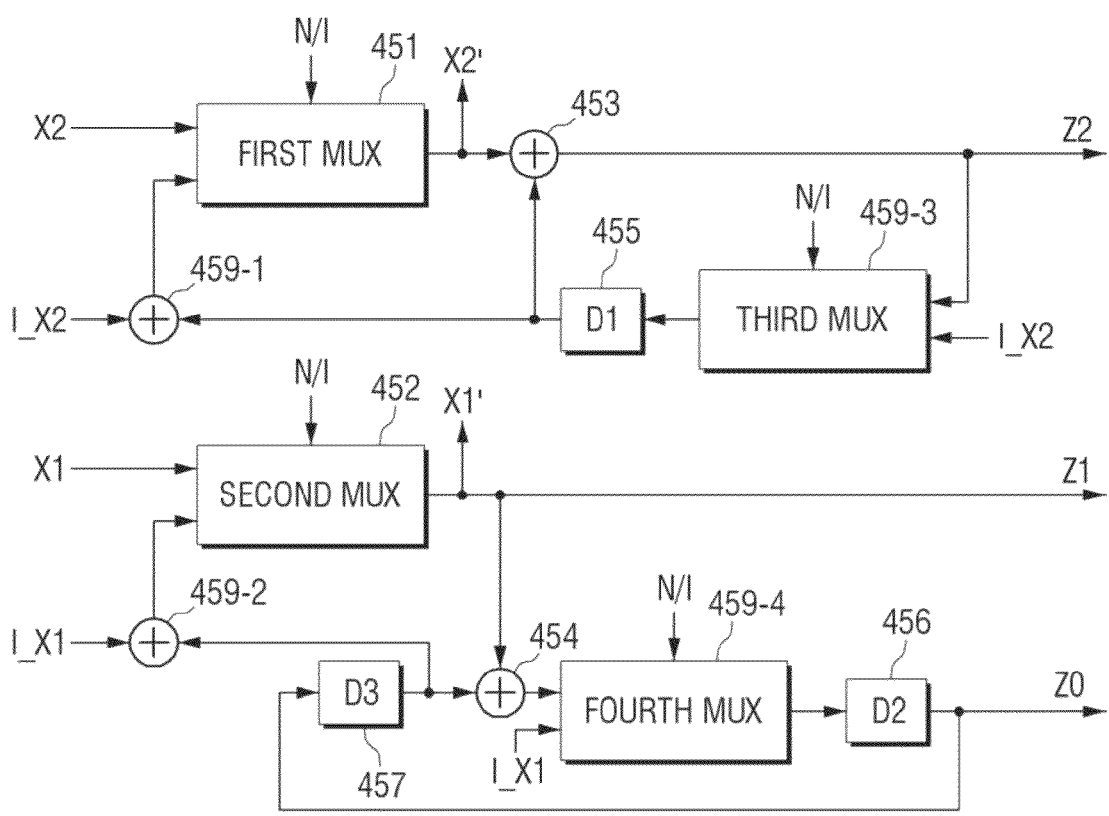
Figure 13:
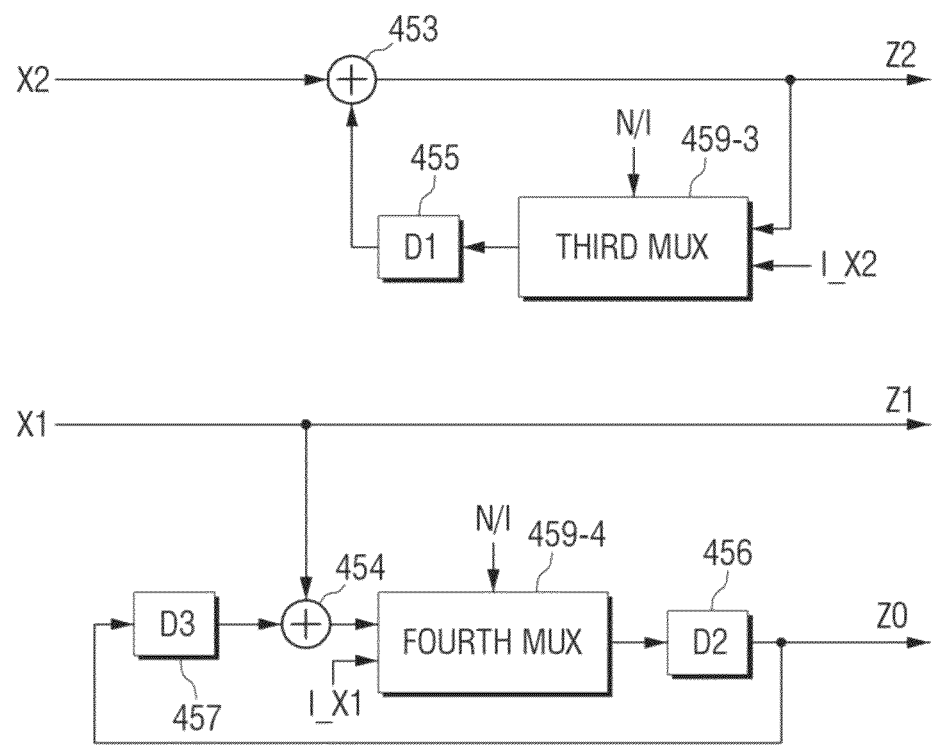

FIGS. 12 and 13 are views illustrating the trellis encoder according to various exemplary embodiments.

Referring to FIG. 12, the trellis encoder further includes third and fourth multiplexers 459-3 and 459-4 in addition to the elements of FIG. 11. The third and the fourth multiplexers 459-3 and 459-4 may output values of the first and the second adders 453 and 454 or values I_X2 and I_X1 according to a control signal N/I. Accordingly, the first to the third memories 455, 456, and 457 can be initialized to have desired values.

FIG. 13 illustrates the trellis encoder in a simplified configuration. Referring to FIG. 13, the trellis encoder may include first and second adders 453 and 454, first to third memories 455, 456, 457, and third and fourth multiplexers 459-3 and 459-4. Accordingly, the first to the third memories 455,456,457 may be initialized according to values I_X1 and I_X2 input to the third and the fourth multiplexers 459-3 and 459-4, respectively. That is, referring to FIG. 13, the values I_X2 and I_X1 are input to the first memory 455 and the second memory 456 as they are and become values of the first memory 455 and the second memory 456.

Referring back to FIG. 4, a field sync and a segment sync are added, by the sync multiplexer 470, to the stream trellis-encoded by the trellis encoding unit 450.

As described above, if the data pre-processor 100 places the mobile data in the packets allocated to the existing normal data and uses the mobile data, the digital broadcast transmitter may inform the receiver of the presence of new mobile data. The presence of new mobile data may be notified in various ways. One of the various ways uses a field sync. This will be described in detail below.

The pilot insertion unit 480 inserts a pilot to the transport stream processed by the sync multiplexer 470, and the 8-VSB modulator 490 performs modulation in an 8-VSB modulating method. The RF up-converter 495 converts the modulated stream into an upper RF band signal for transmission, and transmits the converted signal through an antenna.

As described above, the transport stream may be transmitted to the receiver with the normal data, the mobile data, and the known data being included therein.

Figure 14:
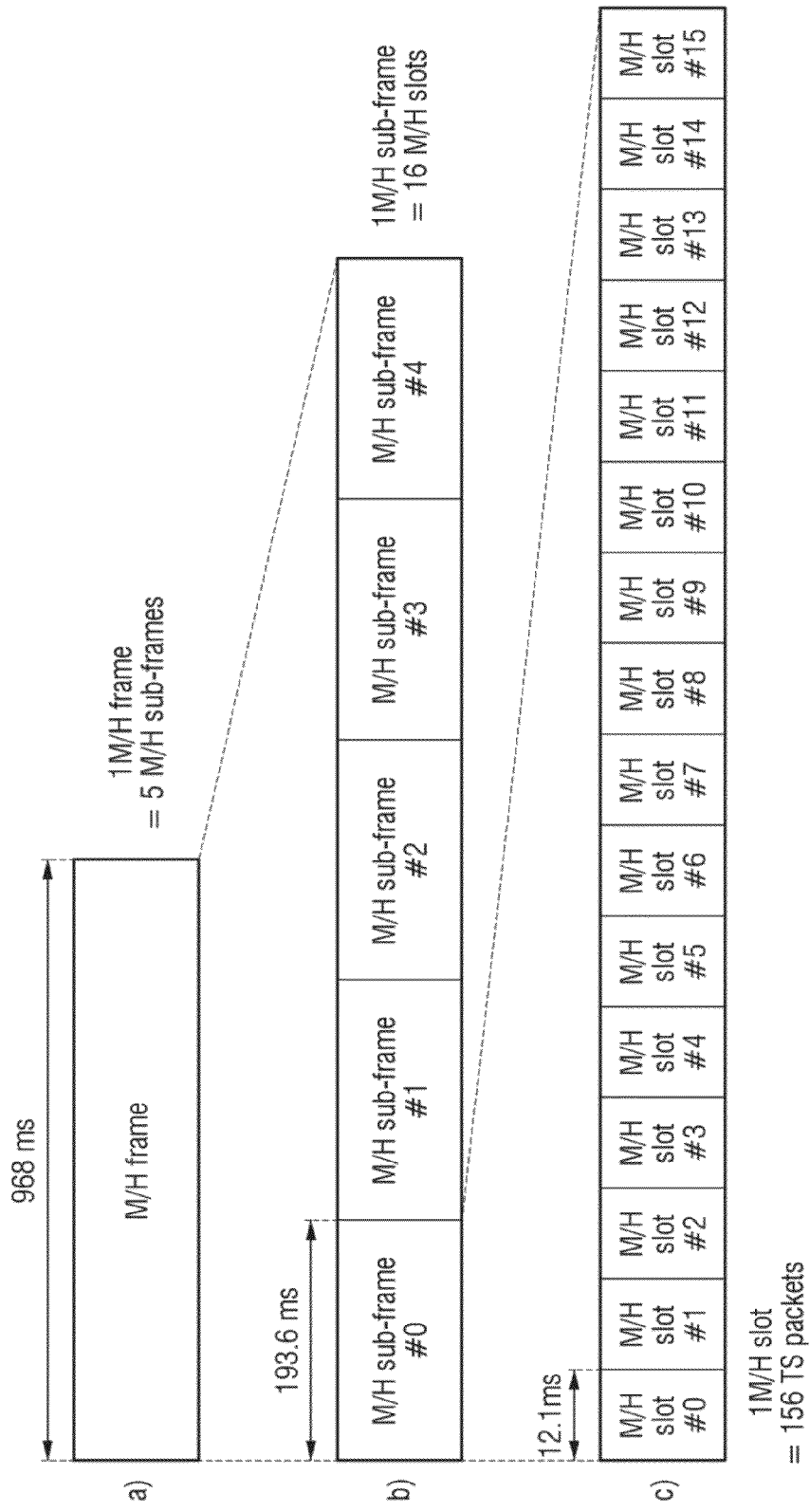
FIG. 14 is a view to explain a mobile data frame according to an exemplary embodiment.

FIG. 14 is a view to explain a mobile data frame of the transport stream, that is, a unit configuration of an M/H frame. Referring to section (a) of FIG. 14, one M/H frame is 968 ms long in a time unit, and is divided into 5 sub-frames as shown in section (b) of FIG. 14. One sub-frame may have a time unit of 193.6 ms. Also, as shown in section (c) of FIG. 14, each sub-frame may be divided into 16 slots. Each slot may have a time unit of 12.1 ms and may include 156 transport stream packets in total. As described above, 38 of the entire transport stream packets are allocated to the normal data and 118 packets are allocated to the mobile data. That is, one M/H group may include 118 packets.

In this state, the data pre-processor 100 may place the mobile data and the known data in the packets allocated to the normal data, thereby improving transmission efficiency of the mobile data and improving reception performance.

[Various Exemplary Embodiments of Changed Transport Stream]

FIGS. 15 to 21 are views illustrating a transport stream configuration according to various exemplary embodiments.

Figure 15:
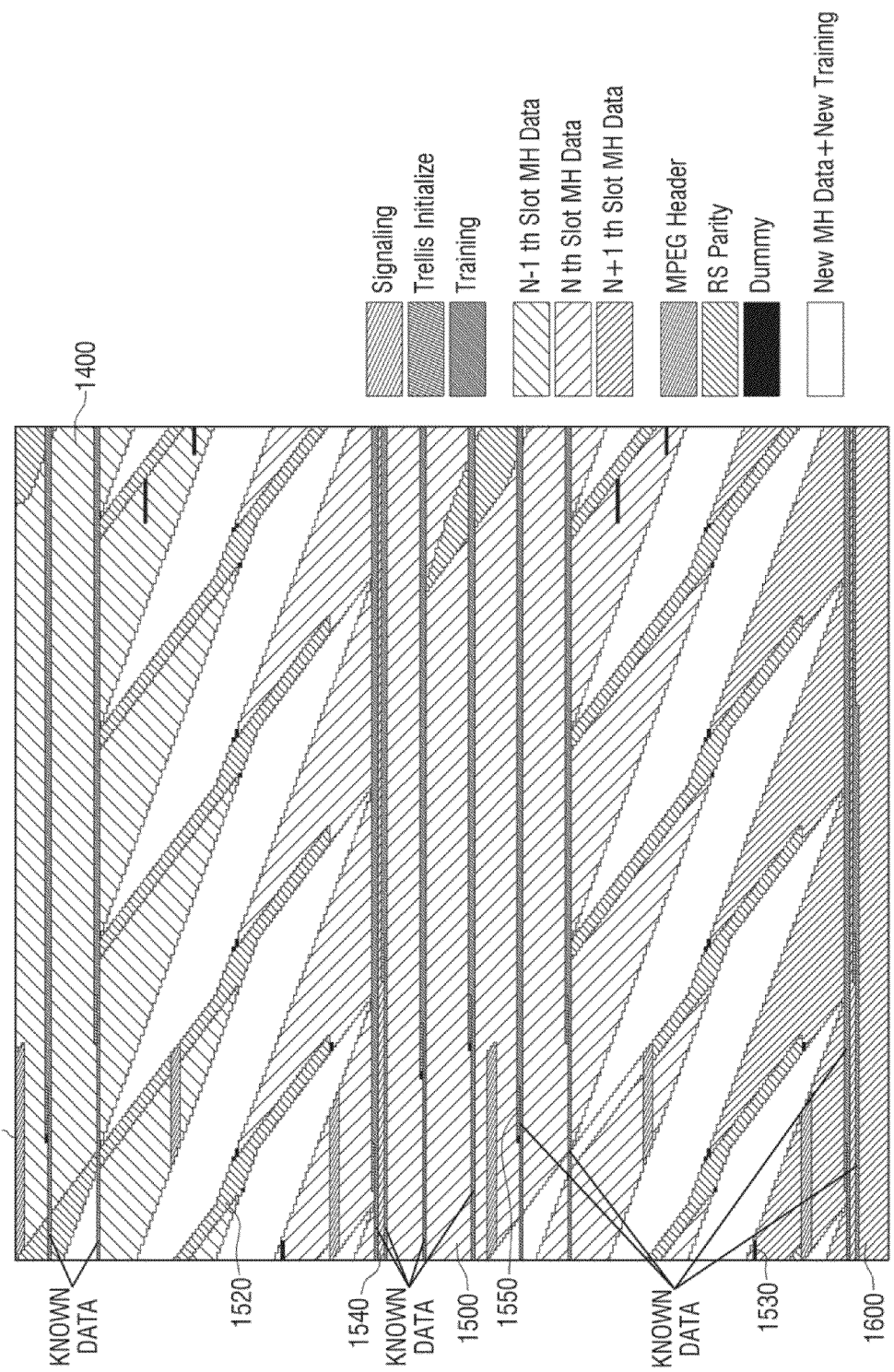
FIGS. 15 to 21 are views illustrating an example of a stream configuration according to various exemplary embodiments.

FIG. 15 illustrates a simplest modified configuration, that is, a stream configuration which is interleaved with the mobile data being placed in the packets allocated to the normal data, that is, a second region. In the stream of FIG. 15, the known data may be placed in the second region along with the mobile data.

Therefore, a portion that is not used for mobile data in a related-art ATSC-MH, that is, 38 packets, may be used for mobile data. Since the second region is used independently from an existing mobile data region (that is, the first region), one or more services can be additionally provided. If new mobile data is used for the same service as that of the existing mobile data, data transmission efficiency can be further improved.

On the other hand, if the new mobile data and the known data are to be transmitted as shown in FIG. 15, the presence of the new mobile data and the known data and locations of the new mobile data and the known data may be notified to the receiver using signaling data or a field sync.

The mobile data and the known data may be placed by the data pre-processor 100. Specifically, the group formatter 130 of the data pre-processor 100 may place the mobile data and the known data in the 38 packets.

It can be seen from FIG. 15 that known data of a 6-long training sequence format is placed in a body region where existing mobile data are gathered. It can be also seen that the signaling data is placed between the first and the second long training sequences to achieve error robustness of the signaling data. On the other hand, the known data may be placed in the packets allocated to the normal data in a distributed format as well as the long training sequence format.

In FIG. 15, a hatched region indicated by reference numeral 1510 indicates an MPEG header portion, a hatched area indicated by reference numeral 1520 indicates an RS parity region, a hatched area indicated by reference numeral 1530 indicates a dummy region, a hatched area indicated by reference numeral 1540 indicates signaling data, and a hatched area indicated by reference numeral 1550 indicates initialization data. Referring to FIG. 15, the initialization data is placed before the known data appears. Reference numeral 1400 indicates N−1th slot M/H data, reference numeral 1500 indicates Nth slot M/H data, and reference numeral 1600 indicates N+1th slot M/H data.

Figure 16:
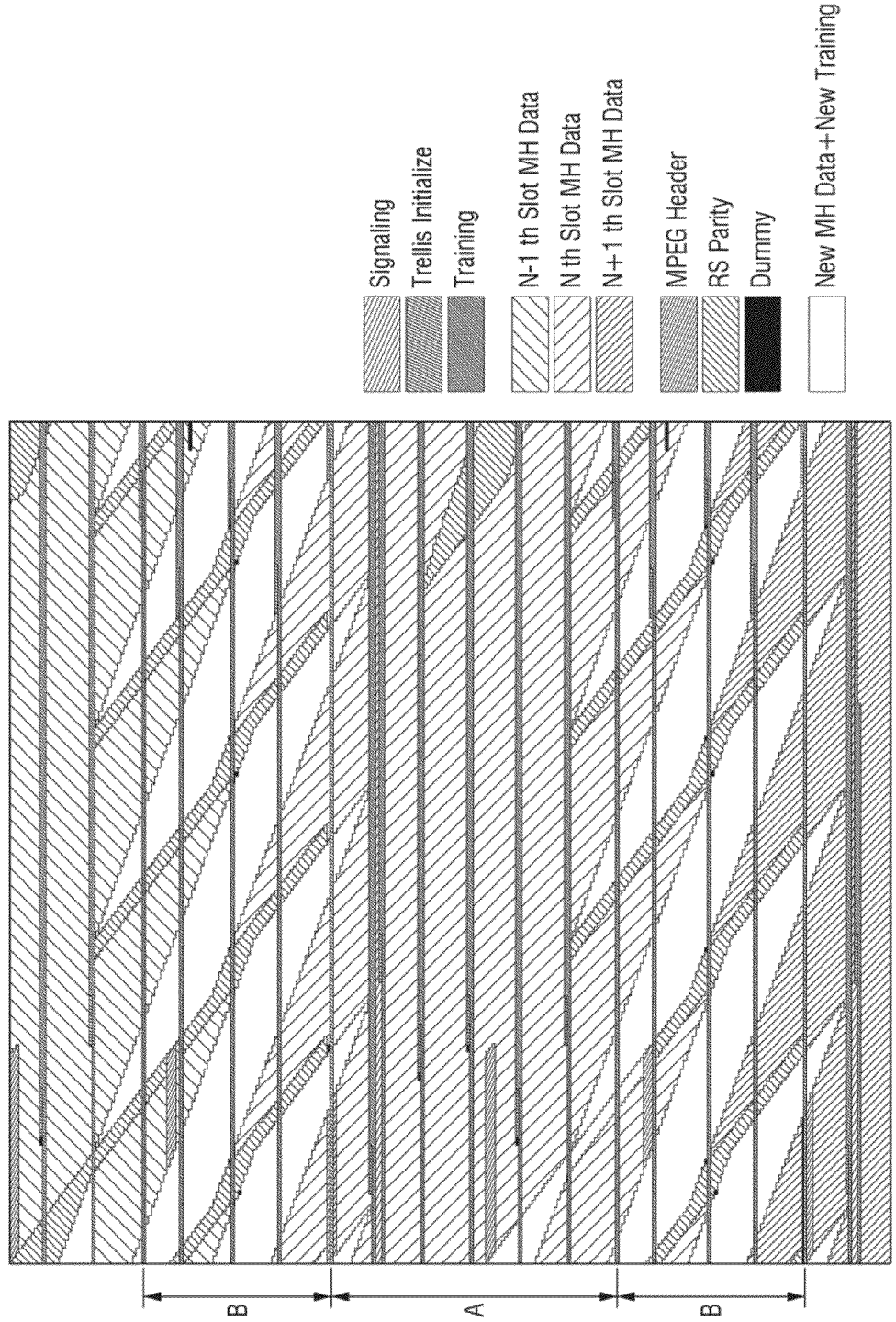

FIG. 16 illustrates a transport stream configuration to transmit mobile data and known data using packets allocated to normal data, that is, a second region, and a part of a first region allocated to existing mobile data.

Referring to FIG. 16, in region A, that is, a body region where the existing mobile data are gathered, the known data of the 6-long training sequence format is placed. Also, in region B, the known data is placed in the long training sequence format. The known data is included in some of the 118 packets allocated to the existing mobile data as well as the 38 packets, in order to be placed in region B in the long training sequence format. The new mobile data is placed in the remaining region of the 38 packets that do not include the known data. Accordingly, error correction performance of region B can be improved.

As the known data is newly added to a part of the region for the existing mobile data, it is possible to add information on a location of the new known data to existing signaling data for the sake of compatibility with an existing mobile data receiver, or to process a header of an existing mobile packet to which the new known data is inserted to have a format that is not recognizable by the existing mobile data receiver, for example, a null packet format. Accordingly, since the existing mobile data receiver does not recognize the newly added known data, a malfunction does not occur.

Figure 17:
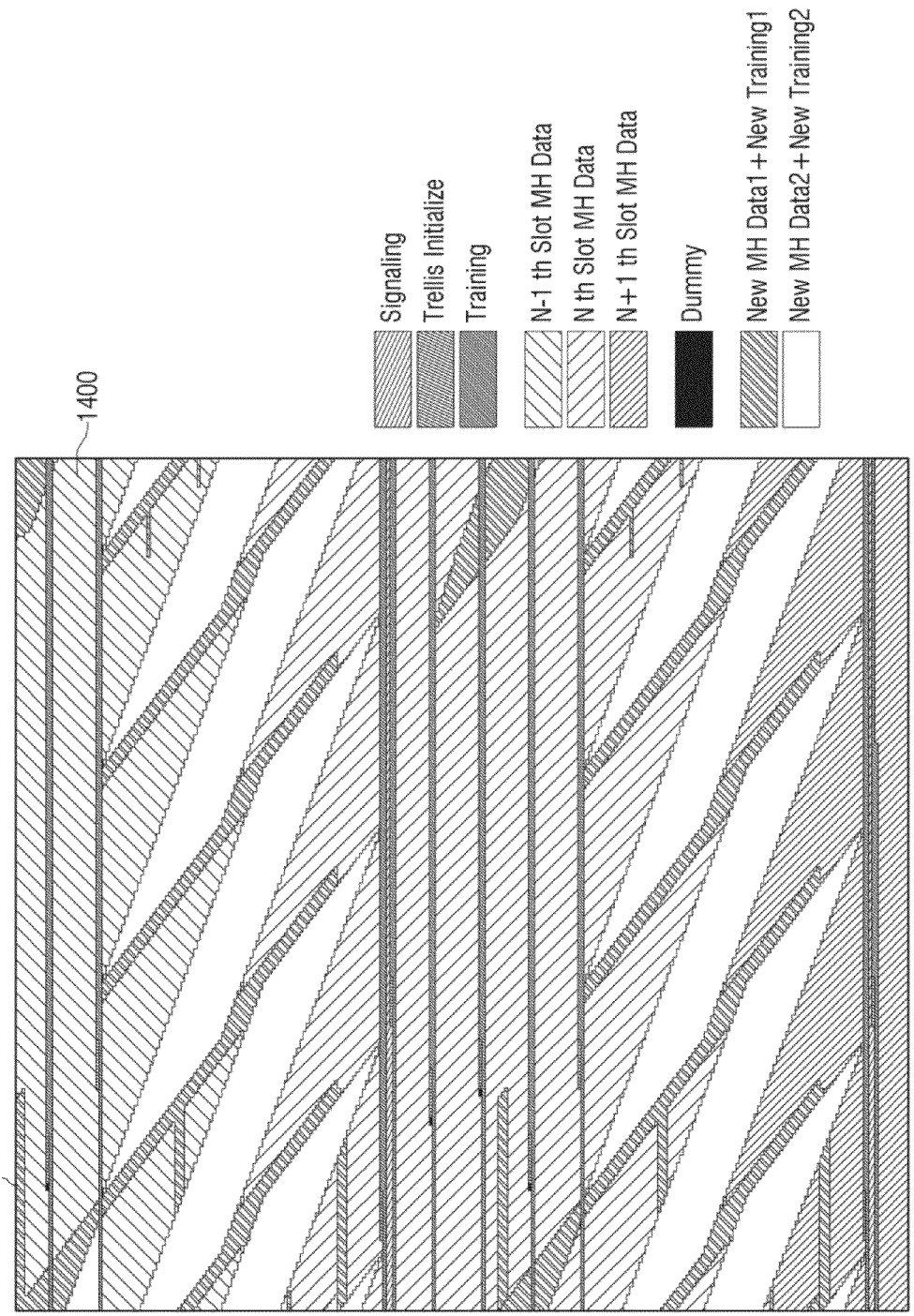

FIG. 17 illustrates a stream configuration in which at least one of mobile data and known data is placed in an MPEG header, an RS parity, at least a part of a dummy, and existing MH data. In this case, a plurality of new mobile data may be placed according to a location.

That is, in comparison with FIG. 15, FIG. 17 indicates that new mobile data and new known data are formed in the MPEG header, the RS parity, and a part of the dummy. The mobile data inserted into these portions and the mobile data inserted into the normal data packets may be different data or the same data.

The new mobile data may be placed in the existing mobile data region in addition to these portions.

If the stream is configured as shown in FIG. 17, transmission efficiency of the mobile data and the known data can be further improved in comparison with FIGS. 15 and 16. In particular, a plurality of mobile data services can be provided.

If the stream is configured as shown in FIG. 17, new signaling data is included in the new mobile data region using existing signaling data and a field sync, so as to notify whether the new mobile data is included or not.

Figure 18:
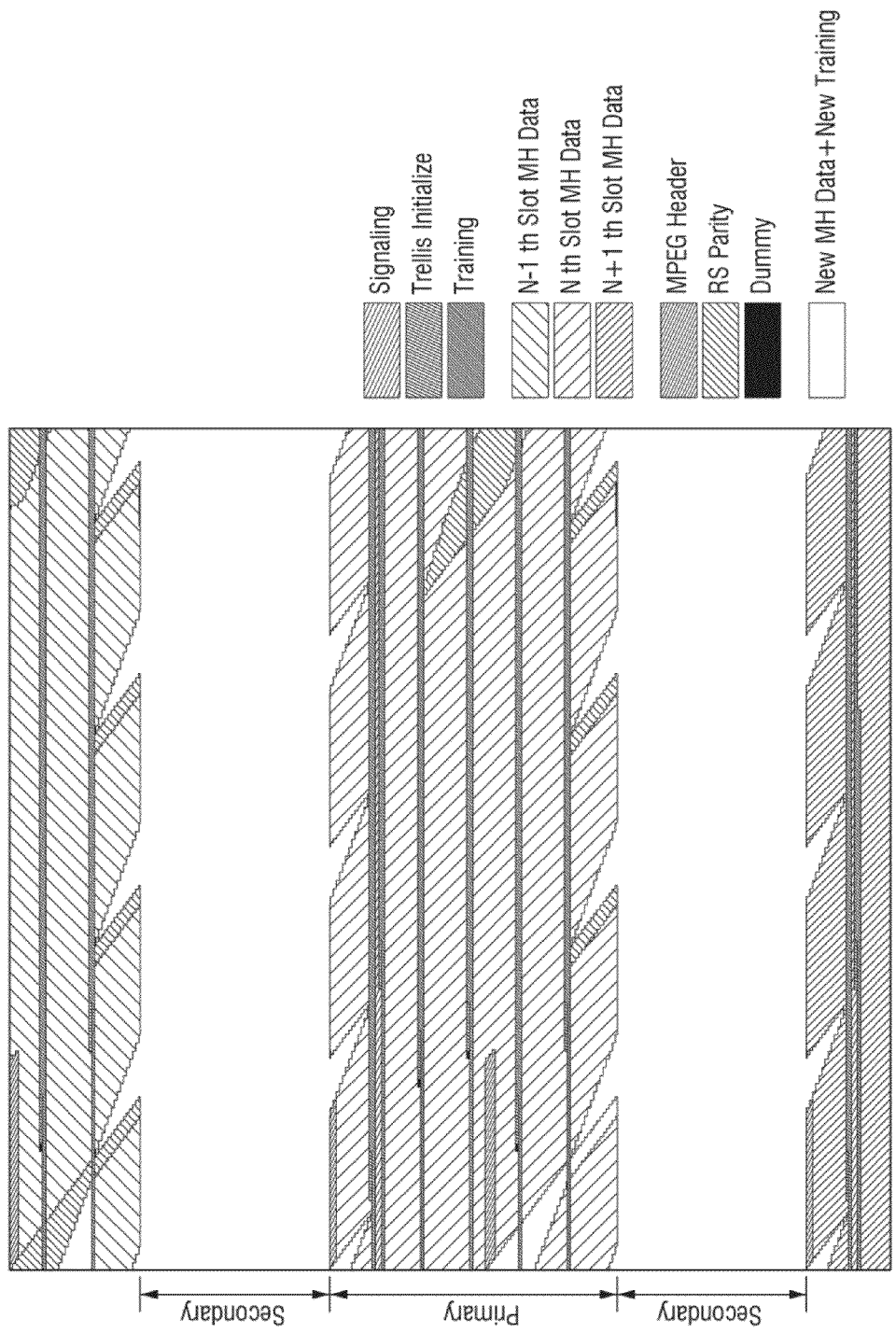

FIG. 18 illustrates a stream configuration in which new mobile data and known data are placed in region B, that is, a first region corresponding to a secondary service region, as well as a second region.

As shown in FIG. 18, the entire stream is divided into a primary service region and a secondary service region. The primary service region may be referred to as a body region and the secondary service region may be referred to as a head/tail region. As described above, since the head/tail region does not include known data and data of different slots co-exists, the performance of the head/tail region deteriorates in comparison with that of the body region. Thus, the known data may be placed and used in this portion along with the new mobile data. The known data may be placed in a long training sequence format as in the body region. However, this should not be considered as limiting. The known data may be placed in a distributed format or may be placed in both the long training sequence format and the distributed format.

As the existing mobile data portion is used as a new mobile data region, a header of a packet of a portion of the existing mobile data region including the new mobile data or the known data is configured in a format that is not recognizable by the existing receiver, so that compatibility with the receiver according to the related art ATSC-MH standard can be maintained.

Also, the above fact may be notified through related art signaling data or new signaling data.

Figure 19:
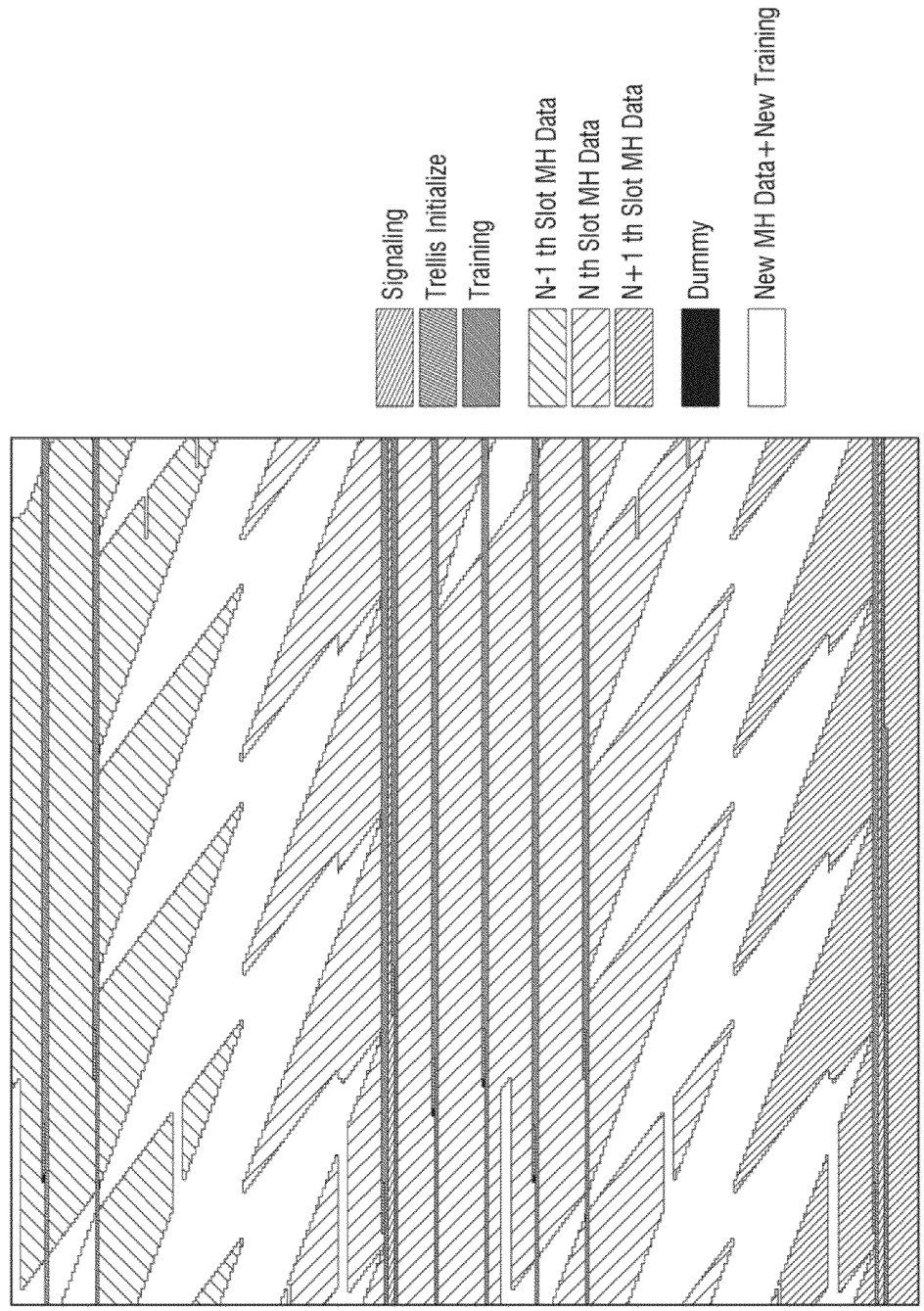

FIG. 19 illustrates an example of a transport stream to transmit new mobile data and known data using all of the existing normal data region, the MPEG header, the RS parity region, at least a part of the dummy of the existing mobile data, and the existing mobile data region. FIG. 17 illustrate a case in which new mobile data different from new mobile data placed in the normal data region is transmitted in these regions, but FIG. 19 illustrates a case in which new mobile data is transmitted using the normal data region and these regions altogether.

Figure 20:
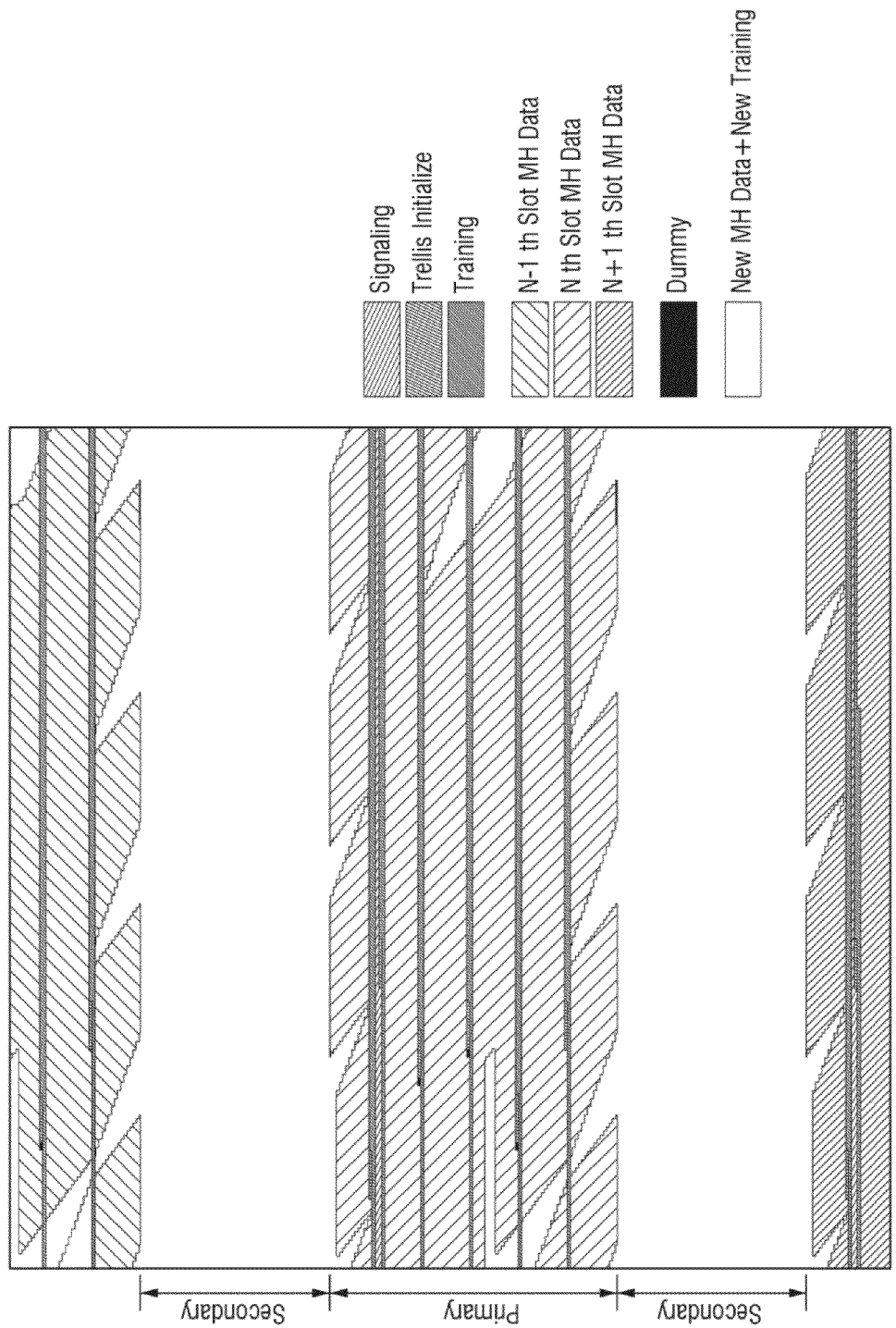

FIG. 20 illustrates a transport stream to transmit new mobile data and known data using all of the entire B region, the normal data region, the MPEG header, the RS parity region, and at least a part of the dummy of the existing mobile data.

In this case, a portion including the new mobile data and the known data may be processed so that the portion cannot be recognized for the sake of compatibility with the existing receiver.

Figure 21:
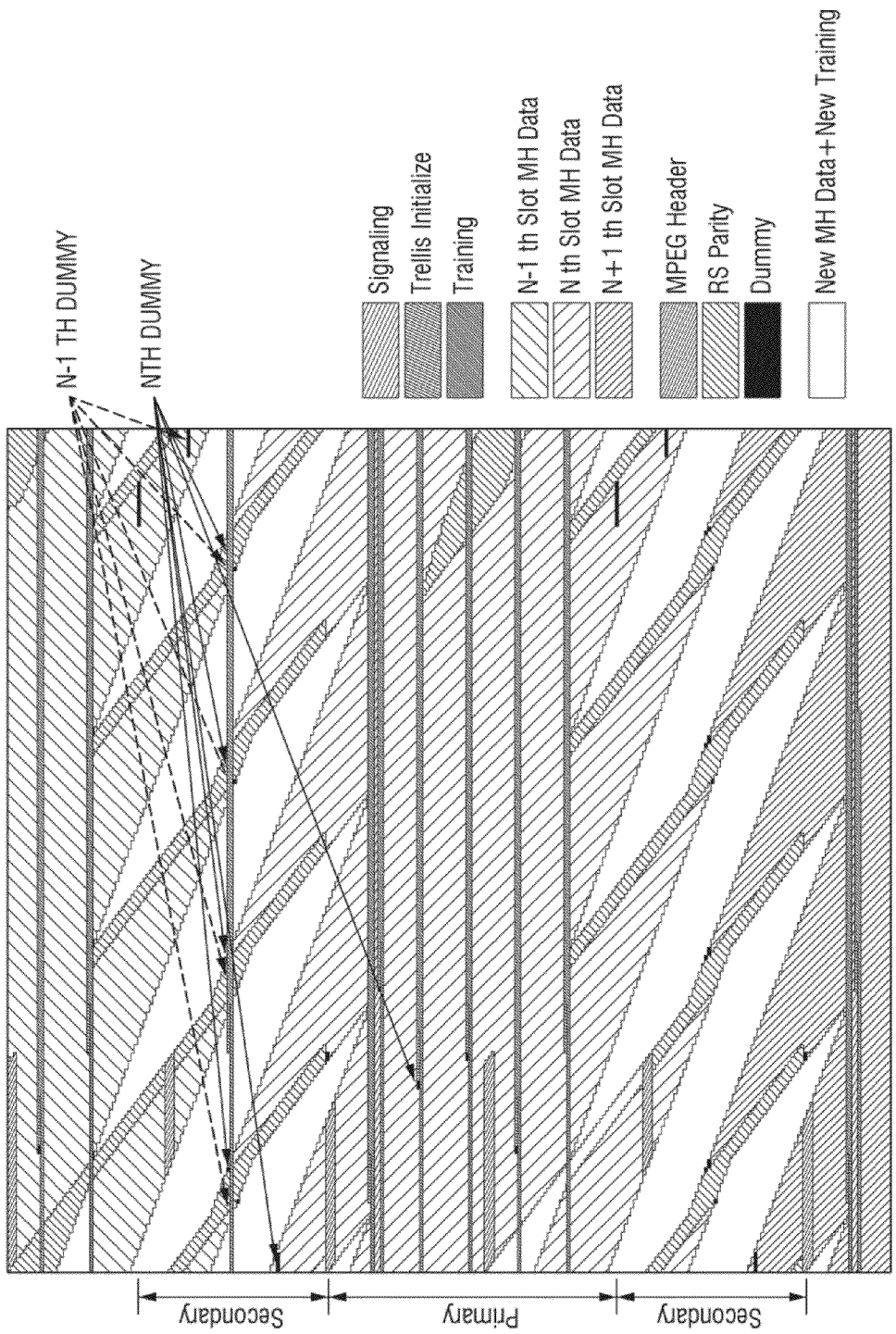

FIG. 21 illustrates a transport stream configuration in which a dummy of a region used by existing mobile data is replaced with a parity or a new mobile data region, and mobile data and known data are placed using the replaced dummy and the normal data region. In FIG. 21, a dummy of the N−1th slot and a dummy of the Nth slot are illustrated.

As described above, FIGS. 15 to 21 illustrate the stream configuration after interleaving. The data pre-processor 100 places the mobile data and the known data in appropriate locations to have the stream configuration shown in FIGS. 15 to 21 after interleaving.

Specifically, the data pre-processor 100 places a mobile data packet in the normal data region, that is, in the 38 packets on the stream configuration shown in section (A) of FIG. 1 according to a predetermined pattern. In this case, the mobile data may be placed in an entire payload of the packet or may be in some region in the packet. Also, the mobile data may be placed in a region located in a head or a tail of the existing mobile region after interleaving, as well as the normal data region.

The known data may be placed in each mobile data packet or normal data packet. In this case, the known data may be placed continuously in a vertical direction or at a predetermined interval as shown in section (A) of FIG. 1, so that the known data has a format of a long training sequence or a similar long training sequence in a horizontal direction after interleaving.

The known data may be placed in a distributed format besides the long training sequence format as described above. Hereinafter, various examples of a placing pattern of the known data will be explained.

[Placement of Known Data]

As described above, the known data is placed in an appropriate location by the group formatter 130 of the data pre-processor 100 and then is interleaved by the interleaver 430 of the exciter unit 400 along with the stream. FIGS. 22 to 28 are views to explain a method for placing known data according to various exemplary embodiments.

Figure 22:
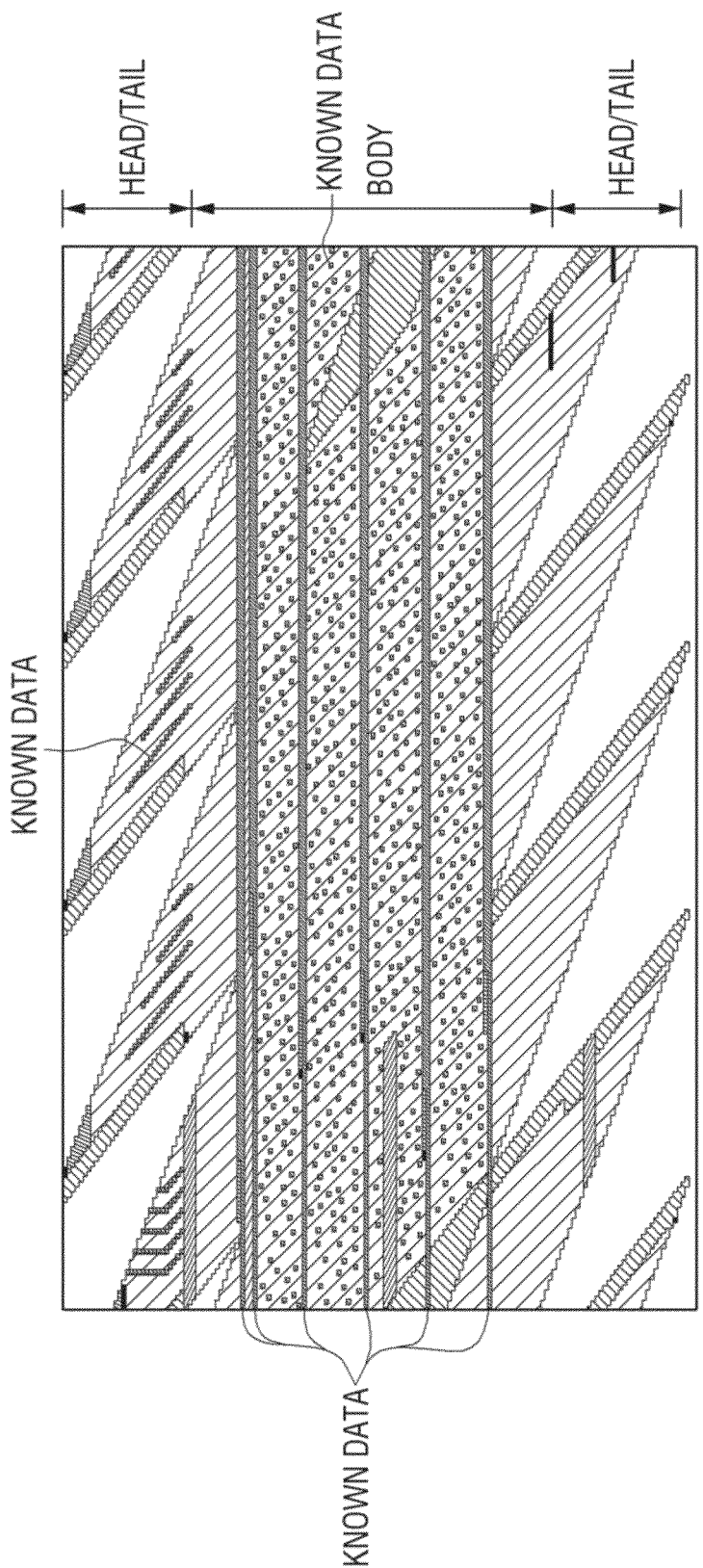
FIGS. 22 to 28 are views illustrating an insertion pattern of known data according to various exemplary embodiments.

FIG. 22 illustrates a body portion in which distributed known data is placed along with an existing long training sequence, and a head/tail region in which known data is additionally placed in a conical portion. As described above, known data is newly added while existing known data is maintained as it is so that synchronization and channel estimation performance and equalization performance of the receiver can be improved.

The placement of the known data shown in FIG. 22 is performed by the group formatter 130 as described above. The group formatter 130 may determine an insertion location of the known data considering an interleaving rule of the interleaver 430. The interleaving rule may be different according to various exemplary embodiments. However, if the interleaving rule is known, the group formatter 130 may determine a location of the known data appropriately. For example, if known data of a predetermined size is inserted into a part of a payload or a separately provided field in every 4 packets, known data distributed in a regular pattern can be obtained through interleaving.

Figure 23:
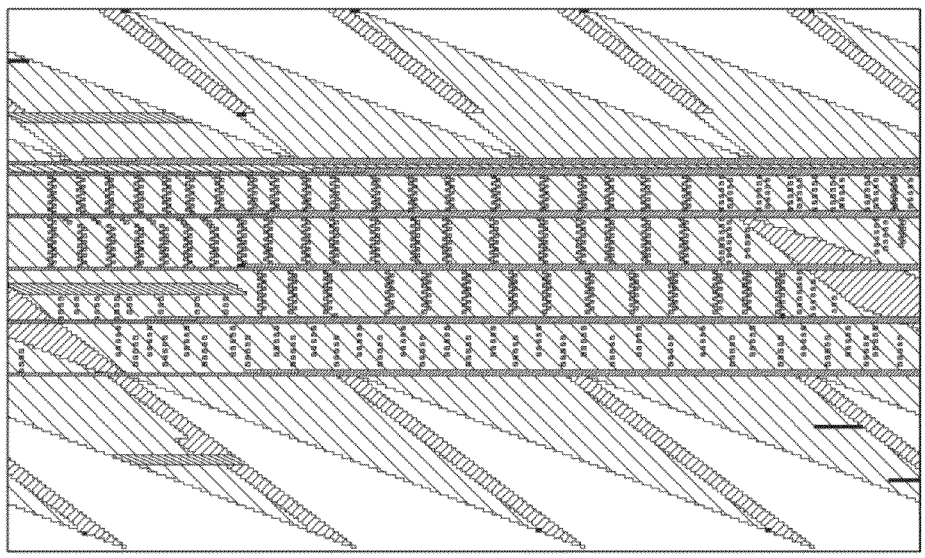

FIG. 23 illustrates a stream configuration showing an example of another method of inserting known data.

Referring to FIG. 23, distributed known data is not placed in a conical region and is placed only in a body region along with a long training sequence.

Figure 24:
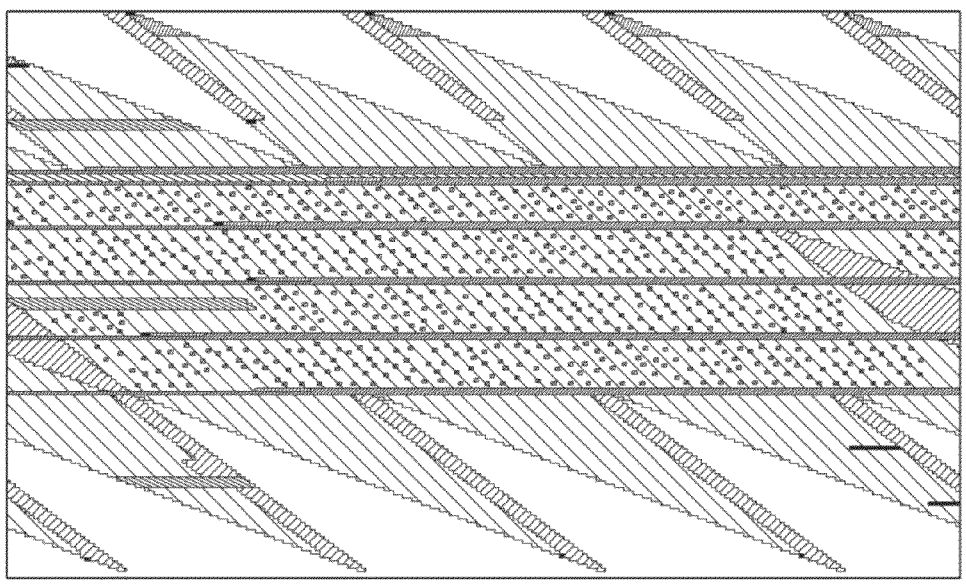

FIG. 24 illustrates a stream configuration in which a length of a long training sequence is reduced in comparison with that of FIG. 23 and distributed known data is placed as much as the reduced number of sequences. Accordingly, Doppler tracking performance can be improved, while data efficiency is maintained the same.

Figure 25:
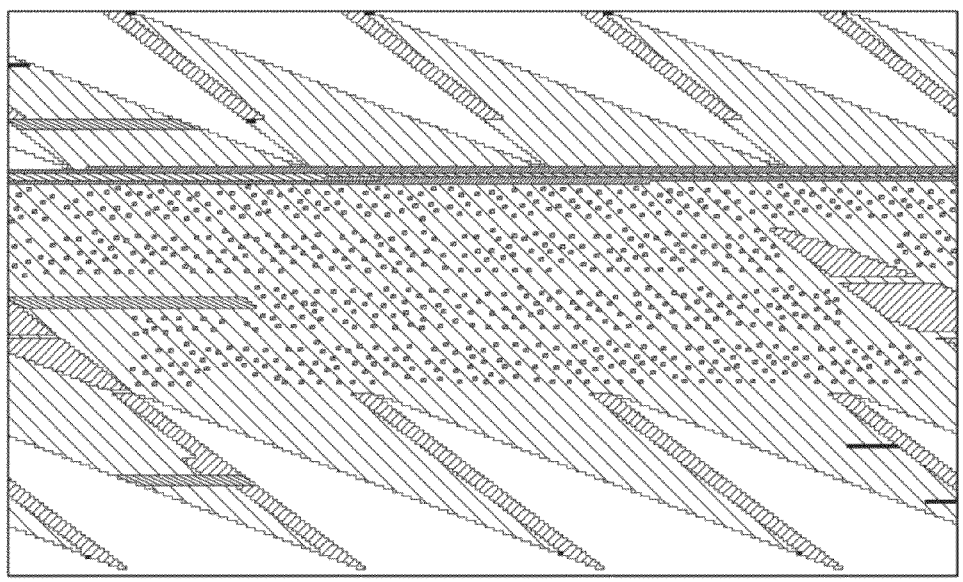

FIG. 25 illustrates a stream configuration showing an example of still another method of inserting known data.

Referring to FIG. 25, only a first sequence from among 6 long training sequences in a body region is maintained as it is, and the remaining sequences are replaced with distributed known data. Accordingly, initial synchronization and channel estimation performance can be maintained by the first long training sequence starting the body region, and also, the Doppler tracking performance can be improved.

Figure 26:
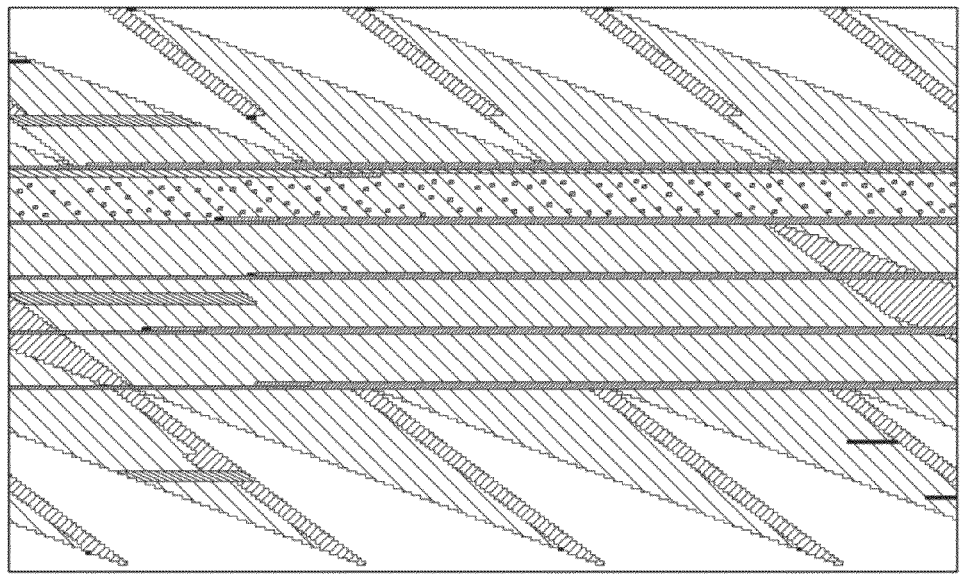

FIG. 26 illustrates a stream configuration showing an example of still another method of inserting known data. Referring to FIG. 26, a second sequence from among the 6 long training sequences is replaced with distributed known data.

Figure 27:
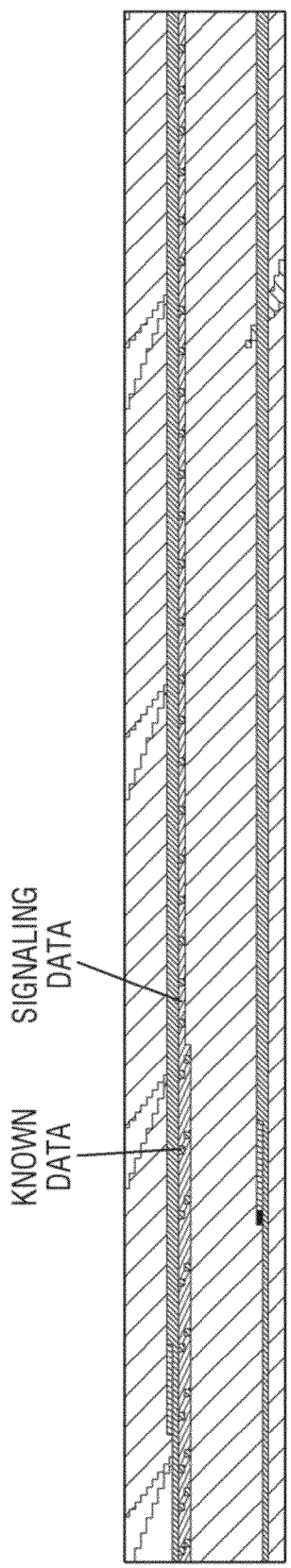

FIG. 27 illustrates the stream configuration of FIG. 26, in which known data replaced in a distributed format is placed alternately along with signaling data.

Figure 28:
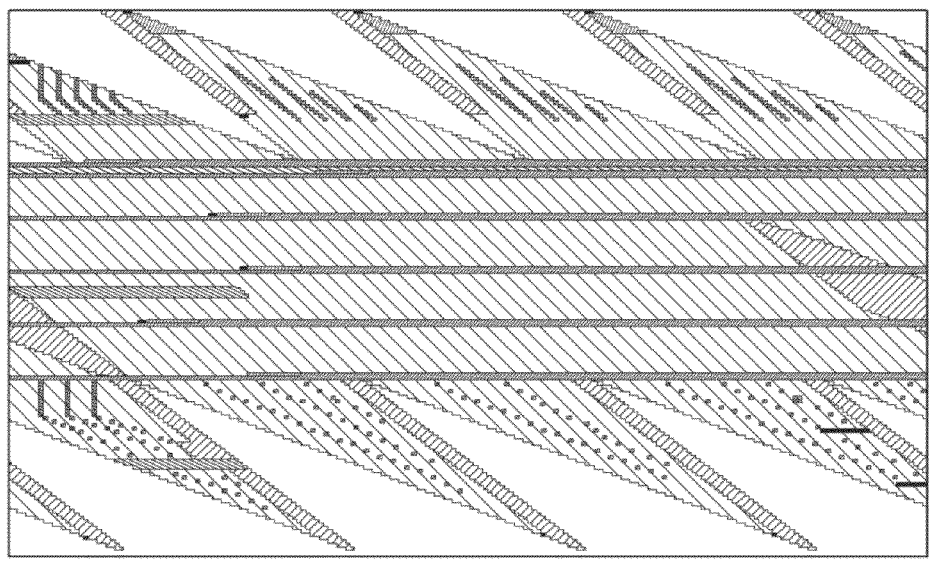

FIG. 28 illustrates a stream configuration in which distributed known data is added to a tail region as well as a head region.

As described above, the known data may be placed in various formats.

If mobile data is newly allocated to packets allocated to normal data, the allocating pattern may be variously changed. Hereinafter, a configuration of a transport stream including mobile data placed in various ways according to a mode will be explained.

[Placement of Mobile Data]

The data pre-processor 100 identifies a setting condition of a frame mode. The frame mode may be set variously. For example, the frame mode may include a first frame mode in which packets allocated to normal data are used for normal data as they is and only the packets allocated to existing mobile data are used for mobile data, and a second frame mode in which at least some of the packets allocated to normal data are also used for mobile data. The frame mode may be arbitrarily set considering a digital broadcast transmission provider's intention and a transmission and reception environment.

If the first frame mode in which normal data is placed in all of the packets allocated to the normal data is set, the data pre-processor 100 places mobile data only in the packets allocated to the mobile data in the same way as that of a related-art ATSC-MH standard.

On the other hand, if the second frame is set, the data pre-processor 100 determines a setting condition of the mode again. The mode indicates in what pattern the mobile data is placed in the packets allocated to the normal data, that is, the second region or in how many packets the mobile data is placed, and various modes are provided according to an exemplary embodiment.

Specifically, the mode may be set to one of a mode in which mobile data is placed in only some of the packet allocated to normal data, a mode in which mobile data is placed in all of the packets allocated to normal data, and an incompatible mode in which mobile data is placed in all of the packets allocated to normal data and the mobile data is also placed in an RS parity region and a header region, which are provided for the sake of compatibility with a receiver to receive the normal data. In this case, the mode in which the mobile data is placed in only some of the packets may be divided into a mode in which a data region of some packet, that is, an entire payload region is utilized for the mobile data and a mode in which only a part of the payload region is utilized for the mobile data.

Specifically, if 38 packets correspond to a second region allocated to normal data, the mode includes:
1) a first mode in which new mobile data is placed in 11 packets from among the 38 packets allocated to the normal data;
2) a second mode in which new mobile data is placed in 20 packets from among the 38 packets allocated to the normal data;
3) a third mode in which new mobile data is placed in 29 packets from among the 38 packets allocated to the normal data;
4) a fourth mode in which new mobile data is placed in all of the 38 packets allocated to the normal data; and
5) a fifth mode in which new mobile data is placed in all of the 38 packets allocated to the normal data and a region corresponding to the MPEG header and the parity from among the region allocated to existing mobile data.

As described above, the fifth mode may be called an incompatible mode and the first to the fourth modes may be called a compatible mode. A type of the compatible mode and the number of packets in each mode may be variously changed.

Figure 29:
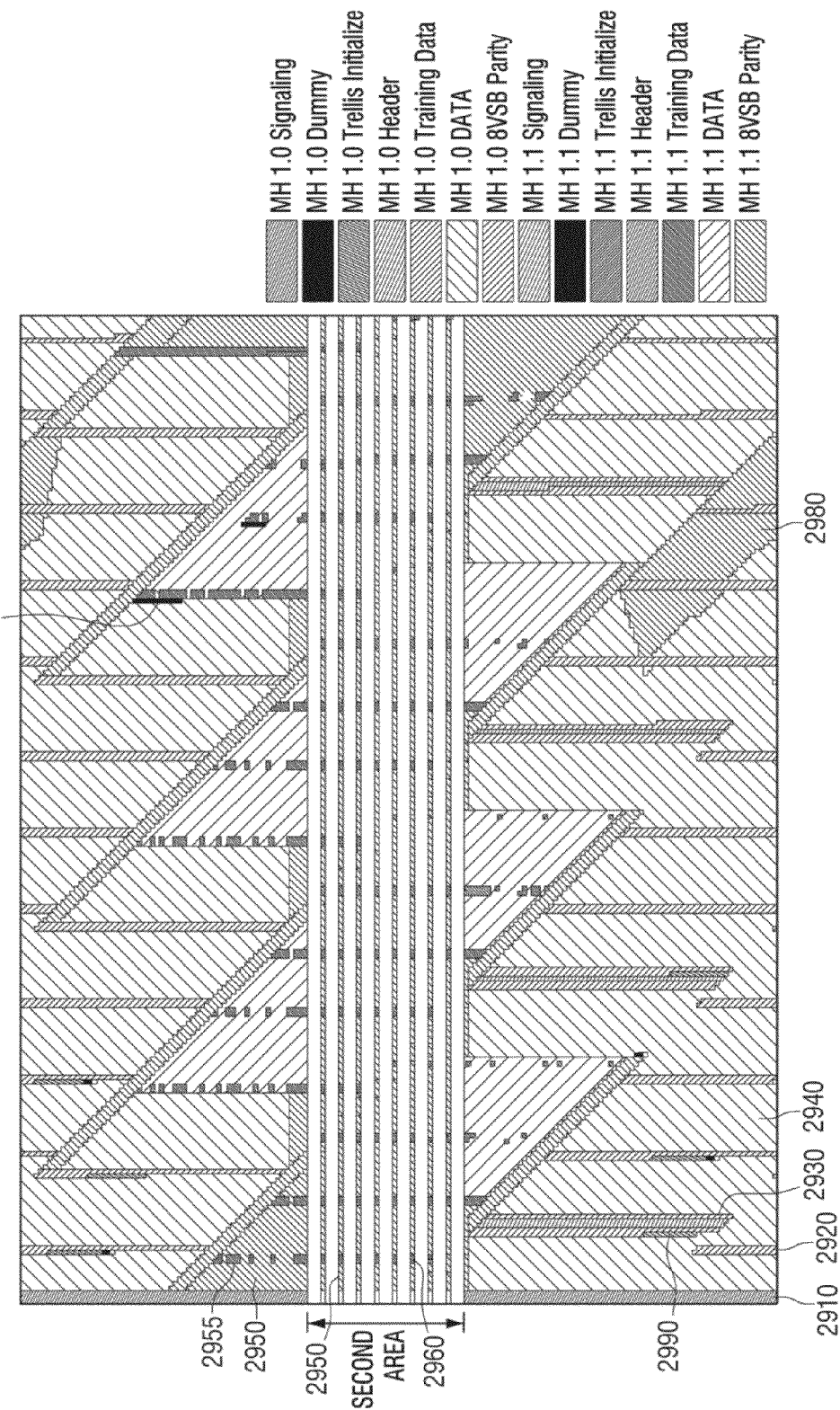
FIG. 29 is a view illustrating a pattern in which mobile data is placed in a normal data region according to a first mode, according to an exemplary embodiment.

FIG. 29 illustrates a stream configuration in which mobile data and known data are placed by the group formatter 130 according to the first mode in an exemplary embodiment in which new mobile data is transmitted using the second region and the head/tail region.

Referring to FIG. 29, new mobile data 2950 and known data 2960 are placed in the second region in a predetermined pattern, and also, the new mobile data and the known data are placed in a portion 2950 corresponding to the head/tail region besides the second region.

It can be seen that the MPEG header 2910, the known data 2920, the signaling data 2930, the existing mobile data 2940, and the dummy 2970 are arranged on the stream in a vertical direction. In such a state, an empty space in the second region is filled with the normal data and then a stream configuration shown in FIG. 30 is generated by encoding and interleaving.

Figure 30:
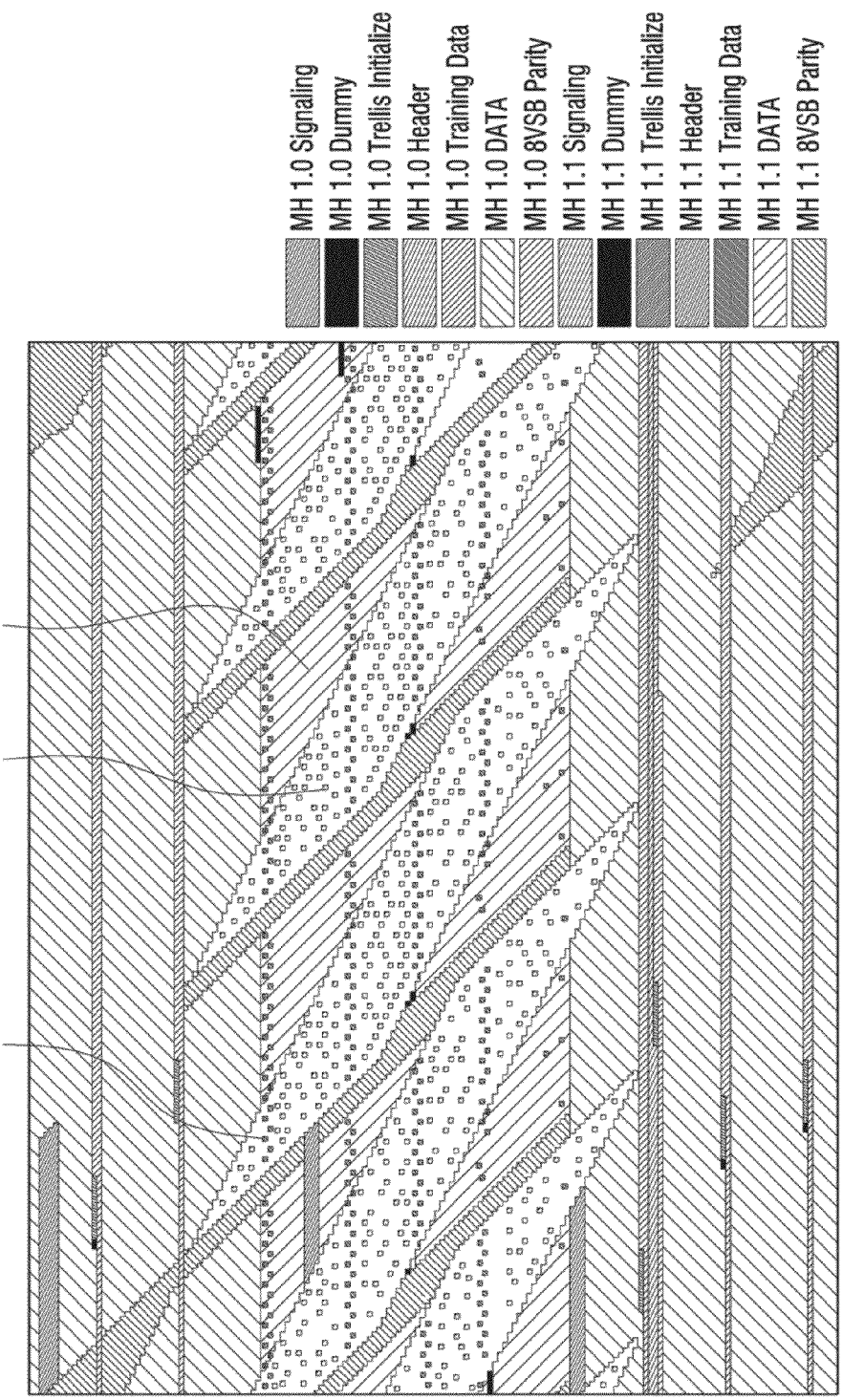
FIG. 30 is a view illustrating the stream of FIG. 29 in an interleaved state.

FIG. 30 illustrates a stream configuration in an interleaved state in the first mode.

Referring to FIG. 30, new mobile data 3010 and known data 3030 are placed in a part of a packet region allocated to normal data. In particular, the known data is arranged discontinuously in the second region, thereby forming a similar long training sequence format to a long training sequence of the body region.

The mobile data 2950 placed in a portion corresponding to the head/tail region in FIG. 29 corresponds to the mobile data 3020 placed in the head/tail region of FIG. 30, and the known data 2955 placed along with the mobile data 2950 forms the known data 3030 of the similar long training sequence format along with the known data in the second region of FIG. 30.

Figure 31:
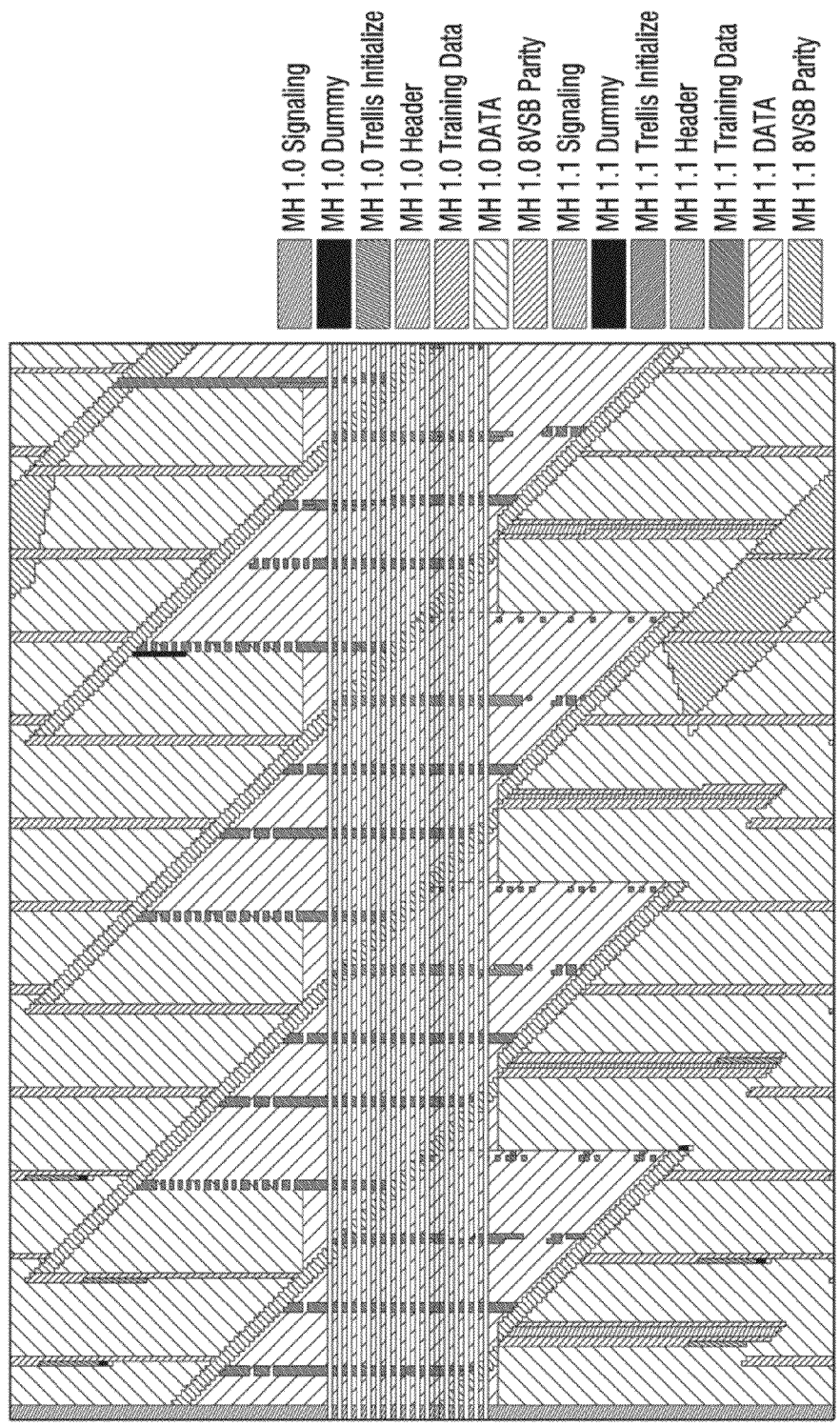
FIG. 31 is a view illustrating a pattern in which mobile data is placed in a normal data region according to a second mode, according to an exemplary embodiment.

FIG. 31 illustrates a stream configuration in which mobile data and known data are placed by the group formatter 130 according to the second mode in an exemplary embodiment in which new mobile data is transmitted using the second region and the head/tail region.

FIG. 31 illustrates an increased ratio of mobile data included in the second region in comparison with FIG. 29. It can be seen that a portion occupied by mobile data and known data increases in FIG. 31 in comparison with FIG. 29.

Figure 32:
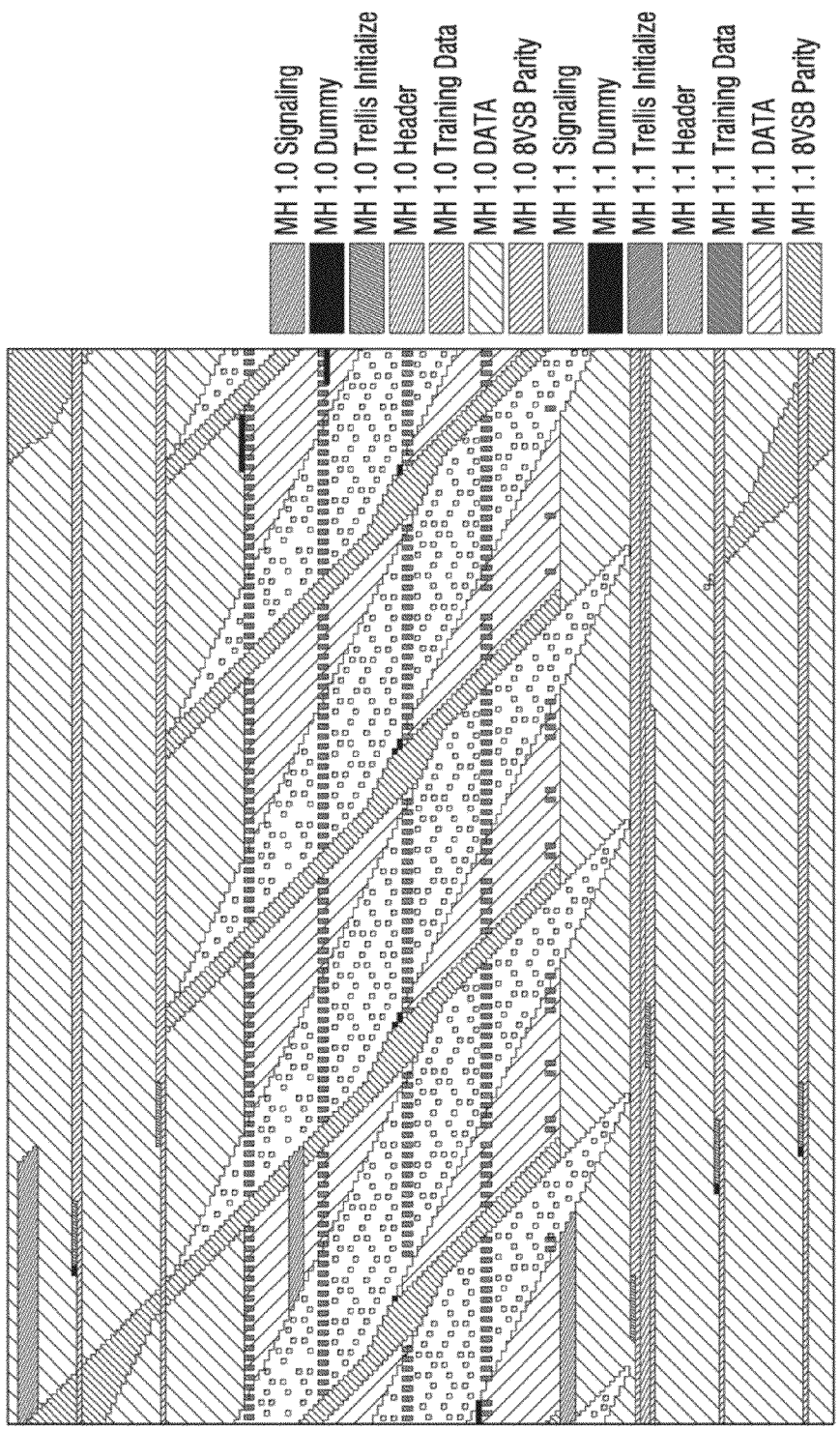
FIG. 32 is a view illustrating the stream of FIG. 31 in an interleaved state.

FIG. 32 illustrates the stream of FIG. 31 in an interleaved state. Referring to FIG. 32, the known data in the second region forms a similar long training sequence more densely than in the known data in the second region of FIG. 30.

Figure 33:
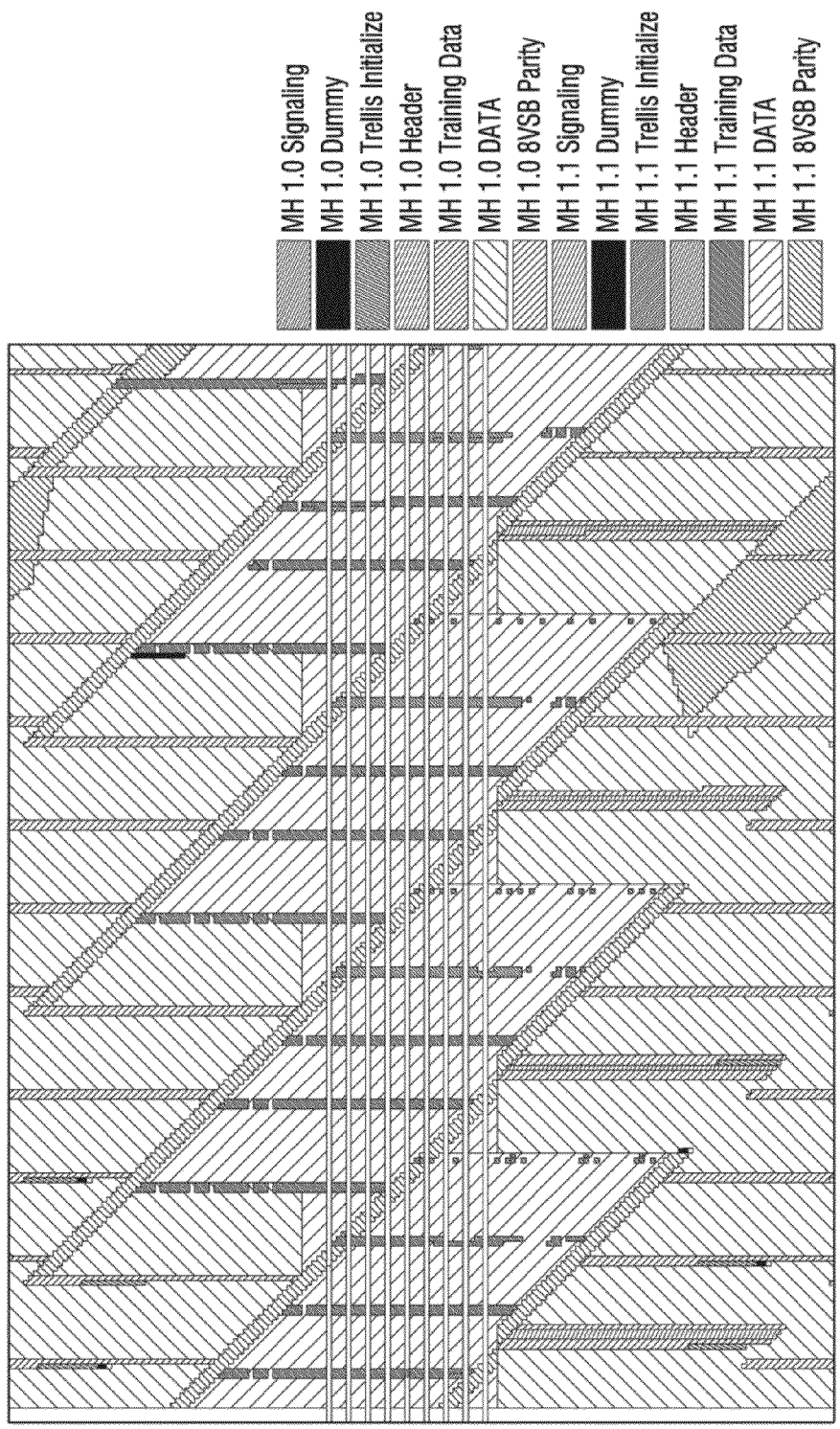
FIG. 33 is a view illustrating a pattern in which mobile data is placed in a normal data region according to a third mode, according to an exemplary embodiment.
Figure 34:
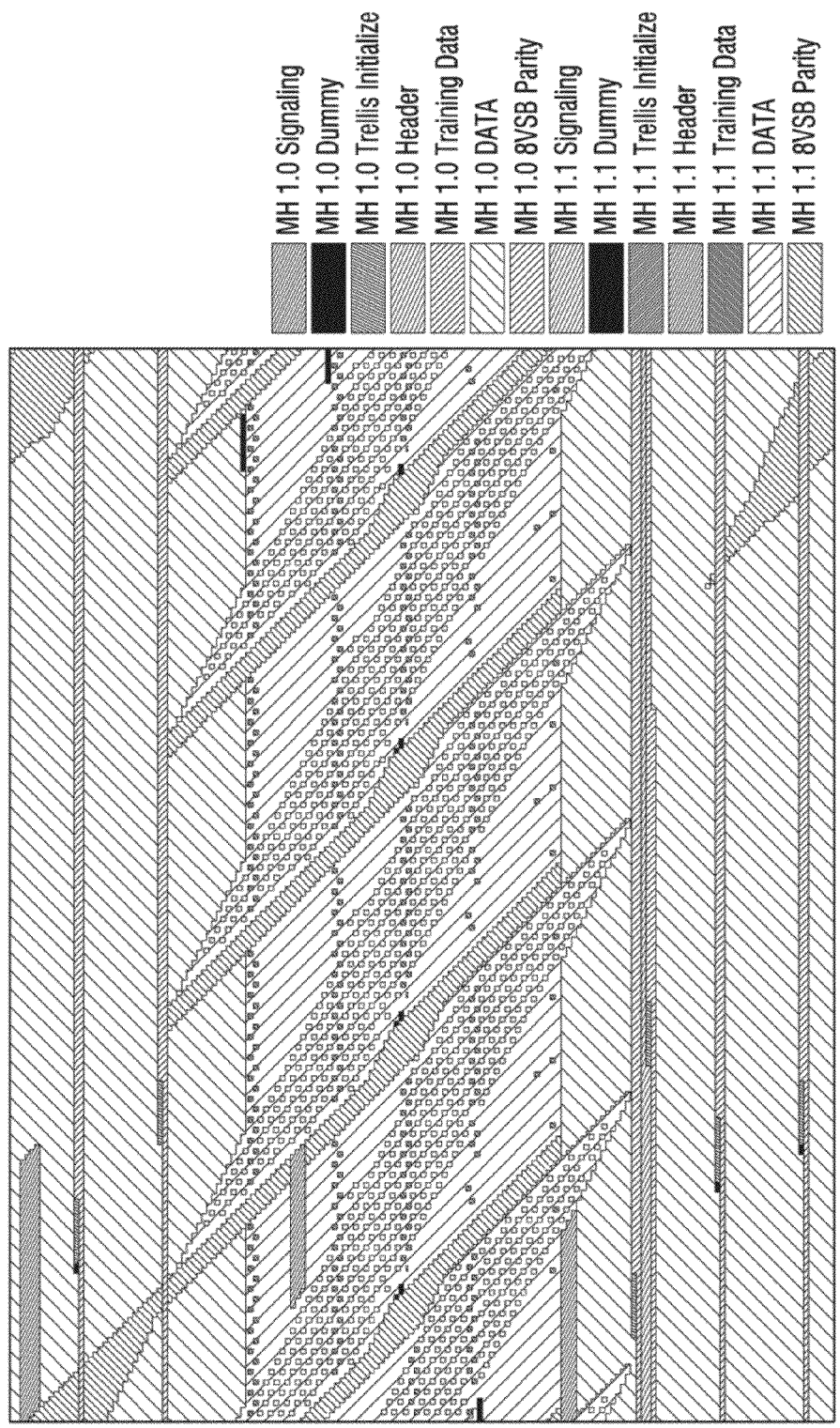
FIG. 34 is a view illustrating the stream of FIG. 33 in an interleaved state.

FIG. 33 illustrates a stream configuration in which mobile data and known data are placed by the group formatter 130 according to the third mode in an exemplary embodiment in which new mobile data is transmitted using the second region and the head/tail region. FIG. 34 illustrates the stream of FIG. 33 in an interleaved state.

There is no additional features in FIGS. 33 and 34 except for that mobile data and known data are more densely placed in comparison to modes 1 and 2, and thus a detailed description is omitted.

Figure 35:
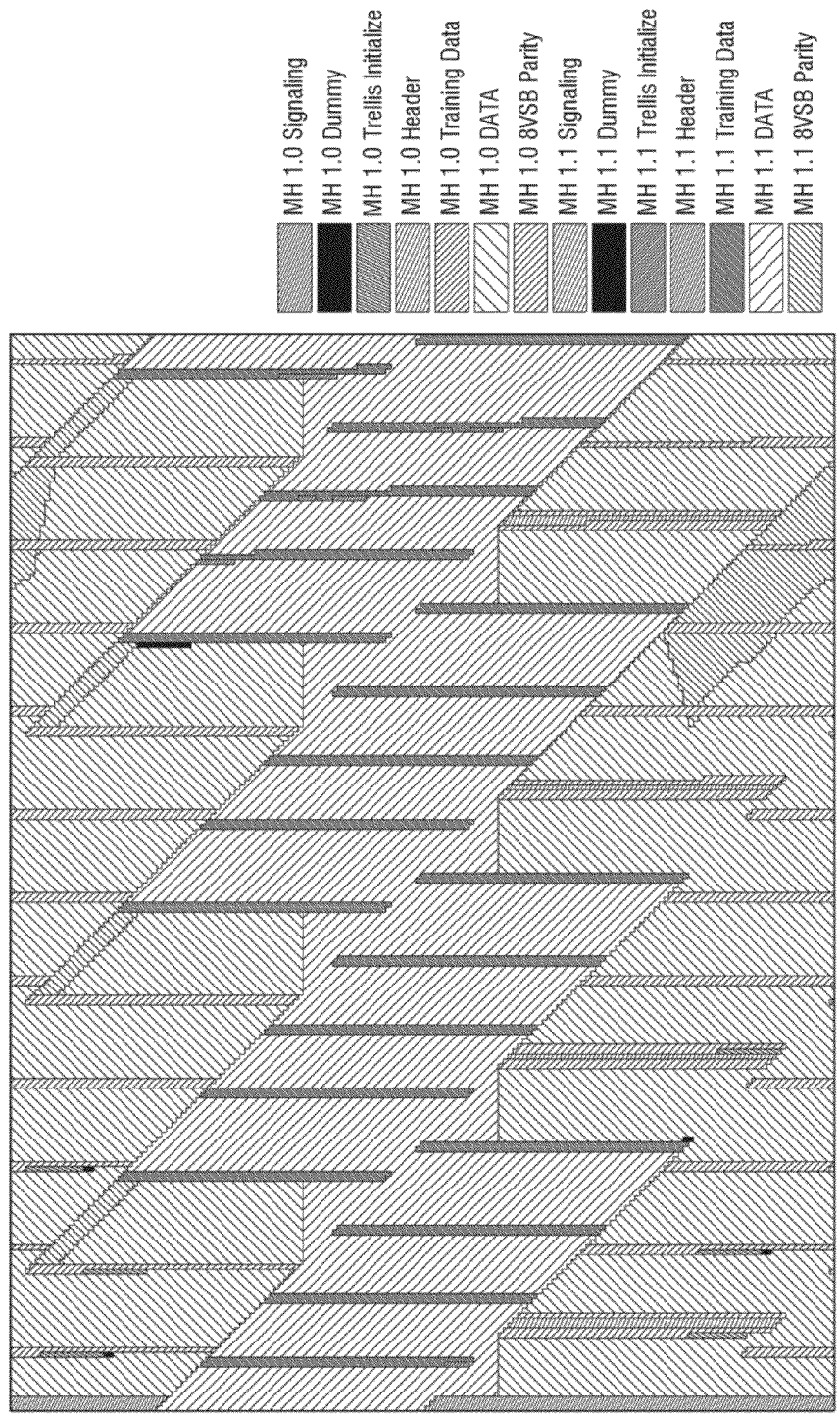
FIG. 35 is a view illustrating a pattern in which mobile data is placed in a normal data region according to a fourth mode, according to an exemplary embodiment.

FIG. 35 illustrates a stream configuration in the fourth mode which uses an entire normal data region in an exemplary embodiment in which all of the packets allocated to the normal data and the packet region allocated to existing mobile data and corresponding to the head/tail region are used.

Referring to FIG. 35, known data is arranged in the second region and a surrounding region of the second region in a vertical direction, and the other region is filled with new mobile data.

Figure 36:
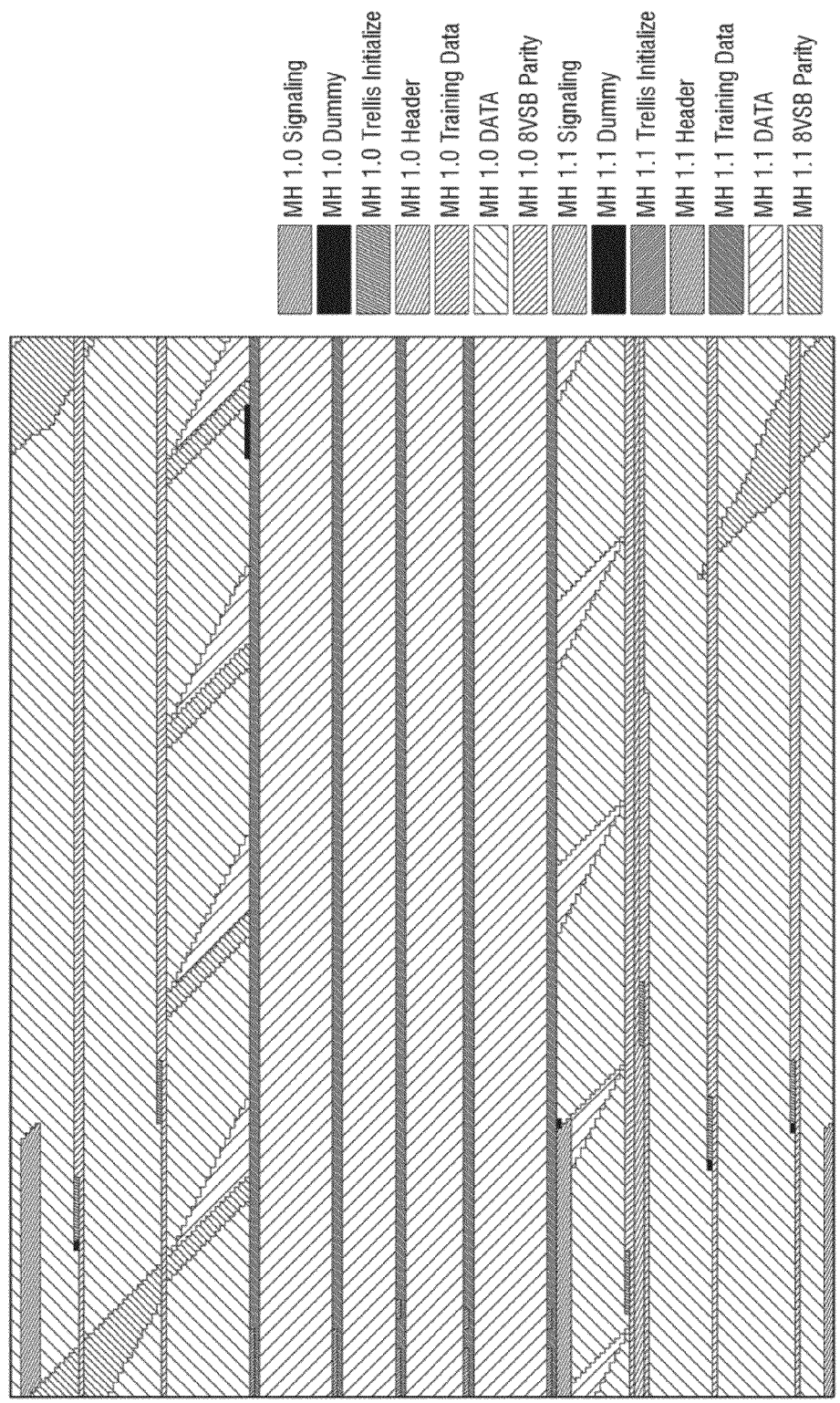
FIG. 36 is a view illustrating the stream of FIG. 35 in an interleaved state.

FIG. 36 illustrates the stream of FIG. 35 in an interleaved state. Referring to FIG. 36, the head/tail region and the entire normal data region are filled with new mobile data and known data, and, in particular, the known data is arranged in a long training sequence format.

The known data is inserted into these regions repeatedly little by little by a plurality of pattern periods, so that the known data becomes distributed known data after interleaving.

Figure 37:
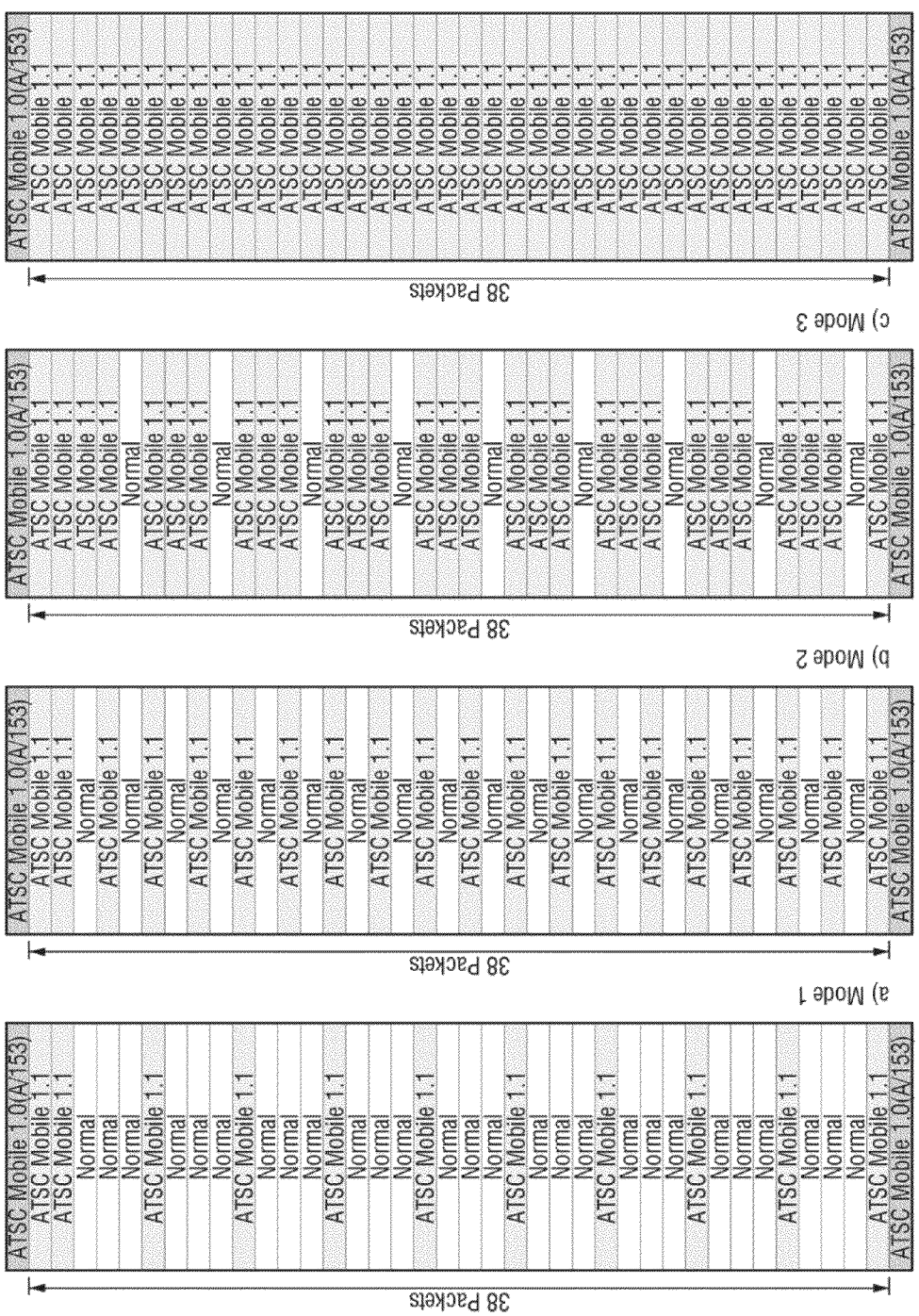
FIGS. 37 to 40 are views illustrating patterns in which mobile data is placed according to various modes of exemplary embodiments.

FIG. 37 is a view to explain a method of inserting new mobile data into the second region, that is, the packets allocated to normal data (for example, 38 packets) in various modes. For the convenience of explanation, the new mobile data is referred to as ATSC mobile 1.1 data (or 1.1 version data) and the existing mobile data is referred to as ATSC mobile 1.0 data (or 1.0 version data) hereinafter.

First, a) in the first mode, the 1.1 version data is placed in an initial packet and a final packet, respectively, and one 1.1 packet and 3 normal data packets are repeatedly inserted into the packets between the initial packet and the final packet. Accordingly, 11 packets in total may be used to transmit the 1.1 version data, that is, the new mobile data.

Next, b) in the second mode, the 1.1 version data is placed in the initial packet and the final packet likewise, and one 1.1 packet and one normal data packet are alternately inserted into the packets between the initial packet and the final packet. Accordingly, 20 packets in total may be used to transmit the 1.1 version data, that is, the new mobile data.

Next, c) in the third mode, the 1.1 version data is placed in the initial packet and the final packet likewise and three 1.1 packets and one normal data packet are repeatedly inserted into the packets between the initial packet and the final packet.

Next, d) in the fourth mode, all of the packets corresponding to the second region are used to transmit the 1.1 version data.

The fourth mode may be realized by a compatible mode in which only the packets corresponding to the second region are used to transmit the 1.1 version data or an incompatible mode in which not only the packets corresponding to the second region but also the MPEG header and the parity region provided for compatibility with a normal data receiver are filled with the 1.1 version data. The incompatible mode may be provided as a separate fifth mode.

The first to the fourth modes may correspond to use of 1/4, 2/4, 3/4, and 4/4 of the entire packets of the second region to transmit the mobile data, respectively. However, the total number of packets is 38, which is not a multiple of 4, and thus some packet are fixed as a packet to transmit new mobile data or normal data and the remaining packets are classified according to the above ratios, so that the modes are classified. That is, as explained in a), b), and c) above, 36 packets, which are 38 packets minus a predetermined number of packets, that is, 2 packets, may include the 1.1 data at the ratio of 1/4, 2/4, and 3/4.

Figure 38:
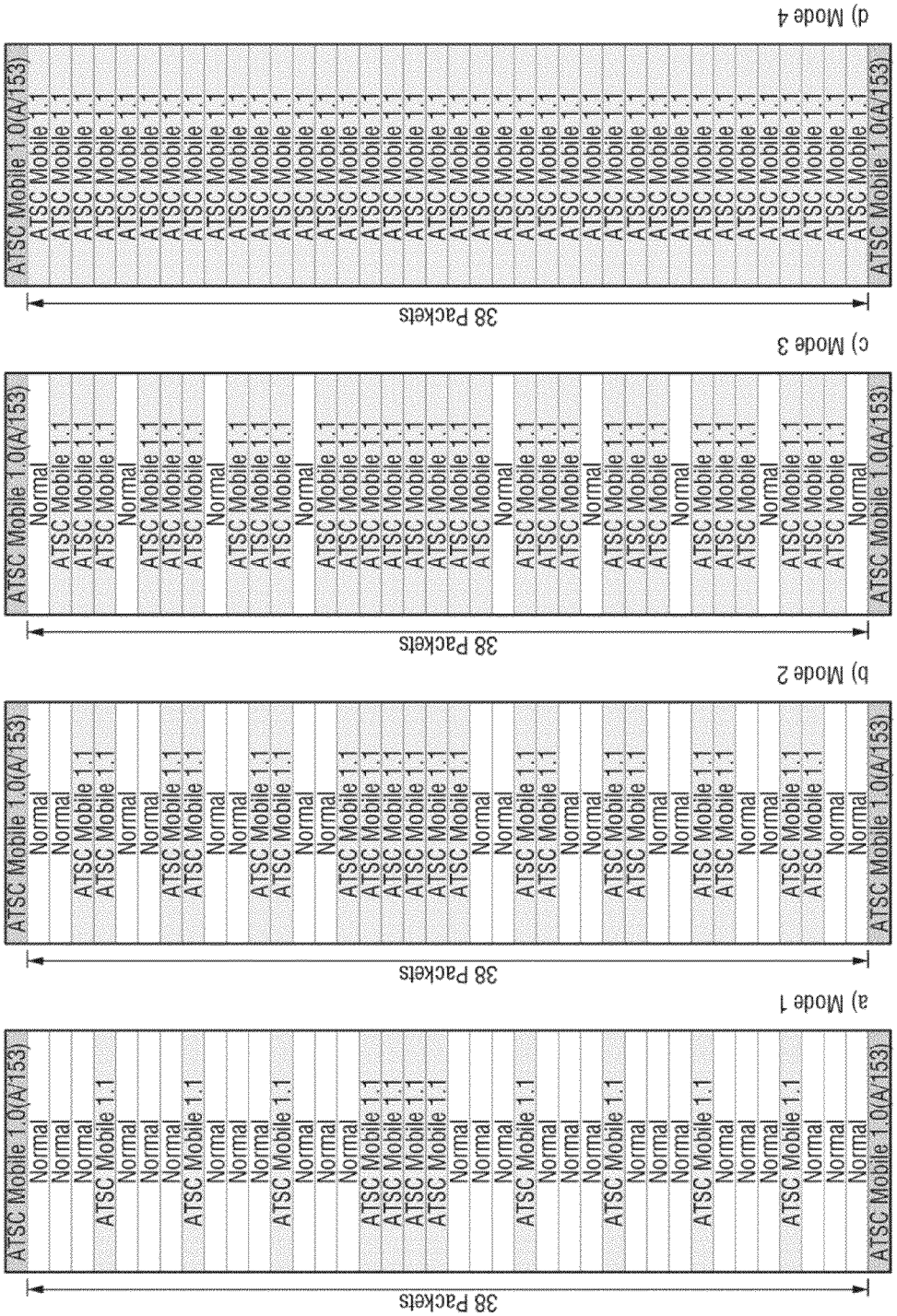

FIG. 38 is a view to explain a mobile data placing pattern in a different mode.

Referring to FIG. 38, two 1.1 version data are placed in intermediate packets, which are located in the middle of the stream of all packets in the second region, that is, 38 packets, and 1.1 version data and normal data are placed in the other packets according to a ratio defined in each mode.

That is, a) in a first mode, with respect to the packets except for the two packets in the middle portion, 3 normal data packets and one 1.1 version data packet are repeatedly placed in the upper portion and one 1.1 version data packet and 3 normal data packets are repeatedly placed in the lower portion.

b) In a second mode, with respect to the packets except for the two packets in the middle portion, two normal data packets and two 1.1 version data packets are repeatedly placed in the upper portion and two 1.1 version data packets and two normal data packets are repeatedly placed in the lower portion.

c) In a third mode, with respect to the packets except for the two packets in the middle portion, one normal data packet and three 1.1 version data packets are repeatedly placed in the upper portion and three 1.1 version data packets and one normal data packet are repeatedly placed in the lower portion.

d) In a fourth mode, 1.1 version data is placed in all of the packets. This is the same as in the fourth mode of FIG. 37.

Figure 39:
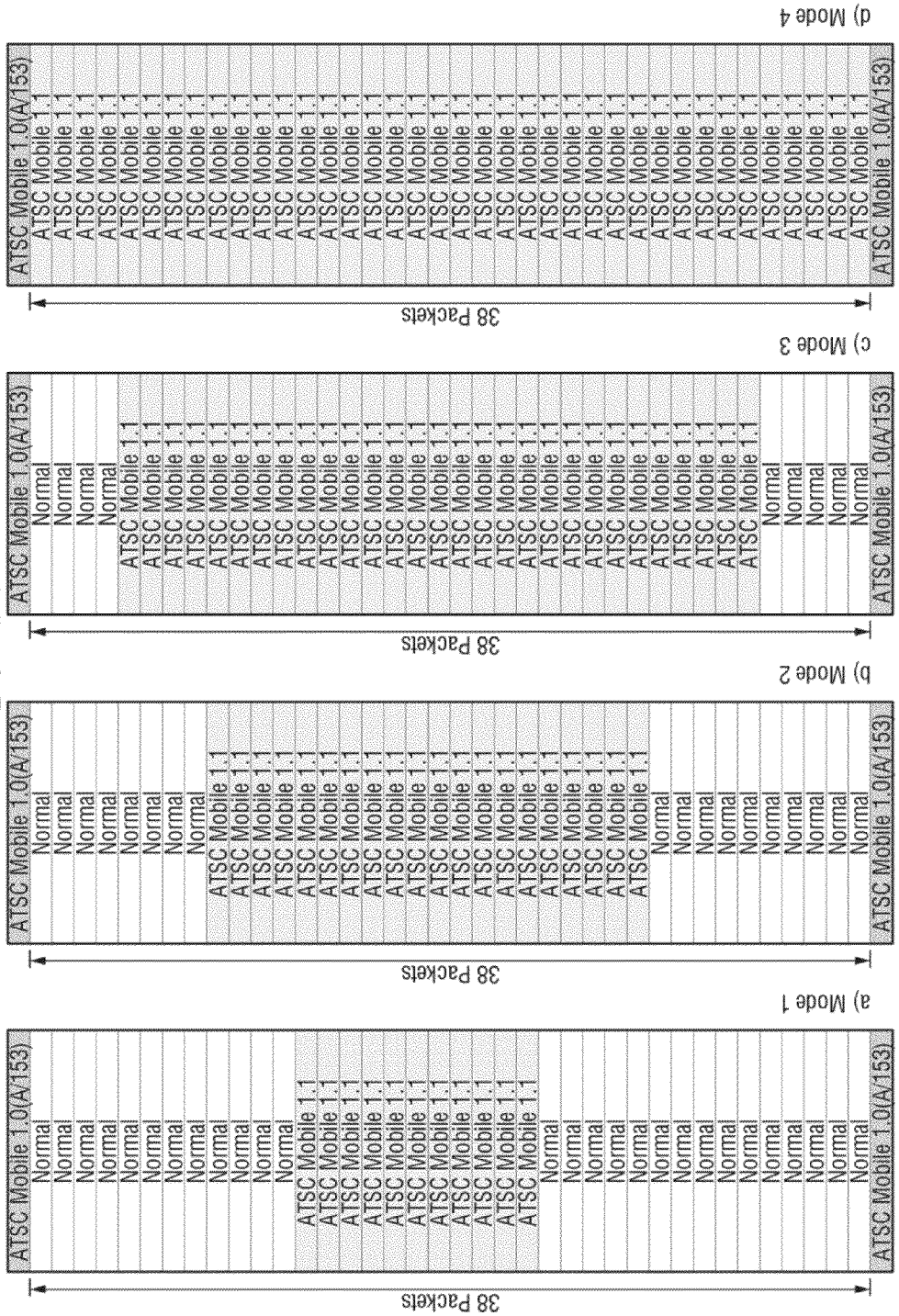

Next, FIG. 39 illustrates an exemplary embodiment in which 1.1 version data is placed from a middle packet to upper and lower packets in sequence with reference to a location on a stream.

That is, a) in a first mode of FIG. 39, 11 packets from among the entire packets of the second region are placed from the middle portion upwardly and downwardly in sequence.

b) In a second mode of FIG. 39, 20 packets in total are placed from the middle portion upwardly and downwardly in sequence. c) In a third mode of FIG. 39, 30 packets in total are placed from the middle portion upwardly and downwardly in sequence. d) In a fourth mode of FIG. 39, all of the packets are filled with 1.1 version data.

Figure 40:
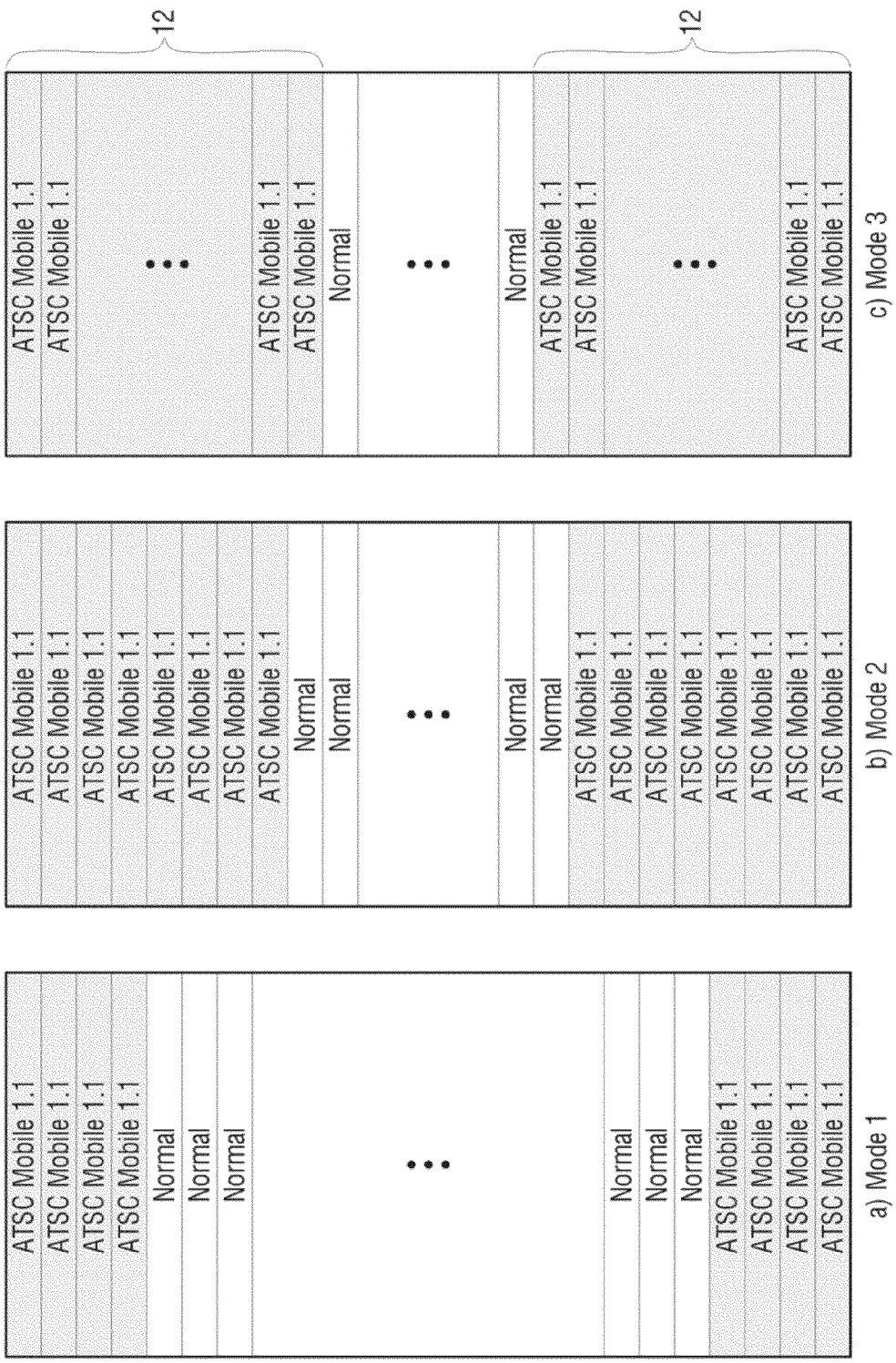

FIG. 40 illustrates a stream configuration according to an exemplary embodiment in which mobile data is placed from upper and lower packets to a middle portion in sequence in an order opposite to that of FIG. 39. Also, in FIG. 40, the number of new mobile data packets in first to fourth modes is differently set from those of the aforementioned exemplary embodiments.

That is, a) in a first mode of FIG. 40, four 1.1 version data packets are placed from an upper packet downwardly and four 1.1 version data packets are placed from a lower packet upwardly. That is, eight 1.1 version data packets in total are placed.

b) In a second mode, eight 1.1 version data packets are placed from the upper packet downwardly and eight 1.1 version data packets are placed from the lower packet upwardly. That is, sixteen 1.1 version data packets in total are placed.

c) In a third mode, twelve 1.1 version data packets are placed from the upper packet downwardly and twelve 1.1 version data packets are placed from the lower packet upwardly. That is, 24 1.1 version data packets in total are placed.

The remaining packets are filled with normal data. In a fourth mode, the packet pattern is the same as in FIGS. 37, 38, and 39 and is omitted from FIG. 40.

Although a pattern of inserting known data is not illustrated in FIGS. 37 to 40, the known data may be inserted into some region of the same packet as that of the mobile data or may be inserted into some region of a separate packet or an entire payload region. The method of inserting known data has been described above and thus is omitted from FIGS. 37 to 40.

In a fifth mode, that is, in an incompatible mode, new mobile data is additionally filled in an RS parity region and a header region in an existing mobile data region other than the normal data region, and thus the fifth mode is omitted from FIGS. 37 to 40.

Although the above-described fifth mode may be a new mode separate from the forth mode, the fourth mode or the fifth mode may be combined with the first to the third modes, so that four modes in total may be realized.

In FIGS. 37 to 40, the method of inserting new mobile data into the second region, that is, the packets allocated to normal data (for example, 38 packets) in various modes has been described. The method of placing new mobile data in the packets allocated to the normal data according to a predetermined mode is different according to the first to the fourth modes as described above in FIGS. 37 to 40. The fourth mode may be realized by a mode in which only the 38 packets are filled with new mobile data or a mode in which new mobile data is placed in the RS parity region and the header region in addition to the 38 packets. Also, as described above, the mode may include all of the first to the fifth modes.

If a mode to determine how many packets from among the 38 packets are allocated to new mobile data and how blocks are configured in an M/H group is a scalable mode, a) a scalable mode 00, b) a scalable mode 01, c) a scalable mode 10, and d) a scalable mode 11 are defined using a signal field of two bits in FIG. 37. Even if all of the 38 packets are allocated to the new mobile data as in d) of FIG. 37, 118 packets, which are an existing mobile data region, and the 38 packets to which mobile data is newly allocated may form a single M/H group.

In this case, two scalable modes are defined according to how blocks are configured in the M/H group. According to whether an entire transmission data rates of 19.4 Mbps is allocated to mobile data or not, an M/H group having a different block configuration may be generated even if all of the 38 packets in one slot are allocated to the mobile data as shown in FIG. 37.

If the entire transmission data rate of 19.4 Mbps is allocated to the mobile data, a normal data rate is 0 Mbps. In this case, a broadcast provider does not consider a normal data receiver and considers only a mobile data receiver. In this case, a region in which a placeholder for the MPEG header and the RS parity, which remain for the sake of compatibility with an existing normal data receiver, exists is defined as a region for mobile data and a transmission capacity of the mobile data may be increased to 21.5 Mbps.

In order to allocate the entire transmission data rate of 19.4 Mbps to the mobile data, 156 packets of the M/H slots configuring the M/H frame should be allocated to the mobile data. This means that 16 slots in each M/H sub-frame are all set to the scalable mode 11. In this case, the 38 packets, which correspond to the normal data region, are filled with the mobile data, and additionally, a SB5 block corresponding to the region in which the placeholder for the MPEG header and the RS parity of the body region exists may be generated. If the 16 slots of the M/H sub-frame are all set to the scalable mode 11 and an RS frame mode is set to 00 (single frame mode), the SB5 block does not exist separately and the placeholder corresponding to the SB5 is absorbed into M/H blocks B4, B5, B6, and B7. If the 16 slots of the M/H sub-frame are all set to the scalable mode 11 and the RS frame mode is 01 (dual frame mode), the placeholder located in the SB5 configures a block SB5. The placeholder region for the RS parity which exists in the head/tail region other than the body region is also filled with the mobile data and the placeholder for the RS parity is absorbed into a block to which a segment where the placeholder for the RS parity exists belongs. A placeholder located in a corresponding segment of M/H blocks B8 and B9 is absorbed into SB1. A placeholder located in the first 14 segments of M/H block B10 is absorbed into SB2. A placeholder located in the last 14 segments of M/H block B1 of the next slot is absorbed into SB3. A placeholder located in corresponding segments of M/H blocks B2 and B3 of the next slot is absorbed into SB4. As shown in FIG. 20 described above, a region for the MPEG header and the RS parity does not exist in the group format after interleaving.

If none of the existing transmission data rate of 19.4 Mbps is allocated to the mobile data, the normal data rate is not 0 Mbps. In this case, a broadcast provider provides services considering both a normal data receiver and a mobile data receiver. In this case, to maintain compatibility with an existing normal data receiver, the MPEG header and the RS parity are not re-defined as mobile data and should be transmitted as they are. That is, as in the above-described compatible mode, even if only some of the 38 packets are filled with new mobile data or all of the 38 packets are filled with new mobile data, the MPEG header and the RS parity are not filled with new mobile data. Accordingly, even if the 38 packets, which are a normal data region in a certain slot, are all filled with mobile data, a block SB5 corresponding to a region where the MPEG header and the RS parity of the body region exist is not generated.

Figure 56:
FIG. 56 is a view illustrating a stream configuration after interleaving in a scalable mode 11a, according to an exemplary embodiment.
Figure 57:
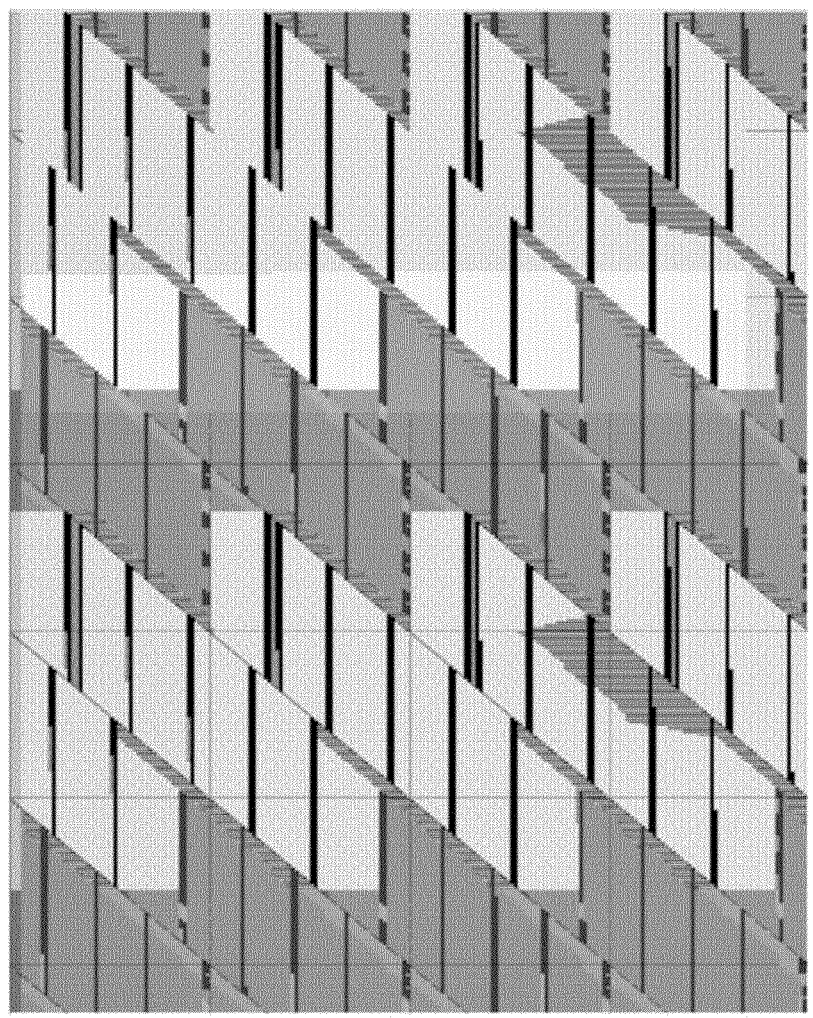
FIG. 57 is a view illustrating a stream configuration before interleaving in a scalable mode 11a, according to an exemplary embodiment.

FIG. 57 illustrates a group format of a packet unit before interleaving considering compatibility if 38 packets, which are a normal data region, are all filled with mobile data. As in d) of FIGS. 37 to 40, all of the 38 packets are allocated to the mobile data, but, as shown in FIG. 56, the region in which the MPEG header and the RS parity exist is maintained in a group format of a segment unit after interleaving and a SB5 block region is not generated. Such a group format may be defined as a group format corresponding to the fourth mode or the scalable mode 11. Also, the fourth mode in which only the 38 packets are filled with the new mobile data considering the compatibility may be referred to as a scalable mode 11a.

If the scalable mode 11, which is an incompatible mode, is used, a slot filled with new mobile data in the other modes cannot be used. That is, all slots, that is, 0th-15th slots should be filled with new mobile data according to the scalable mode 11. On the other hand, the first to the fourth modes may be used in combination.

As described above, the normal data region of each slot may be filled with the mobile data in various formats. Accordingly, the format of the slot may vary according to the setting condition of the frame mode and the mode.

If the four modes are provided as described above, slots in which mobile data is placed in the first to the fourth modes may be referred to as first type slots to fourth type slots.

The digital broadcast transmitter may configure the same type slot in every slot. However, on the contrary, the digital broadcast transmitter may configure a stream to have different types of slots repeated in the unit of a predetermined number of slots.

That is, as shown in FIG. 41, the data pre-processor 100 may place mobile data so that one first type slot and three zero type slots are repeatedly placed. The zero type slot refers to a slot in which normal data is allocated to packets allocated to normal data as it is.

Such types of slots may be defined using existing signaling data, for example, a specific portion of a TPC or an FIC.

If the frame mode is set to 1 as described above, the mode may be set to one of the plurality of modes, the first to the fourth modes. The fourth mode may be the scalable mode 11 or the scalable mode 11a described above. Also, the fourth mode may include the scalable modes 11 and 11a and may be one of the five modes in total. The mode may be divided into at least one compatible mode and an incompatible mode, that is, a scalable mode 11.

If the mode includes the first to the fourth modes according to an exemplary embodiment, slots corresponding to the modes may be referred to as 1-1, 1-2, 1-3, and 1-4 type slots.

That is, the 1-1 type slot refers to a slot in which 38 packets are allocated in the first mode, the 1-2 type slot refers to a slot in which 38 packets are allocated in the second mode, the 1-3 type slot refers to a slot in which 38 packets are allocated in the third mode, and the 1-4 type slot refers to a slot in which 38 packets are allocated in the fourth mode.

FIG. 42 illustrates examples of a stream in which various types of slots are repeatedly placed.

Example 1 of FIG. 42 illustrates a stream in which the 0 type slot and the 1-1, 1-2, 1-3, and 1-4 type slots are repeated in sequence.

Example 2 of FIG. 42 illustrates a stream in which the 1-4 type slot and the 0 type slot are alternately repeated. As described above, the fourth mode is a mode in which the entire normal data region is filled with mobile data. Thus, in the entire normal data region of example 2, a slot used for mobile data and a slot used for normal data are alternately placed.

As in examples 3, 4, and 5, various types of slots may be repeatedly placed in various ways. In particular, as in example 6, the entire slots may be incorporated into a single type, thereby configuring a stream.

Figure 43:
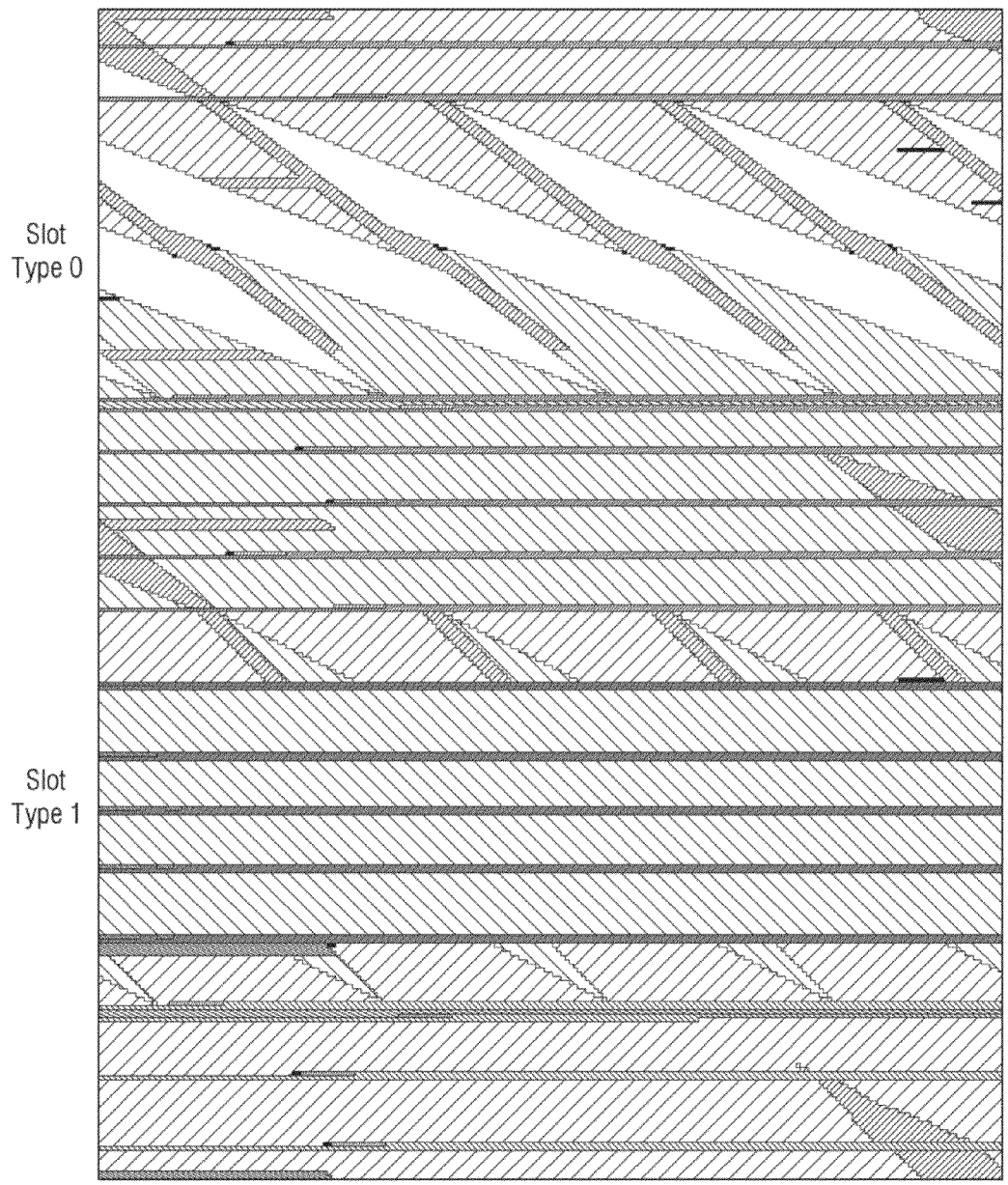

FIG. 43 is a view illustrating a stream configuration according to example 2 of FIG. 42. Referring to FIG. 43, in the 0 type slot, the normal data region is used for normal data, and, in the first type slot, the entire normal data region is used for mobile and simultaneously known data is placed in a long training sequence format. As described above, the types of the slots may be realized variously.

FIGS. 44 to 47 illustrate stream configurations to explain a method for allocating blocks in modes 1 to 4. As described above, each of the first region and the second region may be divided into a plurality of blocks.

The data pre-processor 100 may perform block coding in a unit of a single block or combination of a plurality of blocks according to a predetermined block mode.

Figure 44:
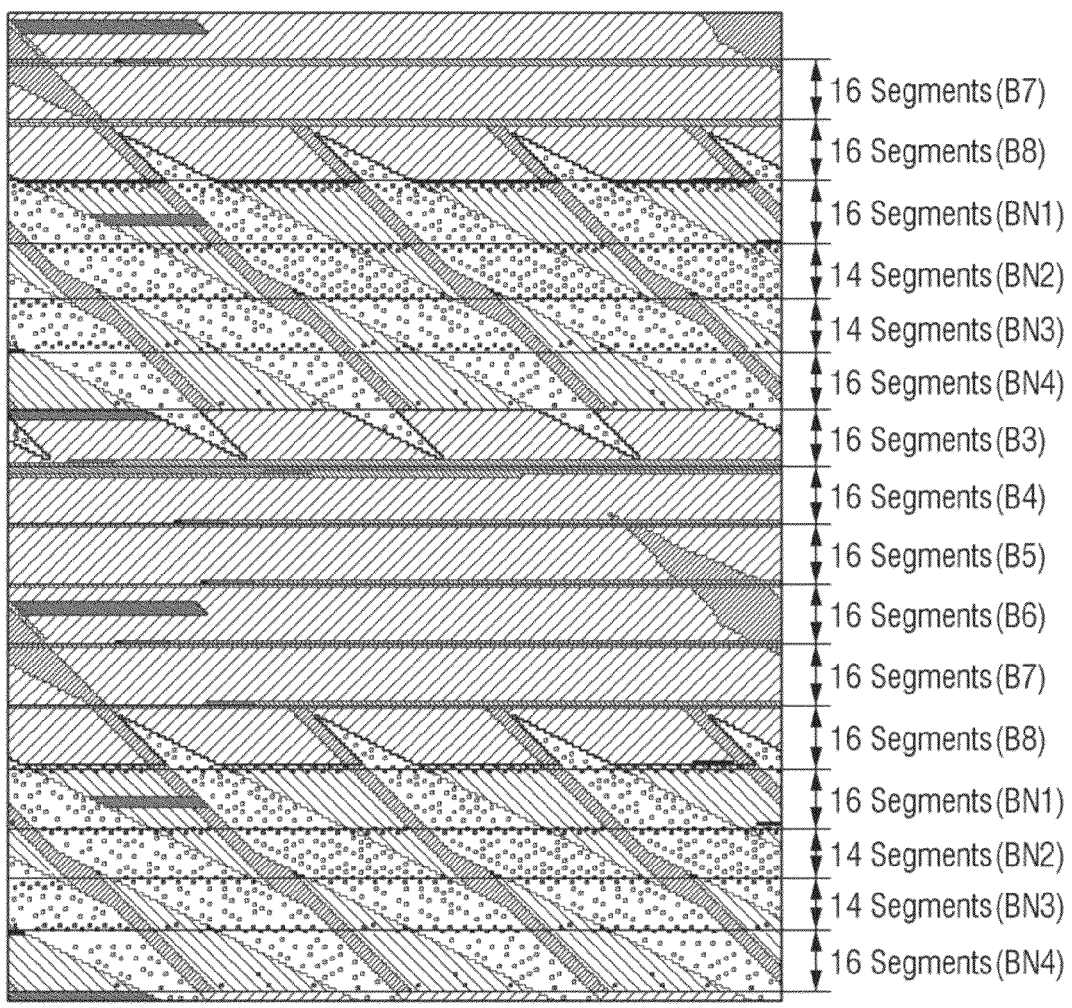
FIGS. 44 to 47 are views to explain a method of allocating blocks according to various exemplary embodiments.

FIG. 44 illustrates block dividing in the first mode. Referring to FIG. 44, the body region is divided into blocks B3-B8 and the head/tail region is divided into blocks BN1-BN4.

Figure 45:
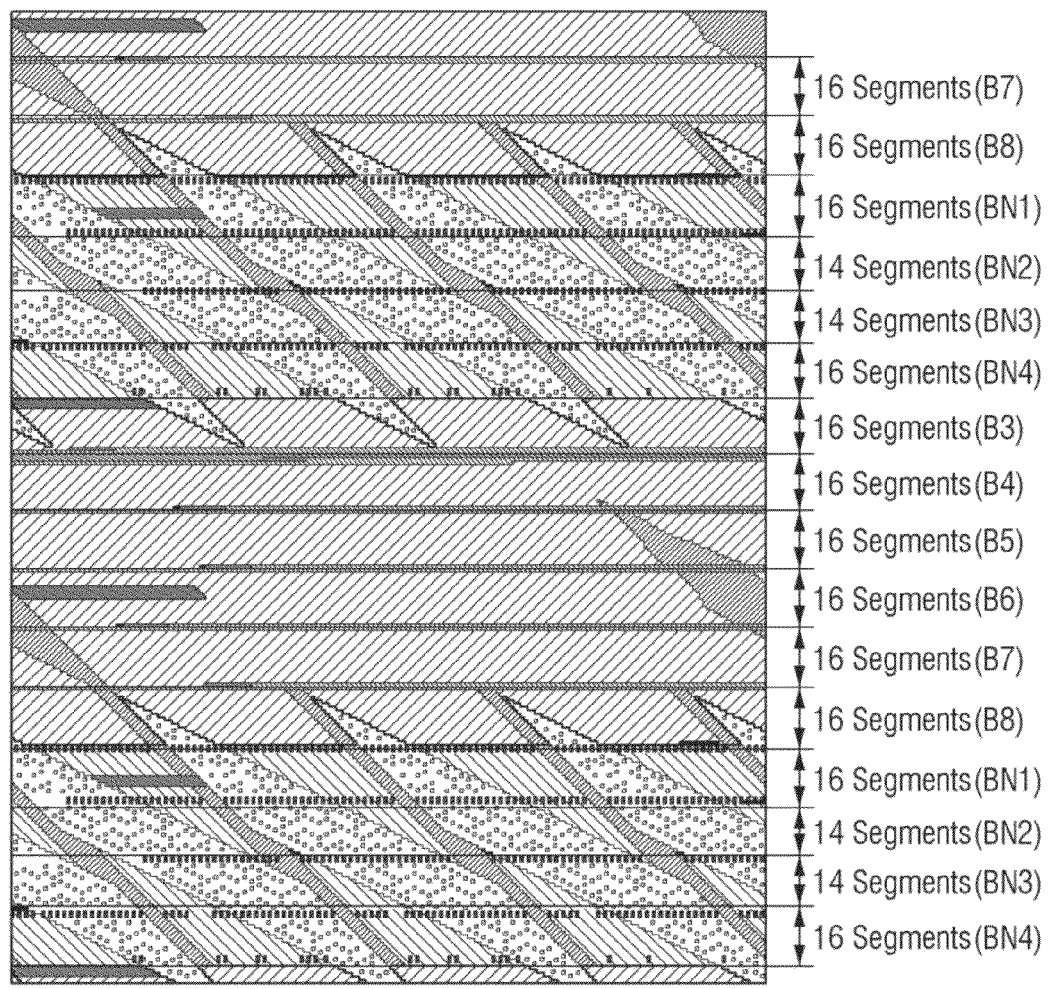
Figure 46:
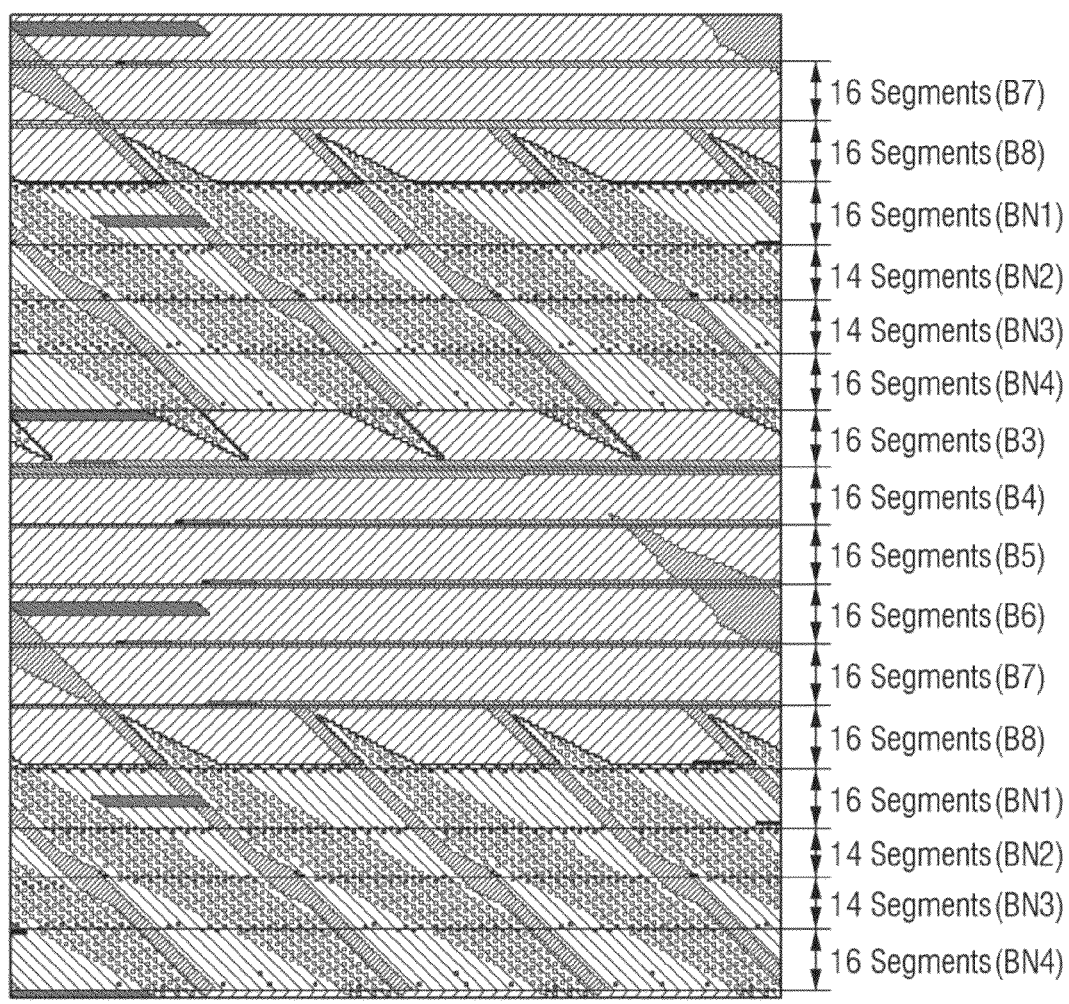

FIGS. 45 and 46 illustrate block dividing in the second mode and the third mode. Like in FIG. 44, each of the body region and the head/tail region are divided into a plurality of blocks.

Figure 47:
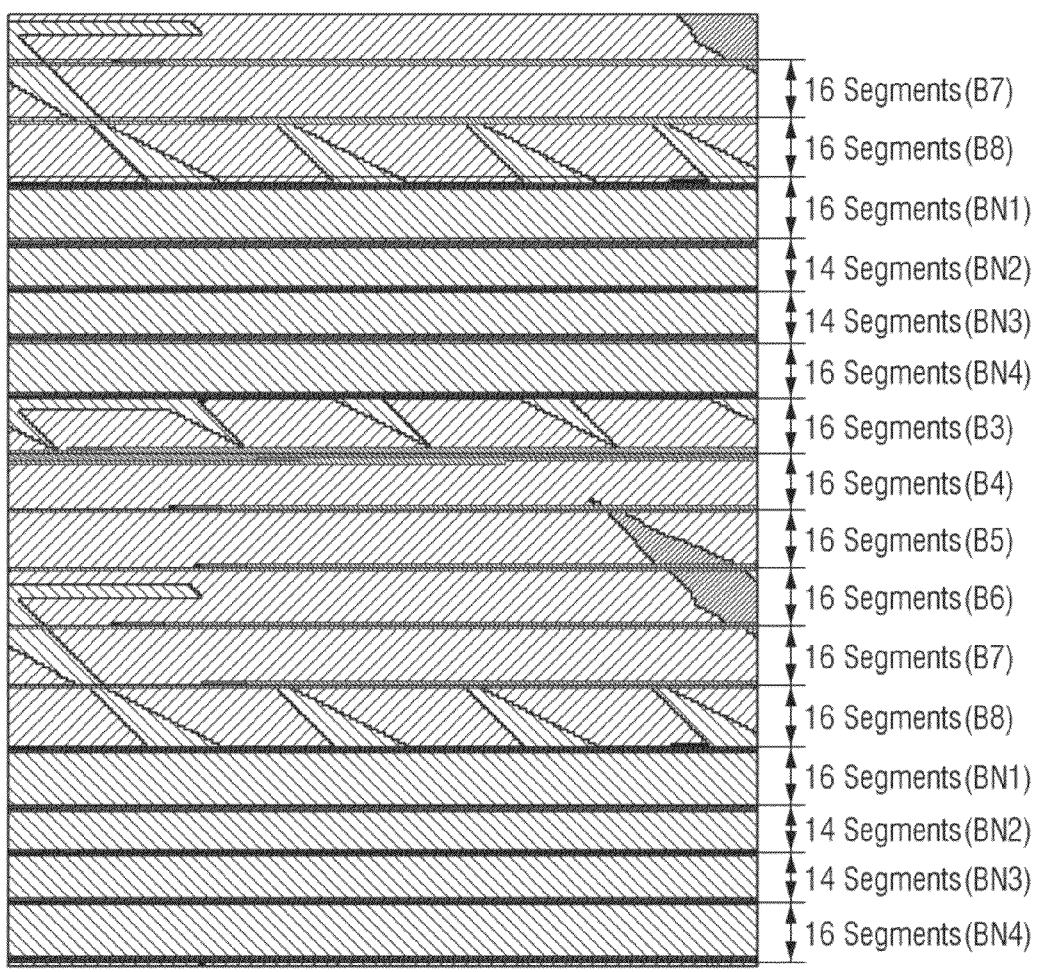

FIG. 47 illustrates block dividing in the fourth mode in which the head/tail region is completely filled with mobile data. Since the normal data region is completely filled with the mobile data, the MPEG header of the body region and the parity of the normal data are redundant. These portions are defined as block BN5 in FIG. 47. Block BN5 is filled with new mobile data in the incompatible mode and is used for the header and the parity in the compatible mode. In comparison with FIGS. 44 to 46, FIG. 47 illustrates the head/tail region divided into blocks BN1-BN5.

As described above, the block processor 120 of the data pre-processor 100 converts an RS frame in a unit of a block and processes blocks. That is, as shown in FIG. 7, the block processor 120 includes the first converter 121, which combines mobile data in the RS frame according to a predetermined block mode, thereby outputting a serially concatenated convolutional code (SCCC) block.

The block mode may be set variously.

For example, if the block mode is set to 0, blocks BN1, BN2, BN3, BN4, and BN5 are output as a single SCCC block and serve as a unit of SCCC coding.

On the other hand, if the block mode is set to 1, blocks are added, thereby configuring a SCCC block. Specifically, BN1+BN3=SCBN1 and BN2+BN4=SCBN2. Block BN5 may become block SCBN3.

Besides the mobile data placed in the second region, existing mobile data placed in the first region may be block-coded by being incorporated into a single block or a plurality of blocks according to the block mode. This is the same as a related-art ATSC-MH and thus a detailed description thereof is omitted.

Information on the block mode may be written on existing signaling data or included in a region provided in new signaling data, and may be notified to the receiver. The receiver identifies the information on the block mode and appropriately decodes the data, thereby recovering an original stream.

As described above, data to be block-coded may be combined to configure an RS frame. That is, the frame encoder 110 in the data pre-processor 100 generates an RS frame by combining frame portions so that the block processor 120 can perform blocking coding appropriately.

Specifically, an RS frame 0 is generated by combining blocks SCBN1 and SCBN2 and an RS frame 1 is generated by combining blocks SCBN3 and SCBN4.

Also, the RS frame 0 may be generated by combining blocks SCBN1, SCBN2, SCBN3, and SCBN4 and the RS frame 1 may be generated by block SCBN5.

Also, a single RS frame may be generated by adding blocks SCBN1, SCBN2, SCBN3, SCBN4, and SCBN5.

Also, an RS frame may be generated by adding blocks corresponding to existing mobile data and newly added blocks (SCBN1~SCBN5).

Figure 48:
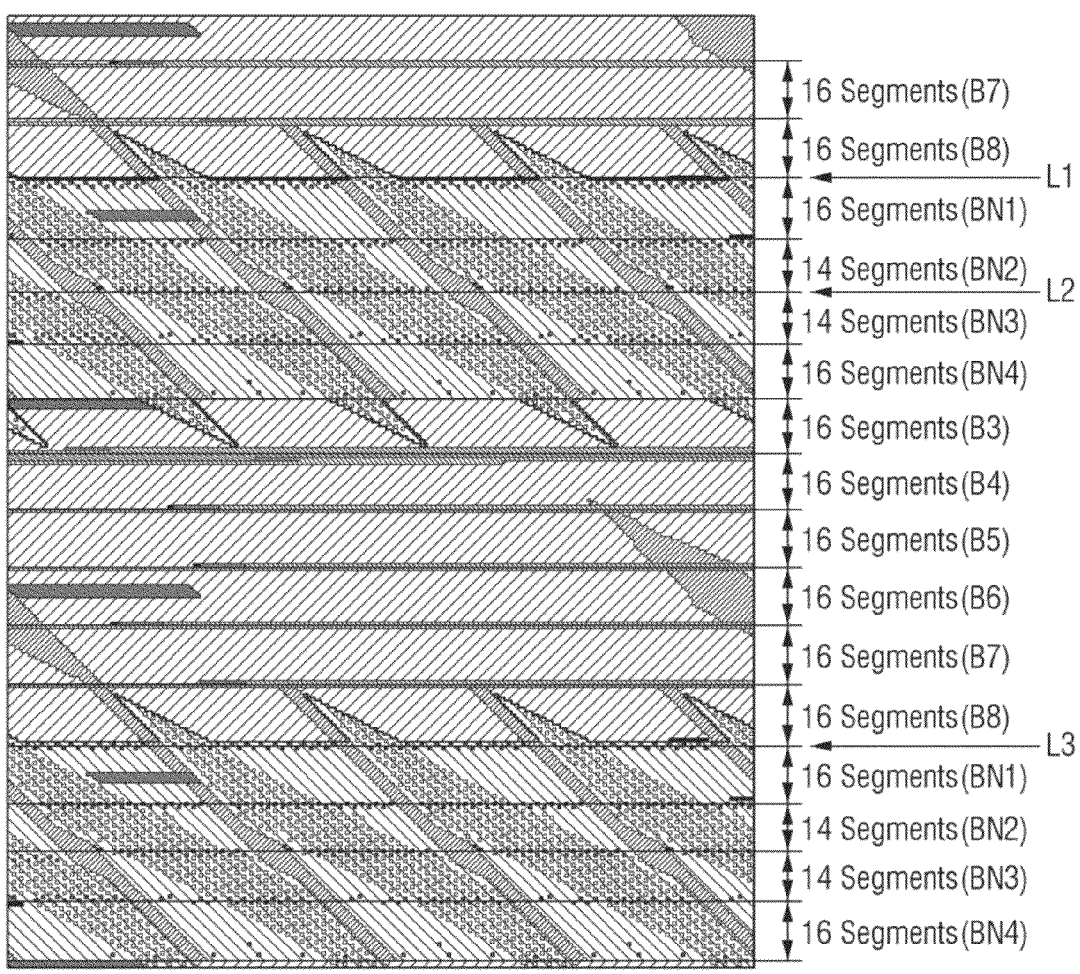
FIG. 48 is a view to explain a method of defining a start point of an RS frame according to various exemplary embodiments.

FIG. 48 is a view to explain various methods of defining a start point of an RS frame. Referring to FIG. 48, a transport stream is divided into a plurality of blocks. In the related-art ATSC-MH, an RS frame is identified between blocks BN2 and BN3. However, as mobile data and known data are inserted into the normal data region as in the present exemplary embodiment, a start point of the RS frame may be differently defined.

For instance, the RS frame may start from a boundary between blocks BN1 and B8, may start from a boundary between blocks BN2 and BN3 similarly to a current reference point, or may start from a boundary between blocks B8 and BN1. The start point of the RS frame may be defined differently according to a combination condition of the block coding.

Configuration information of the above-described RS frame may be included in a region provided in existing signaling data or new signaling data and may be notified to the receiver.

Since new mobile data and known data are inserted into a region originally allocated to normal data and a region allocated to existing mobile data as described above, a variety of information is used to notify this fact to the receiver. Such information may be transmitted using a reserved bit in a TPC region according to the related-art ATSC-MH standard, and also, a signaling data region is newly obtained and new signaling data may be transmitted using that region. Since the newly provided signaling region should be placed in the same location in every mode, the new signaling region is placed in a head/tail portion.

Figure 49:
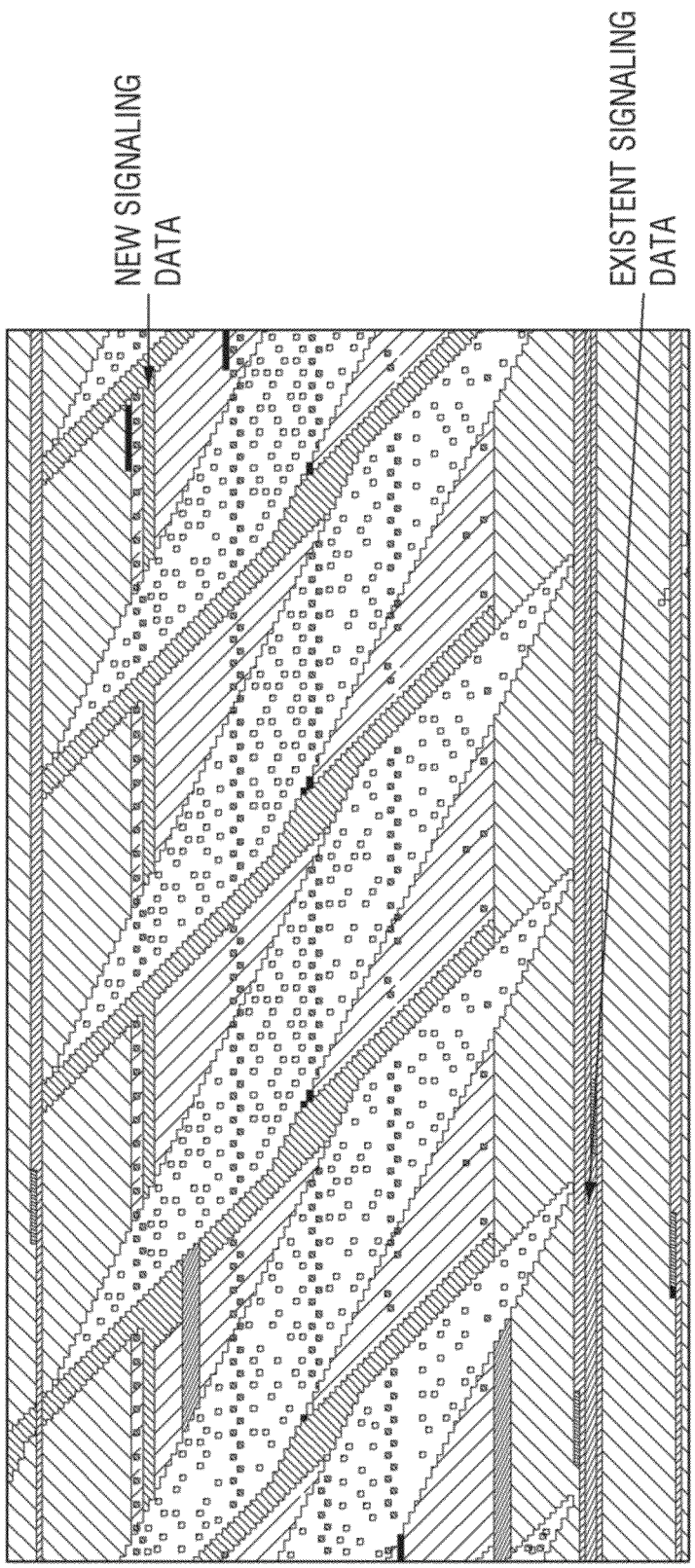
FIG. 49 is a view to explain an insertion location of signaling data according to an exemplary embodiment.

FIG. 49 illustrates a stream configuration indicating a placement location of existing signaling data and a placement location of new signaling data.

Referring to FIG. 49, the existing signaling data is located between long training sequences of a body region and the new signaling data is located in a head/tail region. The new signaling data encoded by the signaling encoder 150 is inserted to a predetermined location shown in FIG. 49 by the group formatter 130.

The signaling encoder 150 may improve performance by using a code different from that of a related-art signaling encoder or by performing coding at a different code rate.

That is, the same data is transmitted two times using a ⅛ PCCC code in addition to the existing RS code or using an RS+¼ PCCC code so that the same effect as when a ⅛ rate PCCC code is used can be obtained.

Since the known data is included in the transport stream as described above, a memory in a trellis encoder should be initialized before trellis encoding is performed for the known data.

If a long training sequence is provided as in mode 4, it is possible to process a corresponding sequence by single initialization and thus there is no big problem. However, if the known data is discontinuously placed as in the other modes, there is a problem that initialization should be performed several times. Also, if the memory is initialized to have a value of 0, it is difficult to make the same symbol as in mode 4.

Considering this, trellis reset is not performed and a trellis encoder memory value (that is, a register value) in mode 4 in the same location may be loaded into the trellis encoder so that the same symbol as in mode 4 can be created in modes 1 to 3. To achieve this, memory storage values of the trellis encoder in mode 4 are recorded and stored in the form of a table, and may be trellis-encoded to have values of corresponding locations of the stored table. Also, a separate trellis encoder operable in mode 4 is provided and a value obtained from the trellis encoder may be utilized.

As described above, the mobile data can be provided in various ways using the normal data region and the existing mobile data region in the transport stream actively. Accordingly, in comparison with the related-art ATSC standard, exemplary embodiments can provide a stream more suitable for transmission of the mobile data.

[Signaling]

As the new mobile data and the known data are added to the transport stream as described above, a technology to notify this fact to the receiver to process such data is used. Notification may be performed in various ways.

In a first method, the presence/absence of new mobile data may be notified using a data field sync which is used for transmission of existing mobile data.

Figure 50:
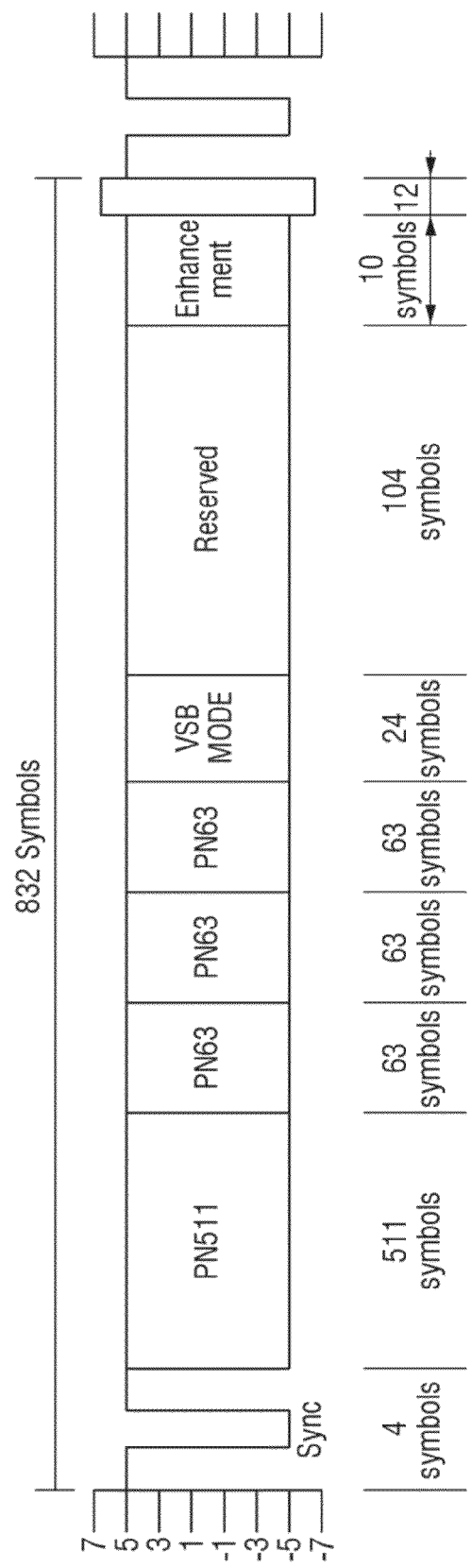
FIG. 50 is a view illustrating an example of a data field sync configuration to transmit signaling data according to an exemplary embodiment.

FIG. 50 is a view illustrating an example of a data field sync configuration. Referring to FIG. 50, a data field sync includes 832 symbols in total. 104 of the 832 symbols correspond to a reserve region. The 83rd to 92nd symbols in the reserve region, that is, 10 symbols correspond to an enhancement region.

If only 1.0 version data is included, the 85th symbol in an odd numbered data field is set as +5 and the remaining symbols, that is, the 83rd, 84th, and 87th~92nd symbols, are set as −5. The even numbered data field has an opposite symbol sign to that of the odd numbered data field. That is, it is notified whether 1.1 version data is included or not using the 86th symbol.

Another symbol in the enhancement region may be used inform whether 1.1 version data is included or not. That is, by setting one or a plurality of symbols except for the $85^{th}$ symbol as +5 or other values, it is notified whether 1.1 version data is included or not. For instance, the $87^{th}$ symbol may be used.

The data field sync is generated by the controller or the signaling encoder of FIG. 3 or a separately provided field sync generator, and is provided to the sync multiplexer 470 of FIG. 4 and thus is multiplexed into a stream by the sync multiplexer 470.

In a second method, the presence/absence of 1.1 version data may be notified using a TPC. The TPC may include syntaxes as in table 1 below.

TABLE 1

| Syntax | No. of Bits | Format |
|---|---|---|
| TPC_data { sub-frame_number slot_number | 34743322222 | uimsbfuimsbf uimsbfuimsbf |
| parade_id starting_group_number number_of_groups_minus_1 parade_repetition_cycle_minus_1 rs_frame_mode rs_code_mode_primary rs_code_mode_secondary sccc_block_mode sccc_outer_code_mode_a sccc_outer_code_mode_b sccc_outer_code_mode_c sccc_outer_code_mode_d fic_version parade_continuity_counter total_number_of_groups reserved tpc_protocol_version} | 222545215 | uimsbfuimsbf bslbfbslbfbslbf bslbfbslbfbslbf bslbfbslbfuims bfuimsbfuims bfbslbfbslbf |

There is a reserved region in the TPC information as shown in table 1. Accordingly, it is possible to signal whether mobile data is included in packets allocated to normal data, that is, in a second region, a location of the mobile data, whether new known data is added or not, and a location of the added known data, using one bit or a plurality of bits in the reserved region.

Inserted information may be expressed as in table 2 below:

TABLE 2

| Necessary Field | Bits (changeable) |
|---|---|
| 1.1 frame mode | 3 |
| 1.1 mobile mode | 2 |
| 1.1 SCCC block mode | 2 |
| 1.1 SCCCBM1 | 2 |
| 1.1 SCCCBM2 | 2 |
| 1.1 SCCCBM3 | 2 |

TABLE 2-continued

| Necessary Field | Bits (changeable) |
|---|---|
| 1.1 SCCCBM4 | 2 |
| 1.1 SCCCBM5 | 2 |

In table 2, the 1.1 frame mode refers to information indicating whether packets allocated to normal data are used for normal data as they are or are used for new mobile data, that is, 1.1 version data.

The 1.1 mobile mode refers to information indicating in which pattern mobile data is placed in packets allocated to normal data. One of the four modes, modes 1 to 4, described above may be expressed by marking one of values "00", "01", "10", and "11" using two bits. Accordingly, the stream may be arranged in various formats as in FIGS. 29, 31, 33, 35, 37, 38, 39, and 40. The receiver identifies the mobile mode information and thus identifies the placement location of the mobile data.

The 1.1 SCCC block mode refers to information indicating a block mode of 1.1 version data. The 1.1 SCCCBM1~SCCCBM5 refer to information indicating a coding unit of 1.1 version data.

Besides the information shown in table 2, a variety of information for allowing the receiver to detect new mobile data appropriately and decode the new mobile data may be additionally provided. The number of bits allocated to each piece of information may be changed when necessary and a location of each field may be arranged in a different order from that of table 2.

FIC information may be used for the digital broadcast receiver, which receives a stream including new mobile data, to recognize whether new mobile data is included or not.

That is, a 1.1 version receiver, which receives and processes new mobile data, should be able to process 1.0 service information and 1.1 service information simultaneously. On the other hand, a 1.0 version receiver should be able to disregard 1.1 service information.

Accordingly, a region for informing the presence/absence of 1.1 version data may be obtained by changing an existing FIC segment syntax.

First, the syntax of the existing FIC segment may be configured as in table 3 below:

TABLE 3

| Syntax | No. of Bits | Format |
|---|---|---|
| FIC_segment_header( ) { FIC_segment_type<br>reserved FIC_chunk_major_protocol_version<br>current_next_indicator error_indicator<br>FIC_segment_num FIC_last_segment_num } | 2 2 2 1 1 4 4 | uimsbf 11'uimsb<br>fbslbfbslbfuims<br>bfuimsbf |

The FIC segment shown in table 3 may be changed to notify the presence/absence of 1.1 version data as in table 4 below:

TABLE 4

| Syntax | No. of Bits | Format |
|---|---|---|
| FIC_segment_header( ) { FIC_segment_type<br>current_next_indicator error_indicator<br>FIC_chunk_major_protocol_version<br>FIC_segment_num FIC_last_segment_num } | 2 1 1 2 5 5 | uimsbfbslbfbslb<br>fuimsbfuimsbfu<br>imsbf |

Referring to FIG. 4, instead of the reserved region, FIC_segment_num and FIC_last_segment_num may be extended to 5 bits.

In table 4, 01 is added to a value of FIC_segment_type so that the presence/absence of 1.1 version data can be informed. That is, if FIC_segement_type is set to 01, a 1.1 version receiver decodes FIC information and processes 1.1 version data. In this case, a 1.0 version receiver is not able to detect FIC information. On the other hand, if FIC_segment_type is defined as 00 or a null segment, the 1.0 version receiver decodes the FIC information and processes existing mobile data.

The presence/absence of 1.1 version data may be informed using some region of a syntax of an FIC chunk, for example, a reserved region, while maintaining the syntax of the FIC chunk without changing an existing FIC syntax.

The FIC may include 16 bits to the maximum when a FIC chunk is configured. The status of the 1.1 version data may be indicated by changing some of the syntaxes of the FIC chunk.

Specifically, "MH 1.1 service_status" may be added to a reserved region of a service ensemble loop as in table 5 below:

TABLE 5

| Syntax | No. of Bits | Format |
|---|---|---|
| FIC_chunk_payload( ){ for(i=0;<br>i<num_ensembles; i++){ ensemble_id<br>reserved ensemble_protocol_version<br>SLT_ensemble_indicator<br>GAT_ensemble_indicator reserved<br>MH_service_signaling_channel_version<br>num_MH services for (j=0;<br>j<num_MH_services; j++){ MH_service_id MH1.l_service_status reserved<br>multi_ensemble_service<br>MH_service_status SP_indicator } }<br>FIC_chunk_stuffing( )} | 8 3 5 1 1 1 5 8 1 6 2 1 2<br>21var | uimsbf 111'uim<br>sbfbslbfbslbf 1'<br>uimsbfuimsbfui<br>msbfuimsbf 1'ui<br>msbfuimsbfbslbf |

Referring to FIG. 5, MH1.1_service_status may be displayed using two of the three bits of the reserved region. MH1.1_service_status may be data indicating whether 1.1 version data exists in a stream or not.

Besides MH1.1_service_status, MH1.1_ensemble_indicator may be added. That is, the syntax of the FIC chunk may be configured as in table 6 below:

TABLE 6

| Syntax | No. of Bits | Format |
|---|---|---|
| FIC_chunk_payload( ){ for(i=0;<br>i<num_ensembles; i++){ ensemble_id<br>MH1.1_ensemble_indicator<br>reserved ensemble_protocol_version<br>SLT_ensemble_indicator<br>GAT_ensemble_indicator reserved<br>MH_service_signaling_channel_version<br>num_MH_services for (j=0;<br>j<num_MH_services; j++) {<br>MH_service_id<br>MH1.1_service_status_extension<br>reserved multi_ensemble_service<br>MH_service_status SP_indicator } }<br>FIC_chunk_stuffing( ) } | 8 1 2 5 1 1 1 5 8 1 6 2 2<br>21var | uimsbfbslbf 11'<br>uimsbfbslbfbslb<br>f 1'uimsbfuimsb<br>fuimsbfuimsbf<br>1'uimsbfuimsbf<br>bslbf |

Referring to FIG. 6, 1 bit of the 3 bits of the first reserved region is allocated to MH1.1_ensemble_indicator. MH1.1_ensemble_indicator refers to information regarding an ensemble, which is a service unit of 1.1 version data. In table 6, MH1.1_service_status_extension may be displayed using 2 bits of the 3 bits of the second reserved region.

If the ensemble protocol version is changed and thus 1.1 version service is provided as in table 7, a 1.1 version is indicated using a value allocated to a 1.0 reserved region:

TABLE 7

| Syntax | No. of Bits | Format |
|---|---|---|
| FIC_chunk_payload( ){ for(i=0; i<num_ensembles; i++){ ensemble_id reserved ensemble_protocol_version SLT_ensemble_indicator GAT_ensemble_indicator reserved MH_service_signaling_channel_version num_MH_services for (j=0; j<num_MH_services; j++){ MH_service_id reserved multi_ensemble_service MH_service_status SP_indicator } } FIC_chunk_stuffing( )} | 8351115816322 1var | uimsbf'111'uim sbfbslbfbslbf'1' uimsbfuimsbfui msbf'111'uimsb fuimsbfbslbf |

Also, signaling data may be transmitted by changing an ensemble loop header extension length from among syntax fields of an FIC chunk head, adding an ensemble extension from among syntax fields of an FIC chunk payload, and adding MH1.1_service_status to a service loop reserved 3 bits from among the syntaxes of the FIC chunk payload as in table 8 below:

TABLE 8

| Syntax | No. of Bits | Format |
|---|---|---|
| FIC_chunk_payload( ){ for(i=0; i<num_ensembles; i++){ ensemble_id reserved ensemble_protocol_version SLT_ensemble_indicator GAT_ensemble_indicator reserved MH_service_signaling_channel_version reserved ensemble extension num_MH_services for (j=0; j<num_MH_services; j++){ MH_service_id MH_service_status_extention reserved reserved multi_ensemble_service MH_service_status SP_indicator } } FIC_chunk_stuffing( )} | 8351115358162 13221var | uimsbf'111'uim sbfbslbfbslbf'1' uimsbfuimsbfui msbfuimsbf'111' uimsbfuimsbfb slbf |

Also, MH_service_loop_extension_length from among the syntax fields of the FIC chunk header may be changed and an information field on MH1.1_service status may be added to a payload field of the FIC chunk:

TABLE 9

| Syntax | No. of Bits | Format |
|---|---|---|
| FIC_chunk_payload( ){ for(i=0; i<num_ensembles; i++){ ensemble_id reserved ensemble_protocol_version SLT_ensemble_indicator GAT_ensemble_indicator reserved MH_service_signaling_channel_version num_MH_services for (j=0; j<num_MH_services; j++){ MH_service_id reserved multi_ensemble_service MH_service_status SP_indicator reserved MH1.1_Detailed_service_Info } } FIC_chunk_stuffing( )} | 8351115816322 153var | uimsbf'111'uim sbfbslbfbslbf'1' uimsbfuimsbfui msbf'111'uimsb fuimsbfbslbfui msbfuimsbf |

As described above, the signaling data may be provided to the receiver using various regions such as the field sync, the TPC information, and the FIC information.

The signaling data may be inserted into a region other than the above-described regions. That is, the signaling data may be inserted into a packet payload portion of existing data. In this case, the presence of 1.1 version data or a location identifying the signaling data is recorded using FIC information as shown in table 5, and 1.1 version signaling data is separately provided, so that a 1.1 version receiver can detect and use corresponding signaling data.

The signaling data may be configured as a separate stream and may be transmitted to the receiver using a separate channel other than a stream transmission channel.

Also, the signaling data may include other information for signaling at least one piece of information such as information indicating whether existing or new mobile data is included or not, a location of mobile data, information indicating whether known data is added or not, a location of added known data, a placing pattern of mobile data and known data, a block mode, and a coding unit, in addition to the above-described various information.

The digital broadcast transmitter, which uses signaling data, may include a data pre-processor to place at least one of mobile data and known data in at least a part of a normal data region from among all packets of a stream, and a multiplexer to generate a transport stream including mobile data and signaling data. A detailed configuration of the data pre-processor may be realized according to one of the above-described exemplary embodiments, and some element may be omitted, added, or modified. In particular, the signaling data is generated by the signaling encoder, the controller, or the separately provided field sync generator, and may be inserted into the transport stream by the multiplexer or the sync multiplexer. In this case, the signaling data may be realized as data for informing at least one piece of information of information regarding whether the mobile data is placed or not and a placing pattern, such as a data field sync or TPC or FIC information as described above.

Also, as described above, if there is the scalable mode 11a besides the scalable mode 11, that is, there are the first to the fifth modes, a mode representing method in the signaling data may be different.

According to an exemplary embodiment, a signaling field in a TPC field may have a name of scalable mode, and four modes as in a) to d) of FIGS. 37 to 40 may be defined as 00, 01, 10, and 11 using two bits. In this case, the fourth mode has the same bit value of 11 regardless of whether the fourth mode is a compatible mode or an incompatible mode. However, the MPEG header and the parity region are used or not according to the two modes and thus a group format may be different according to the two modes.

The receiver identifies a TPC of a slot including an M/H group of an M/H parade to be received and a TPC of the other slots, and, if the scalable mode of all of the slots is 11 and there is no CMM slot, that is, if a normal data rate is 0 Mbps, the receiver determines the bit value of 11 as the scalable mode 11 and decodes accordingly.

On the other hand, if the scalable mode of all of the slots is not 11 or if there is a CMM slot, that is, if the normal data rate is not 0 Mbps, the receiver determines the bit value of 11 as the scalable mode 11a considering compatibility, and decodes accordingly.

According to another exemplary embodiment, the signaling field in the TPC field has a name of scalable mode and three bits may be allocated to that field. Accordingly, five group formats in total including three group formats corresponding to a) to c) of FIGS. 37 to 40, that is, the first to the third modes, and two group formats corresponding to d) of FIGS. 37 to 40, that is, the fourth mode and the fifth mode.

That is, as described above, the entire mode may include:
1) a first mode in which new mobile data is placed in 11 packets from among the 38 packets allocated to normal data;
2) a second mode in which new mobile data is placed in 20 packets from among the 38 packets allocated to normal data;
3) a third mode in which new mobile data is placed in 29 packets from among the 38 packets allocated to normal data;
4) a fourth mode in which new mobile data is placed in all of the 38 packets allocated to normal data; and
5) a fifth mode in which new mobile data is placed in all of the 38 packets allocated to normal data and in a region corresponding to an MPEG header and a parity from among regions allocated to existing mobile data.

The first mode is defined as a scalable mode 000, the second mode is defined as a scalable mode 001, the third mode is defined as a scalable mode 010, the fourth mode in which the 38 packets are filled with mobile data and compatibility should be considered is defined as a scalable mode 011, and the fifth mode in which the 38 packets are filled with mobile data and compatibility is not required to be considered is defined as a scalable mode 111.

Also, in order to define an additional group format, a bit value of the scalable mode may be allocated or a signaling bit may be added.

The digital broadcast transmitter according to various exemplary embodiments described above may place existing mobile data, new mobile data, and normal data in a stream in various ways, and may transmit the data.

For instance, as shown in FIG. 4, the stream configuration unit, that is, the group formatter 130 provided in the data pre-processor 100, may add known data, signaling data, and initialization data to a stream processed by the block processor 120, thereby formatting the data in a unit of a group.

Accordingly, if the packet formatter performs packet formatting, the multiplexer 200 performs multiplexing. In this case, in the first to the third modes, the multiplexer 200 multiplexes the normal data processed by the normal processor 320. On the other hand, in the fourth and the fifth modes, the normal processor 320 does not output normal data and the multiplexer 200 outputs the stream provided by the packet formatter 140 as it is.

[Digital Broadcast Transmitter]

As described above, the digital broadcast transmitter can transmit new mobile data using some or all of the packets allocated to normal data and some or all of the packets allocated to existing mobile data in the existing stream configuration.

The digital broadcast receiver receives at least one of the existing mobile data, the normal data, and the new mobile data according to its own version.

That is, if the digital broadcast receiver is for processing existing normal data and receives the above-described stream of various configurations, the digital broadcast receiver identifies signaling data, and detects and decodes the normal data. If the stream is configured without normal data, the normal data processing receiver is not able to provide a normal data service.

If the receiver is a 1.0 version digital broadcast receiver and receives the above-described stream of the various configurations, the receiver identifies signaling data, and detects and decodes the existing mobile data. If 1.1 version mobile data is placed in the entire region, the 1.0 version digital broadcast receiver is not able to provide a mobile service.

A 1.1 version digital broadcast receiver is able to detect and process 1.0 version data as well as 1.1 version data. In this case, if a decoding block for processing normal data is includes, a normal data service can be supported.

Figure 51:
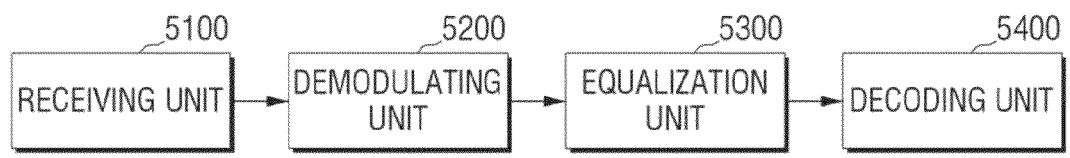
FIGS. 51 to 53 are views illustrating a digital broadcast receiver according to various exemplary embodiments.

FIG. 51 is a block diagram illustrating an example of a digital broadcast receiver according to an exemplary embodiment. The digital broadcast receiver includes elements corresponding to those of the digital broadcast transmitter of FIGS. 2 to 4 and arranged in a reverse order. However, for the convenience of explanation, FIG. 51 illustrates only the elements essential for reception.

That is, referring to FIG. 51, the digital broadcast receiver includes a receiving unit 5100 (e.g., receiver), a demodulator 5200, an equalizer 5300, and a decoding unit 5400 (e.g., decoder).

The receiving unit 5100 receives a transport stream transmitted from the digital broadcast transmitter through an antenna or a cable.

The demodulator 5200 demodulates the transport stream received through the receiving unit 5100. A frequency of a signal and a clock signal received through the receiving unit 5100 are synchronized with the digital broadcast transmitter, when passing through the demodulator 5200.

The equalizer 5300 equalizes the demodulated transport stream.

The demodulator 5200 and the equalizer 5300 may perform synchronization and equalization more swiftly using known data included in the transport stream, in particular, known data newly added along with mobile data.

The decoding unit 5400 detects mobile data from the equalized transport stream and decodes the mobile data.

Insertion locations and sizes of the mobile data and the known data may be notified through signaling data included in the transport stream or signaling data received through a separate channel.

The decoding unit 5400 identifies a location of mobile data suitable for the digital broadcast receiver using the signaling data and then detects mobile data from that location and decodes the mobile data.

The decoding unit 5400 may be realized in various ways according to an exemplary embodiment.

That is, the decoding unit 5400 may include two decoders including a trellis decoder and a convolutional decoder. The two decoders exchange decoding reliability information with each other, thereby improving performance. An output from the convolutional decoder may be the same as an input of the RS encoder of the transmitter.

Figure 52:
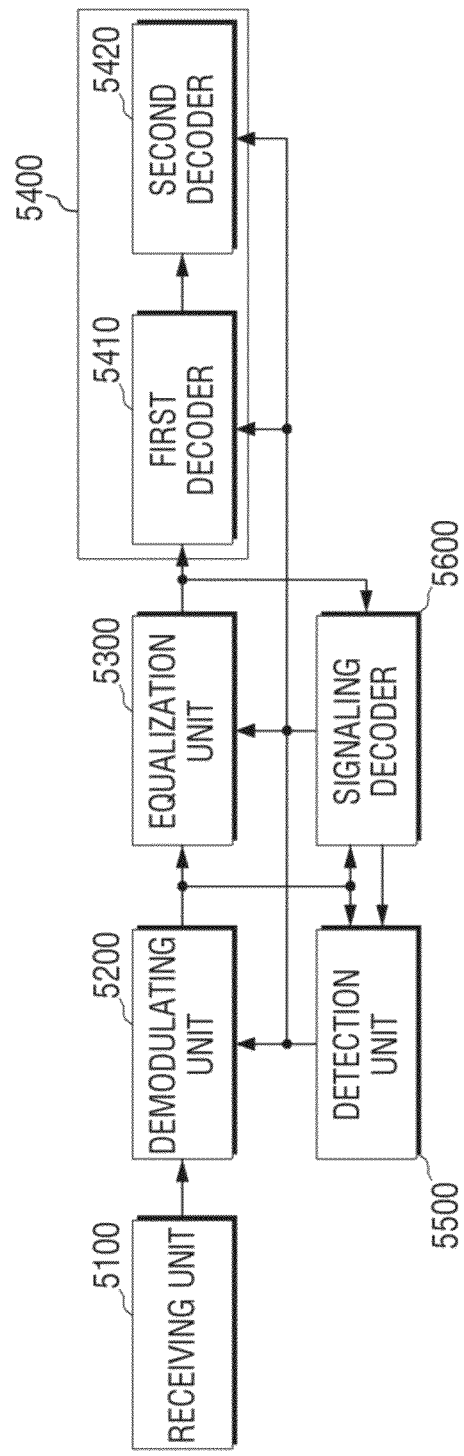

FIG. 52 is a block diagram illustrating, in detail, an example of a digital broadcast receiver according to an exemplary embodiment.

Referring to FIG. 52, the digital broadcast receiver may include a receiving unit 5100 (e.g., receiver), a demodulator 5200, an equalizer 5300, a decoding unit 5400 (e.g., decoder), a detection unit 5500 (e.g., detector), and a signaling decoder 5600.

Functions of the receiving unit 5100, the demodulator 5200, and the equalizer 5300 are the same as or similar to those of FIG. 51 and thus a detailed description thereof is omitted.

The decoding unit 5400 may include a first decoder 5410 and a second decoder 5420.

The first decoder 5410 performs decoding with respect to at least one of existing mobile data and new mobile data. The first decoder 5410 may perform SCCC decoding, which is performed in a unit of a block.

The second decoder 5420 performs RS-decoding with respect to the stream decoded by the first decoder 5410.

The first and the second decoders 5410 and 5420 may process mobile data using an output value of the signaling decoder 5600.

That is, the signaling decoder 5600 detects signaling data from the stream and decodes the signaling data. Specifically, the signaling decoder 5600 de-multiplexes a reserved region, a TPC information region, or an FIC information region of field sync data from the transport stream. Accordingly, the signaling decoder 5600 performs convolutional decoding and RS decoding with respect to the de-multiplexed portion and then performs inverse randomization, thereby recovering signaling data. The recovered signaling data is provided to the elements of the digital broadcast receiver, that is, the demodulator 5200, the equalizer 5300, the decoding unit 5400, and the detection unit 5500. The signaling data may include a variety of information to be used by those elements, that is, block mode information, mode information, known data insertion pattern information and a frame mode. Types and functions of such information have been described above and thus a detailed description is omitted.

Besides the above information, a variety of information such as a coding rate, a data rate, and an insertion location of mobile data, a type of an error correction code used, information of a primary service, information necessary for supporting time slicing, description regarding mobile data, information regarding change of mode information, and information for supporting an IP service may be provided to the receiver in the format of signaling data or additional data.

In FIG. 52, the signaling data is included in the stream. However, if a signaling data signal is transmitted through a separate channel, the signaling decoder 5600 decodes the signaling data signal and provides the above information.

The detection unit 5500 detects known data from the stream using known data insertion pattern information provided by the singling decoder 5600. In this case, known data added along with existing mobile data as well as known data added along with new mobile data may be processed.

Specifically, as shown in FIGS. 22 to 36, the known data may be inserted into at least one of a body region and a head/tail region of the mobile data in various locations and in various formats. Information regarding an insertion pattern of known data, that is, a location, a start point, and length of known data may be included in the signaling data. The detection unit 5500 detects known data from an appropriate location according to the signaling data and may provide the known data to the demodulator 5200, the equalizer 5300, and the decoding unit 5400.

Figure 53:
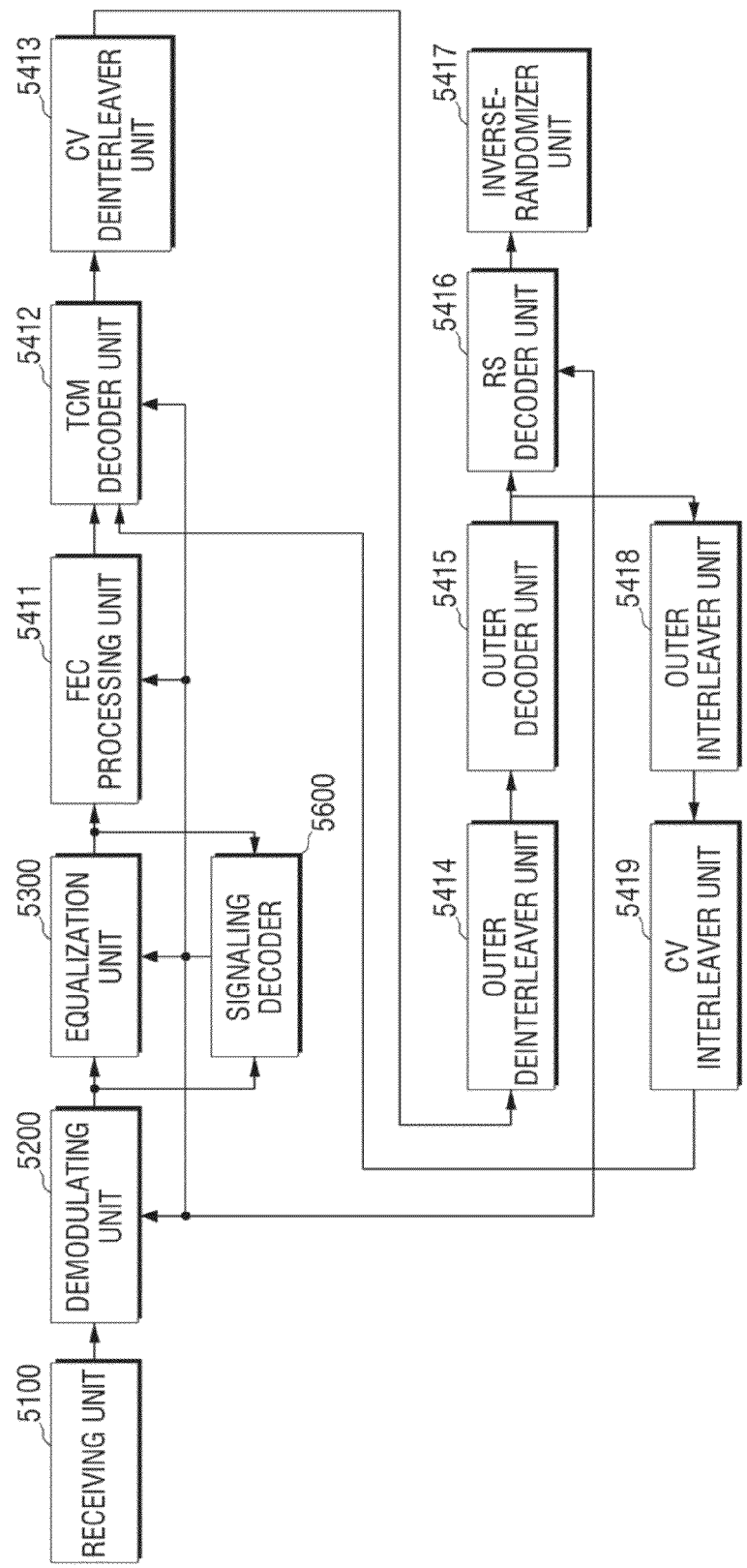

FIG. 53 is a view illustrating, in detail, an example of a digital broadcast receiver according to another exemplary embodiment.

Referring to FIG. 53, the digital broadcast receiver includes a receiving unit 5100 (e.g., receiver), a demodulator 5200, an equalizer 5300, an FEC processor 5411, a TCM decoder unit 5412 (e.g., TCM decoder), a CV de-interleaver unit 5412 (e.g., CV de-interleaver), an outer de-interleaver unit 5414 (e.g., outer de-interleaver), an outer decoder unit 5415 (e.g., outer decoder), an RS decoder unit 5416 (e.g., RS decoder), an inverse randomizer 5417, an outer interleaver unit 5418, a CV interleaver unit 5419 (e.g., CV interleaver), and a signaling decoder 5600.

Since the receiving unit 5100, the demodulator 5200, the equalizer 5300, and the signaling decoder 5600 have been described above with reference to FIG. 52, an overlapped explanation is omitted. Unlike in FIG. 52, the detection unit 5500 is omitted. That is, the elements can directly detect known data using signaling data decoded by the signaling decoder 5600.

The FEC processor 5411 performs forward error correction with respect to the transport stream equalized by the equalizer 5300. The FEC processor 5411 detects known data from the transport stream using information on a location or an insertion pattern of the known data from among the information provided by the signaling decoder and uses the known data in performing the forward error correction. In an exemplary embodiment, an additional reference signal may not be used in the forward error correction.

In FIG. 53, the elements are arranged in a manner so that decoding is performed for mobile data after FEC processing is performed. That is, FEC processing is performed with respect to the entire transport stream. However, only mobile data may be detected from the transport stream and then FEC processing may be performed with respect to only the mobile data.

The TCM decoder unit 5412 detects mobile data from the transport stream output from the FEC processor 5411, and performs trellis decoding with respect to the mobile data. In this case, if the FEC processor has already detected mobile data and has performed forward error correction with respect to only the detected portion, the TCM decoder unit 5412 may perform trellis decoding with respect to the input data directly.

The CV de-interleaver unit 5413 performs convolution de-interleaving with respected to the trellis-decoded data. As described above, since the elements of the digital broadcast receiver correspond to the elements of the digital broadcast transmitter, which configures and processes a transport stream, the CV de-interleaver unit 5413 may not be required according to a configuration of the transmitter.

The outer de-interleaver unit 5414 performs outer de-interleaving with respect to the convolution de-interleaved data. After that, the outer decoder unit 5415 performs decoding and removes a parity from the mobile data.

In some situation, the processes from the TCM decoder unit 5412 to the outer decoder unit 5415 may be repeated one or more times so that reception performance of the mobile data can be improved. To repeat the processes, the decoding data of the outer decoder unit 5415 may be provided to the TCM decoder unit 5412 through the outer interleaver unit 5418 and the CV interleaver unit 5419 as an input of the TCM decoder unit 5412. At this time, the CV interleaver unit 5419 may not be required according to a configuration of the transmitter.

As described above, the trellis decoded data is provided to the RS decoder unit 5416. The RS decoder unit 5416 RS-decodes the data and the inverse randomizer 5417 performs inverse randomization. Through the above-described process, the mobile data, in particular, a stream of 1.1 version data newly defined may be processed.

As described above, if the digital broadcast receiver is a 1.1 version receiver, the receiver may process 1.0 version data besides 1.1 version data.

That is, at least one of the FEC processor 5411 and the TCM decoder unit 5412 may detect entire mobile data except for normal data and may process the detected data.

If the digital broadcast receiver is a common receiver, the receiver may include a block to process normal data, a block to process 1.0 version data, and a block to process 1.1 version data. In this case, a plurality of processing paths are provided at a rear end of the equalizer 5300 and the above-described blocks are placed in the processing paths, respectively. At least one processing path is selected according to control of a controller separately provided so that appropriate data is included in the transport stream.

Also, as described above, mobile data may be placed in the transport stream in a different pattern according to a slot. That is, various slots, such as a slot of a first type including normal data as it is, a slot of a second type including new mobile data in an entire normal data region, a slot of a third type including new mobile data in a part of the normal data region, and a slot of a fourth type including new mobile data in a normal data region and an entire existing mobile region, may be repeated according to a predetermined pattern.

The signaling decoder 5600 decodes the signaling data and notifies frame mode information or mode information to each of the elements. Accordingly, each of the elements, in particular, the FEC processor 5411 or the TCM decoder unit 5412 detects mobile data from a defined location of each slot and processes the mobile data.

FIGS. 51 to 53 do not illustrate a controller, but a controller to apply an appropriate control signal to each block using the signaling data decoded by the signaling decoder 5600 may be further included. Such a controller may control a tuning operation of the receiving unit 5100 according to user's selection.

If the digital broadcast receiver is a 1.1 version receiver, the receiver may provide 1.0 version data or 1.1 version data selectively according to user's selection. Also, if a plurality of 1.1 version data are provided, the receiver may provide one of services according to user's selection.

In particular, as in the first to the fourth modes (wherein the first to the fourth modes may be a compatible mode or only the fourth mode may be an incompatible mode) or the first to the fifth modes, at least one of normal data, existing mobile data, and new mobile data may be placed in the stream and may be transmitted.

In this case, the digital broadcast receiver detects data from an appropriate location according to a mode, and applies an appropriate decoding method and performs decoding.

Specifically, in an exemplary embodiment in which a mode is represented by two bits and a TPC signaling field recorded as 00, 01, 10, and 11 is recovered, if a value of 11 is identified from the signaling data, the digital broadcast receiver identifies TPCs of all of the slots including a slot including an M/H group of an M/H parade to be received. Accordingly, if mode information of all of the slots is 11 and there is no CMM slot, it is determined that the fourth mode is an incompatible mode. Accordingly, the digital broadcast receiver may decode an MPEG header and a parity region in which new mobile data is placed, for example, the above-described SB5 region, in the same way as in the remaining body region stream. On the other hand, if the scalable mode of all of the slots is not 11 or if there is a CMM slot, the receiver determines that a set mode is a compatible mode, that is, the scalable mode 11a and may decode the MPEG header and the parity region, that is, the SB5 region in a different way from that of the remaining body region stream, that is, in a decoding way corresponding to a coding way of new mobile data. The TPC of each slot and the mode may be identified by the signaling decoder or a separately provided controller.

In an exemplary embodiment in which the mode is represented by three bits and signaling bits such as 000, 001, 010, 011, and 111 are transmitted, the digital broadcast receiver identifies a mode according to a bit value and performs appropriate decoding.

The digital broadcast transmitter combines normal data, existing mobile data, and new mobile data, thereby configuring a transport stream, and transmits the transport stream Accordingly, the digital broadcast receiver which receives and processes the transport stream may be realized in various forms. That is, the digital broadcast receiver is realized as a normal data receiver to process only normal data, an existing (e.g., related art) mobile data receiver to process only existing mobile data, a new mobile data receiver to process only new mobile data, and a common receiver to process at least two of these data.

If the digital broadcast receiver is the normal data receiver, there is no data to be processed in the fourth or fifth mode without compatibility unlike in the first to the fourth mode with compatibility. Accordingly, the digital broadcast receiver may disregard a transport stream that the digital broadcast receiver cannot recognize and process.

On the other hand, if the digital broadcast receiver is the existing mobile data receiver or the common receiver capable of processing existing mobile data and normal data, the receiver decodes normal data which is included in a slot including only normal packets or included in all or some of the 38 packets in order to process the normal data, and detects existing mobile data included in packets other than the 38 packets and decodes the existing mobile data in order to process the existing mobile data. In particular, if the slot includes new mobile data and the block mode is a separate mode as described above, a primary ensemble portion is filled with the existing mobile data and a secondary ensemble portion is filled with the new mobile data, so that it is possible to transmit both the existing mobile data and the new mobile data in a single slot. Accordingly, if the mode is a scalable mode 11, the receiver decodes a body region except for SB5 to process the existing mobile data. On the other hand, if the mode is a scalable mode 11a, SB5 is not filled with new mobile data and thus the receiver decodes the entire body region to process the existing mobile data. If the block mode is a paired mode, the entire block is filled with only 1.1 mobile data and thus the receiver disregards a corresponding slot to process existing mobile data.

If the digital broadcast receiver is the new mobile data receiver or the common receiver capable of processing new mobile data and other data altogether, the receiver performs decoding according to a block mode and a mode. That is, if the block mode is a separate mode and the mode is a scalable mode 11, an independent block of the SB5 region and a block allocated to the new mobile data are decoded in a decoding method corresponding to a coding method of the new mobile data, and, if the mode is a scalable mode 11a, the block allocated to the new mobile data is decoded in a decoding method corresponding to a coding method of the new mobile data. On the other hand, if the block mode is a paired mode, all of the blocks are decoded.

In FIGS. 51 to 53, the separate controller or the signaling decoder identifies the block mode and the mode and controls decoding as described above. In particular, if two bits of the signaling data indicate the mode and a bit value of 11 is transmitted, the controller or the signaling decoder identifies TPCs of all of the slots including a slot including an M/H group of an M/H parade to be received. Accordingly, if it is identified that the normal data rate is 0 Mbps, it is determined that the bit value of 11 indicates the scalable mode 11 and decoding is performed. On the other hand, if the scalable mode of all of the slots is not 11 or if there is a CMM slot, that is, if the normal data rate is not 0 Mbps, it is determined that the bit value of 11 indicates the scalable mode 11a and decoding is performed.

The digital broadcast receiver of FIGS. 51 to 53 may be realized by a set-top box or a television. However, the digital broadcast receiver may be realized by various types of portable apparatuses such as a mobile phone, a personal digital assistant (PDA), a multimedia player (e.g., MP3 player), an electronic dictionary, a laptop computer, a tablet device, etc. Also, although not shown in FIGS. 51 to 53, an element to scale or convert decoded data appropriately and output the data on a screen in the form of audio and video data may be included.

A method for configuring a stream of a digital broadcast transmitter and a method for processing a stream of a digital broadcast receiver according to an exemplary embodiment may be described with reference to the above-described block diagrams and stream configuration views.

That is, the method for configuring the stream of the digital broadcast transmitter generally includes placing mobile data in at least some of the packets allocated to normal data from among all packets of a stream, and inserting normal data into a stream in which the mobile data is placed, thereby configuring a transport stream.

The operation of placing the mobile data may be performed by the data pre-processor 100 shown in FIGS. 2 to 4.

The mobile data may be placed in various locations solitarily or along with the normal data and the existing mobile data as described in the above exemplary embodiments. That is, the mobile data and the known data may be placed in various ways as explained in FIGS. 15 to 40.

Also, in the operation of configuring the stream, the transport stream may be configured by multiplexing the normal data, which is processed separately from the mobile data, along with the mobile data.

The transport stream goes through various processes such as RS encoding, interleaving, trellis encoding, sync multiplexing, and modulation, and is then transmitted to the receiver. The operation of processing the transport stream may be performed by the elements of the digital broadcast transmitter shown in FIG. 4.

The various exemplary embodiments of the method for configuring the stream are related to various operations of the digital broadcast transmitter described above. Accordingly, a flow chart of the method for configuring the stream is omitted.

The method for processing the stream of the digital broadcast receiver according to an exemplary embodiment may include receiving a transport stream which is divided into a first region allocated to existing mobile data and a second region allocated to normal data and in which mobile data is placed in at least a part of the second region separately from the existing mobile data, demodulating the received transport stream, equalizing the demodulated transport stream, and decoding at least one of the existing mobile data and the mobile data from the equalized transport stream.

The transport stream received in this method may be a transport stream that has been configured by the digital broadcast transmitter according to various exemplary embodiments and transmitted from the digital broadcast transmitter. That is, in the transport stream, the mobile data may be placed in various ways as shown in FIGS. 15 to 21 and FIGS. 29 to 40. Also, the known data may be placed in various formats as shown in FIGS. 22 to 28.

The various exemplary embodiments of the method for processing the stream are related to the above-described various exemplary embodiments of the digital broadcast receiver.

The configuration examples of the stream illustrated in FIGS. 15 to 40 are not fixed and may be switched to a different configuration according to a situation. That is, the mobile data and the known data may be placed and block-coded by applying various frame modes, modes, and block modes according to a control signal applied by a separate controller provided in the data pre-processor 100 or a control signal input from an external source. Accordingly, a digital broadcast provider is able to provide desired data, in particular, mobile data with various sizes.

Also, the above-described new mobile data, that is, the 1.1 version data may be the same as the existing mobile data, that is, the 1.0 version data or may be different data input from another source. Also, a plurality of 1.1 version data may be included in a single slot and transmitted altogether. Accordingly, a user of the digital broadcast receiver can view data of various formats as he/she wishes to view.

<Block Processing Method>

The above-described exemplary embodiments may be modified variously.

For instance, the block processor 120 of FIG. 4 described above may perform block coding by appropriately combining existing mobile data, normal data, new mobile data, and known data placed in a stream. The new mobile data and the known data may be placed in not only at least a part of a normal data region allocated to the normal data, but also at least a part of an existing mobile data region allocated to the existing mobile data. That is, the normal data, the new mobile data, and the existing mobile data co-exist.

Figure 54:
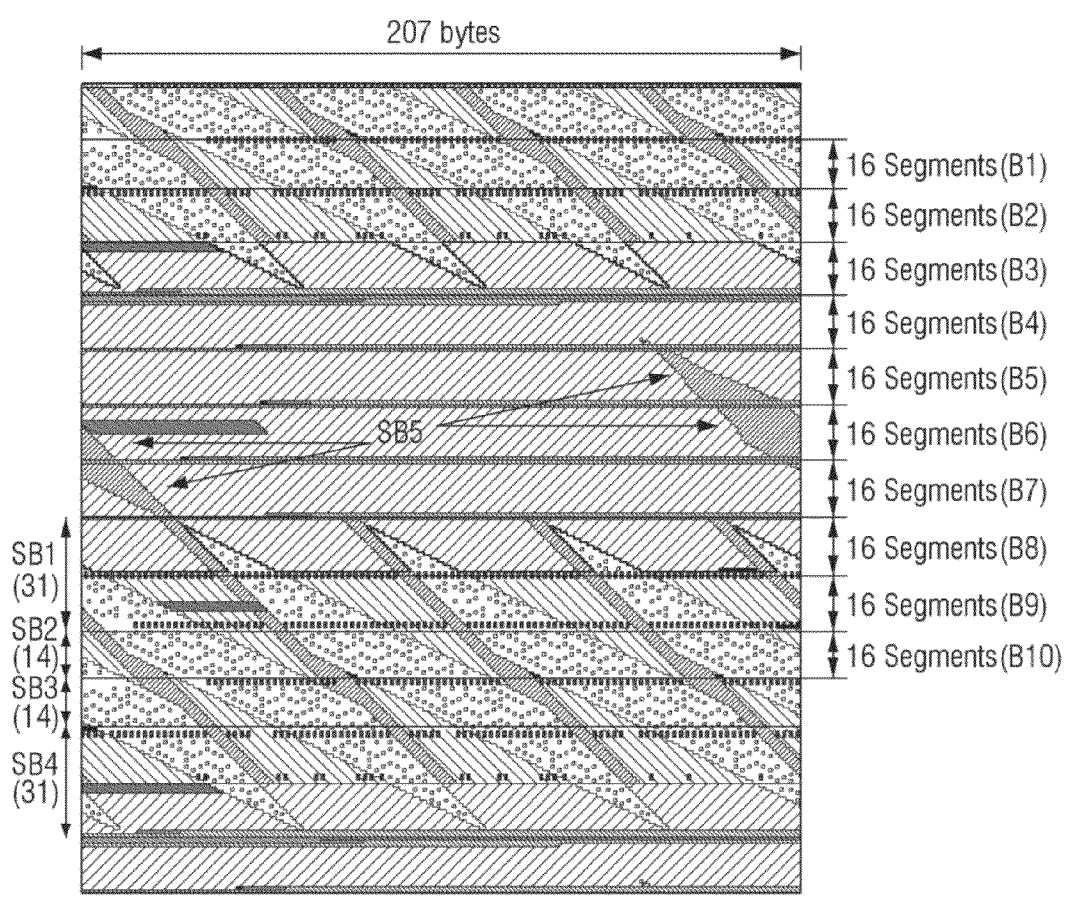
FIG. 54 is a view illustrating an example of a stream format after interleaving according to an exemplary embodiment.

FIG. 54 illustrates an example of a stream format after interleaving. Referring to FIG. 54, a stream including a mobile data group includes 208 data segments. The first five segments correspond to RS parity data and thus are excluded from the mobile data group. Accordingly, the mobile data group of the 203 data segments is divided into 15 mobile data blocks. Specifically, the mobile data group includes blocks B1 to B10 and blocks SB1 to SB5. From among the blocks, blocks B1 to B10 may correspond to the mobile data placed in the existing mobile data region as shown in FIG. 8. On the other hand, blocks SB1 to SB5 may correspond to the new mobile data allocated to the existing normal data regopm. Block SB5 includes an MPEG header and an RS parity for the sake of backward compatibility.

Each of blocks B1 to B10 include 16 segments, each of blocks SB1 and SB4 include 31 segments, and each of blocks SB2 and SB3 includes 14 segments.

These blocks, that is, blocks B1 to B10 and blocks SB1 to SB5 are block-coded by being combined in various formats.

That is, as described above, the block mode may be set to various values such as 00 and 01. The following table shows SCB blocks and a SCCC output block length (SOBL) and a SCCC input block length (SIBL) of each SCB block if the block mode is set to "00":

TABLE 10

| SCCC Block | SOBL | SIBL ½ rate | ¼ rate |
|---|---|---|---|
| SCB1(B1) | 528 | 264 | 132 |
| SCB2(B2) | 1536 | 768 | 384 |
| SCB3(B3) | 2376 | 1188 | 594 |
| SCB4(B4) | 2388 | 1194 | 597 |
| SCB5(B5) | 2772 | 1386 | 693 |
| SCB6(B6) | 2472 | 1236 | 618 |
| SCB7(B7) | 2772 | 1386 | 693 |
| SCB8(B8) | 2508 | 1254 | 627 |
| SCB9(B9) | 1416 | 708 | 354 |
| SCB10(B10) | 480 | 240 | 120 |

Referring to table 10, blocks B1 to B10 become blocks SCB1 to SCB10.

If the block mode is set to "01", each SCB block and an SOBL and an SIBL of each SCB block are as follows:

TABLE 11

| SCCC Block | SOBL | SIBL ½ rate | ¼ rate |
|---|---|---|---|
| SCB1(B1 + B6) | 3000 | 1500 | 750 |
| SCB2(B2 + B7) | 4308 | 2154 | 1077 |
| SCB3(B3 + B8) | 4884 | 2442 | 1221 |
| SCB4(B4 + B9) | 3804 | 1902 | 951 |
| SCB5(B5 + B10) | 3252 | 1626 | 813 |

Referring to table 11, blocks B1 and B6 are combined to configure block SCB1, and blocks B2 and B7, blocks B3 and B8, blocks B4 and B9, and blocks B5 and B10 are combined to configure blocks SCB2, SCB3, SCB4, and SCB5, respectively. Also, the input block length is different according to whether a data rate is a ½ rate or a ¼ rate.

The operation of configuring the SCB block by combining blocks B1 to B10 may be performed if new mobile data is not placed, that is, in the CMM mode.

In an SFCMM mode in which new mobile data is placed, the blocks are differently combined to configure the SCB block. That is, SCCC block coding may be performed by combining the existing mobile data and the new mobile data. Following tables 12 and 13 illustrate an example of blocks differently combined according to an RS frame mode and a slot mode:

TABLE 12

| RS Frame | 00 | | 01 | |
|---|---|---|---|---|
| Mode | 00 | 01 | 00 | 01 |
| SCCC Block Mode | Separate SCCC Block Mode | Paired SCCC Block Mode | Separate SCCC Block Mode | Paired SCCC Block Mode |
| Description SCB | SCB input, M/H Blocks | SCB input, M/H Blocks | SCB input, M/H Blocks | SCB input, M/H Blocks |
| SCB1 | B1 | B1 + B6 + SB3 | B1 | B1 + SB3 + B9 + SB1 |
| SCB2 | B2 | B2 + B7 + SB4 | B2 | B2 + SB4 + B10 + SB2 |
| SCB3 | B3 | B3 + B8 | B9 + SB1 | |
| SCB4 | B4 | B4 + B9 + SB1 | B10 + SB2 | |
| SCB5 | B5 | B5 + B10 + SB2 | SB3 | |
| SCB6 | B6 | | SB4 | |
| SCB7 | B7 | | | |
| SCB8 | B8 | | | |
| SCB9 | B9 + SB1 | | | |
| SCB10 | B10 + SB2 | | | |
| SCB11 | SB3 | | | |
| SCB12 | SB4 | | | |

In table 12, the RS frame mode refers to information indicating whether one slot includes one ensemble (in the case of an RS frame mode 00) or whether one slot includes a plurality of ensembles such as a primary ensemble and a secondary ensemble (in the case of an RS frame 01). Also, the SCCC block mode refers to information indicating whether individual SCCC block processing is performed or whether SCCC block processing is performed by combining a plurality of blocks, like the above-described block mode.

Table 12 indicates a case in which a slot mode is 00. The slot mode is information indicating a criterion based on which a beginning and an end of a slot are distinguished from each other. That is, if the slot mode is 00, a portion including blocks B1 to B10 and blocks SB1 to SB5 for the same slot as they are is defined as one slot, and, if the slot mode is 01, blocks B1 and B2 are sent to a previous slot and blocks B1 and B2 of a subsequent slot are included in a current slot, so that a portion including 15 blocks in total is defined as one slot. The slot mode may have various names according to a version of a standard document. For instance, the slot mode may be called a block extension mode. This will be described below.

Referring to table 12, if the RS frame mode is 00 and the SCCC block mod is 00, blocks B1 to B8 are used as blocks SCB1 to SCB8, respectively, blocks B9 and SB1 are combined to configure block SCB9, blocks B10 and SB2 are combined to configure block SCB10, and blocks SB3 and SB4 are used as blocks SCB11 and SCB12, respectively. On the other hand, if the SCCC block mode is 01, blocks B1, B6, and SB3 are combined and are used as block SCB1, and B2+B7+SB4 are used as block SB2 and B3+B8, B4+B9+SB1, and B5+B10+SB2 are used as blocks SCB3, SCB4, and SCB5, respectively.

On the other hand, if the RS frame is 01 and the SCCC block mode is 00, blocks B1, B2, B9+SB1, B10+SB2, SB3, and SB4 are used as blocks SCB1 to SCB6, respectively. If the SCCC block mode is 01, B1+SB3+B9+SB1 is used as block SCB1 and B2+SB4+B10+SB2 is used as block SCB2.

If the slot mode is 01 and new mobile data is placed according to the first to the third modes described above, the SCCC block may be combined as follows:

TABLE 13

| RS Frame | 00 | | 01 | |
|---|---|---|---|---|
| Mode | 00 | 01 | 00 | 01 |
| SCCC Block Mode Description | Separate SCCC Block Mode | Paired SCCC Block Mode | Separate SCCC Block Mode | Paired SCCC Block Mode |
| SCB | SCB input, M/H Blocks | SCB input, M/H Blocks | SCB input, M/H Blocks | SCB input, M/H Blocks |
| SCB1 | B1 + SB3 | B1 + B6 + SB3 | B1 + SB3 | B1 + SB3 + B9 + SB1 |
| SCB2 | B2 + SB4 | B2 + B7 + SB4 | B2 + SB4 | B2 + SB4 + 10 + SB2 |
| SCB3 | B3 | B3 + B8 | B9 + SB1 | |
| SCB4 | B4 | B4 + B9 + SB1 | B10 + SB2 | |
| SCB5 | B5 | B5 + B10 + SB2 | | |
| SCB6 | B6 | | | |
| SCB7 | B7 | | | |
| SCB8 | B8 | | | |
| SCB9 | B9 + SB1 | | | |
| SCB10 | B10 + SB2 | | | |

Referring to table 13, blocks B1 to B10 and blocks SB1 to SB5 may be combined in various ways according to a setting condition such as an RS frame mode and a SCCC block mode.

If the slot mode is 01 and new mobile data is placed in an entire normal data region according to the above-described fourth mode, SCB blocks may be configured in various combinations as follows:

TABLE 14

| RS Frame | 00 | | 01 | |
|---|---|---|---|---|
| Mode | 00 | 01 | 00 | 01 |
| SCCC Block Mode Description | Separate SCCC Block Mode | Paired SCCC Block Mode | Separate SCCC Block Mode | Paired SCCC Block Mode |
| SCB | SCB input, M/H Blocks | SCB input, M/H Blocks | SCB input, M/H Blocks | SCB input, M/H Blocks |
| SCB1 | B1 + SB3 | B1 + B6 + SB3 + SB5 | B1 + SB3 | B1 + SB3 + B9 + SB1 |
| SCB2 | B2 + SB4 | B2 + B7 + SB4 | B2 + SB4 | B2 + SB4 + B10 + SB2 |
| SCB3 | B3 | B3 + B8 | B9 + SB1 | |
| SCB4 | B4 | B4 + B9 + SB1 | B10 + SB2 | |
| SCB5 | B5 | B5 + 10 + SB2 | | |
| SCB6 | B6 + SB5 | | | |
| SCB7 | B7 | | | |
| SCB8 | B8 | | | |
| SCB9 | B9 + SB1 | | | |
| SCB10 | B10 + SB2 | | | |

As described above, each of the existing mobile data, the normal data, and the new mobile data is divided into blocks and the blocks are combined variously according to a mode, thereby configuring a SCCC block. Accordingly, the SCCC blocks are combined to configure an RS frame.

The combination and coding of the blocks may be performed in the data pre-processor 100 illustrated in the above-described exemplary embodiments. Specifically, the block processor 120 in the data pre-processor 100 combines the blocks and performs block coding. The other processes except for the combining method have been described in the above exemplary embodiments and an overlapped explanation is omitted.

A coding rate for coding the SCCC blocks, that is, an SCCC outer code rate may be determined differently according to an outer code mode. Specifically, the coding rate is defined as follows:

TABLE 15

| SCCC outer code mode | Description |
|---|---|
| 00 | The outer code rate of a SCCC block is ½ rate |
| 01 | The outer code rate of a SCCC block is ¼ rate |

TABLE 15-continued

| SCCC outer code mode | Description |
| --- | --- |
| 10 | The outer code rate of a SCCC block is ⅓ rate |
| 11 | Reserved |

As described in table 15, the SCCC outer code mode may be set to various values such as 00, 01, 10, and 11. If the SCCC outer code mode is 00, the SCCC block is coded at a code rate of ½, if the SCCC outer code mode is 01, the SCCC block is coded at a code rate of ¼, and if the SCCC outer code mode is 10, the SCCC block is coded at a code rate of ⅓. The code rate may be changed variously according to a version of a standard. A newly added code rate may be assigned to the SCCC outer code mode 11. A matching relationship between the SCCC outer code mode and the code rate may be changed. The data pre-processor 100 may code the SCCC block at an appropriate code rate according to a setting condition of the outer code mode. The setting condition of the outer code mode may be notified by the controller 310 or other element or may be identified through a separate signaling channel. The code rate of ⅓ refers to a rate at which 1 bit is input and 3 bits are output, and the encoder may be variously configured. For example, the encoder may be configured in combination of the code rate of ½ and the code rate of ¼. The encoder may be configured by puncturing an output of a 4-state convolution encoder.

[Block Extension Mode: BEM]

As described above, blocks existing in a slot are coded in a different way according to the slot mode or the block extension mode. If the block extension mode is 00, a portion including blocks B1 to B10 and blocks SB1 to SB5 for the same block is defined as one slot as described above, and, if the block extension mode is 01, blocks B1 and B2 are sent to a previous slot and blocks B1 and B2 of a subsequent slot is included in a current slot, so that a portion including 15 blocks in total is defined as one slot.

Group regions may be classified by blocks in the slot. For instance, four blocks B4 to B7 are grouped to group region A, two blocks B3 and B8 are grouped to group region B, two blocks B2 and B9 are grouped to group region C, and two blocks B1 and B10 are grouped to group region D. The four blocks SB1 to SB4, which are generated when the 38 packets, which are a normal data region, are interleaved, may be grouped to group region E.

If a block extension mode of a certain block is 01, group regions A and B including blocks B3 to B8 may be defined as a primary ensemble. Blocks B1 and B2 are sent to a previous slot, and blocks B9 and B10, blocks SB1 to SB4, and blocks B1 and B2 of a subsequent slot are included in group regions C, D, and E, and group regions C, D, and E may be defined as a secondary ensemble. Similar to the primary ensemble, the secondary ensemble is able to fill a head/tail region with long training data of a length corresponding to one data segment, and thus can improve reception performance of the head/tail region up to a level equivalent to that of the body region.

If a block extension mode of a certain slot is 00, the primary ensemble is the same as in the case of BEM 01, but the secondary ensemble is different. The second ensemble may be defined as including blocks B1 and B2 of a current slot, blocks B9 and B10, and blocks SB1 to SB4. Such a secondary ensemble has a saw-toothed head/tail region unlike the primary ensemble and thus is not able to fill the head/tail region with long training data. Thus, the reception performance of the head/tail region is inferior to that of the body region.

Figure 64:
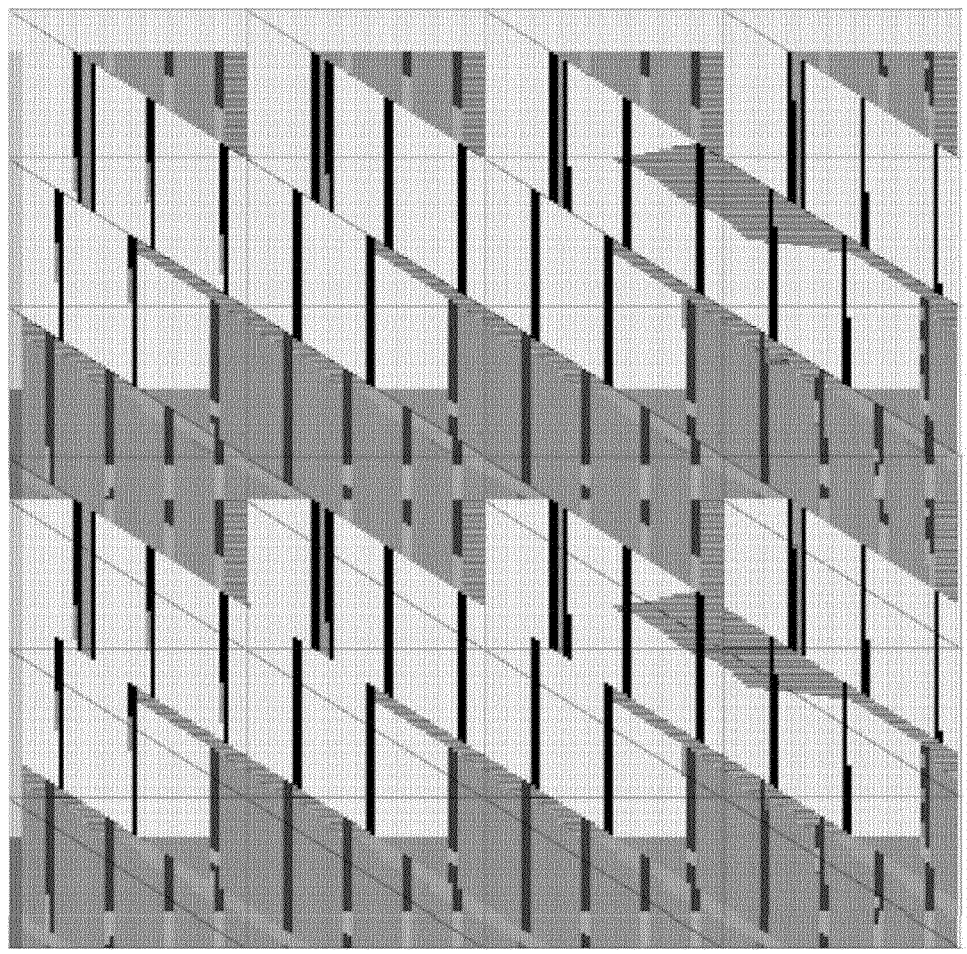
FIG. 64 is a view illustrating a stream configuration before interleaving in a block extension mode 00, according to an exemplary embodiment.
Figure 65:
FIG. 65 is a view illustrating a stream configuration after interleaving in a block extension mode 00, according to an exemplary embodiment.

If two certain slots are adjacent to each other in the BEM 00 mode, a portion where saw-toothed head/tail region of the slots intersect may be filled with long training data. As shown in FIGS. 64 and 65, in a region where the sawteeth of the two adjacent slots of the BEM 00 mode are engaged with each other, segmented training of the slots are connected so that a long training of a length equivalent to one data segment can be generated. In FIGS. 64 and 65, a trellis encoder initialization byte location and a known byte location are displayed.

When an M/H frame is configured according to a service type, a slot filled with new mobile data (SFCMM slot) may be placed near to a slot filled with existing mobile data (SMM slot) or a slot in which 156 packets are filled with normal data only (full main slot). At this time, if the BEM mode of the SFCMM slot is 00, combination is possible even if the CMM slot or the full main slot is placed as an adjacent slot. If a BEM 00 slot from among the 16 slots in the M/H sub-frame is placed in slot #0 and a CMM slot is placed in slot #1, block coding is performed by combining blocks B1 to B10 and blocks SB1 to SB4 in slot #0. Likewise, in slot #1, block coding is performed by combining blocks B1 to B10 in slot #1.

If the BEM mode of the SFCMM slot is 01 and the CMM slot or the full main slot is placed as an adjacent slot, an orphan region should be considered. The orphan region refers to a region that is difficult to use in any slot because a plurality of slots of different types are continuously placed.

For instance, if the BEM 01 slot from among the 16 slots in the M/H sub-frame is placed in slot #0 and the CMM slot is placed in slot #1, blocks B1 and B2 in slot #0 are sent to a previous slot and block coding is performed by including blocks B3 to B10 and blocks SB1 to SB4 and blocks B1 and B2 of a subsequent slot. That is, two slots filled with mobile data 1.0 and mobile data 1.1 which are not compatible to each other should be processed so as not to incur interference therebetween by the block coding method of the BEM 01.

The slot of the BEM 00 and the slot of the BEM 01 may be set so that they cannot be combined and used altogether. On the other hand, in the case of the BEM 01 mode, the CMM mode, the BEM 01 mode, and the full main mode slots may be combined for use. In this case, a region that is difficult to use due to a mode difference may be regarded as an orphan region.

[Orphan Region]

The orphan region to prevent interference between two slots varies according to which slot is adjacent to the slot of the BEM 01 or according to an order of the adjacent slots.

First, if an (i)th slot is a CMM slot and a (i+1)th slot, which is a subsequent slot, is a BEM 01 slot, blocks B1 and B2 existing in a head region of the BEM 01 slot are sent to a previous slot. However, since the CMM slot is not block-coded using blocks B1 and B2 of the subsequent slot, a region of blocks B1 and B2 of the (i+1)th slot is not allocated to any service. This region is defined as orphan type 1. Likewise, if the (i)th slot is a full main slot and the (i+1)th slot, which is a subsequent slot, is a BEM 01 slot, a region of blocks B1 and B2 of the (1+1) slot is not allocated to any service and thus orphan type 1 is also generated.

Second, if the (i)th slot is a BEM 01 slot and the (i+1)th slot, which is a subsequent slot, is a CMM slot, the (i)th BEM 01 slot performs block coding using blocks B1 and B2 of the subsequent slot and thus the subsequent slot is not able to use blocks B1 and B2. That is, the CMM slot, which is the subsequent slot, is set to a dual frame mode and allocates a service to only a primary ensemble and makes a secondary ensemble empty. At this time, block B1 and B2 of the secondary ensemble, which includes blocks B1 and B2 and blocks B9 and B10, are sent to the (i)th slot, which is the previous slot, for use, but a region of blocks B9 and B10 is not allocated to any service. This region is defined as orphan type 2.

Finally, if the (i)th slot is adjacent to a BEM 01 slot and the (i+1)th slot is adjacent to a full main slot, orphan type 3 is generated. If the BEM 01 slot brings a region corresponding to blocks B1 and B2 from the full main slot, which is a subsequent slot, and uses the region, normal data is not transmitted to the 32 upper packets in which a region of blocks B1 and B2 exists from among the 156 subsequent slots. That is, some of the first 32 packets of the subsequent slot correspond to the region of blocks B1 and B2 and is used in the BEM 01 slot, which is the (i)th slot, but the remaining packets which do not correspond to the region of blocks B1 and B2 are not allocated to any service. The remaining region that does not correspond to the region of blocks B1 and B2 from among the first 32 packets of the subsequent slot is distributed over a part of group regions A and B in a group format after interleaving. Accordingly, orphan type 3 is generated in a body region of the subsequent slot.

[Method of Using Orphan]

The orphan region may include new mobile data, training data, or a dummy byte when necessary. If the orphan region is filled with new mobile data, the existence of corresponding data and a type of the data and signaling information for the receiver to recognize and decode may be added.

If the orphan region is filled with training data, a trellis encoder is initialized according to a training sequence to be generated and a known byte is defined so that the receiver can recognize the training sequence.

Table 16 illustrates an example of a location of an orphan if BEM=01 and a using method thereof:

TABLE 16

| Slot(i) | Slot(i + 1) | Loss(bytes) | Orphan Location | Orphan Use |
|---|---|---|---|---|
| CMM | BEM = 01 | 1850 | Slot(i + 1) Head | Training(141/89) |
| BEM = 01 | CMM | 1570 | Slot(i + 1) Tail | Training(195/141) |
| Full Main | BEM = 01 | 1850 | Slot(i + 1) Head | Training(141/89) |
| BEM = 01 | Full Main | 3808 | Slot(i + 1) Part of Region A and B | Dummy |

If BEM=01, the orphan region may be generated as in table 17 below:

TABLE 17

| Orphan Type | Slot(i) | Slot(i + 1) | Loss(bytes) | Orphan Region Location | Orphan Use (Known bytes/ Initialization bytes) |
|---|---|---|---|---|---|
| Type 1 | CMM slot | SFCMM Slot with BEM = 01 | 1618 | Slot(i + 1) Head | Training (210/252) |
| Type 2 | SFCMM Slot with BEM = 01 | CMM slot | 1570 | Slot(i + 1) Tail | Training (195/141) |
| Type 1 | M/H Slot with only Main packets | SFCMM Slot with BEM = 01 | 1618 | Slot(i + 1) Head | Training (210/252) |

TABLE 17-continued

| Orphan Type | Slot(i) | Slot(i + 1) | Loss(bytes) | Orphan Region Location | Orphan Use (Known bytes/ Initialization bytes) |
|---|---|---|---|---|---|
| Type 3 | SFCMM Slot with BEM = 01 | M/H Slot with only Main packets | 3808 | Slot(i + 1) Part of Regions A and B | Dummy |

As shown in table 17 above, the orphan region may be formed in various locations and with various sizes according to types of two consecutive slots. Also, such an orphan region may be used for various purposes such as training data or a dummy. Although tables 16 and 17 do not illustrate an orphan region in which mobile data is used, the mobile data may be used in the orphan region.

If the orphan region is used, the method for processing the stream of the digital broadcast transmitter may include: configuring a stream in which a plurality of slots of different types in which at least one of existing mobile data, normal data, and new mobile data is placed in a different format are continuously arranged; and encoding and interleaving the stream to be output as a transport stream. The operation of transmitting may be performed by the exciter unit 400 of the above-described digital broadcast transmitter.

The operation of configuring the stream may place at least one of the new mobile data, training data, and dummy data in an orphan region to which data is not allocated due to a format difference between the consecutive slots. The method of using the orphan region has been described above.

The orphan region may be of various types as described above.

That is, if a CMM slot and an SFCMM slot of a block extension mode 01 are placed in sequence or if a full main slot including only normal data and an SFCMM slot of a block extension mode 01 are placed in sequence, an orphan region of type 1 may be generated in a head portion of the SFCMM slot.

If an SFCMM slot of a block extension mode 01 and a CMM slot are placed in sequence, an orphan region of type 2 may be generated in a tail portion of the CMM slot.

If an SFCMM slot of a block extension mode 01 and a full main slot including only normal data are placed in sequence, an orphan region of type 3 may be generated in a body portion of the full main slot.

As described above, the CMM slot is a slot in which existing mobile data is placed in a first region allocated to existing mobile data and normal data is placed in a second region allocated to normal data.

The SFCMM slot is a slot in which new mobile data is placed in a part of an entire region including the first region and the second region according to a defined mode.

Figure 58:
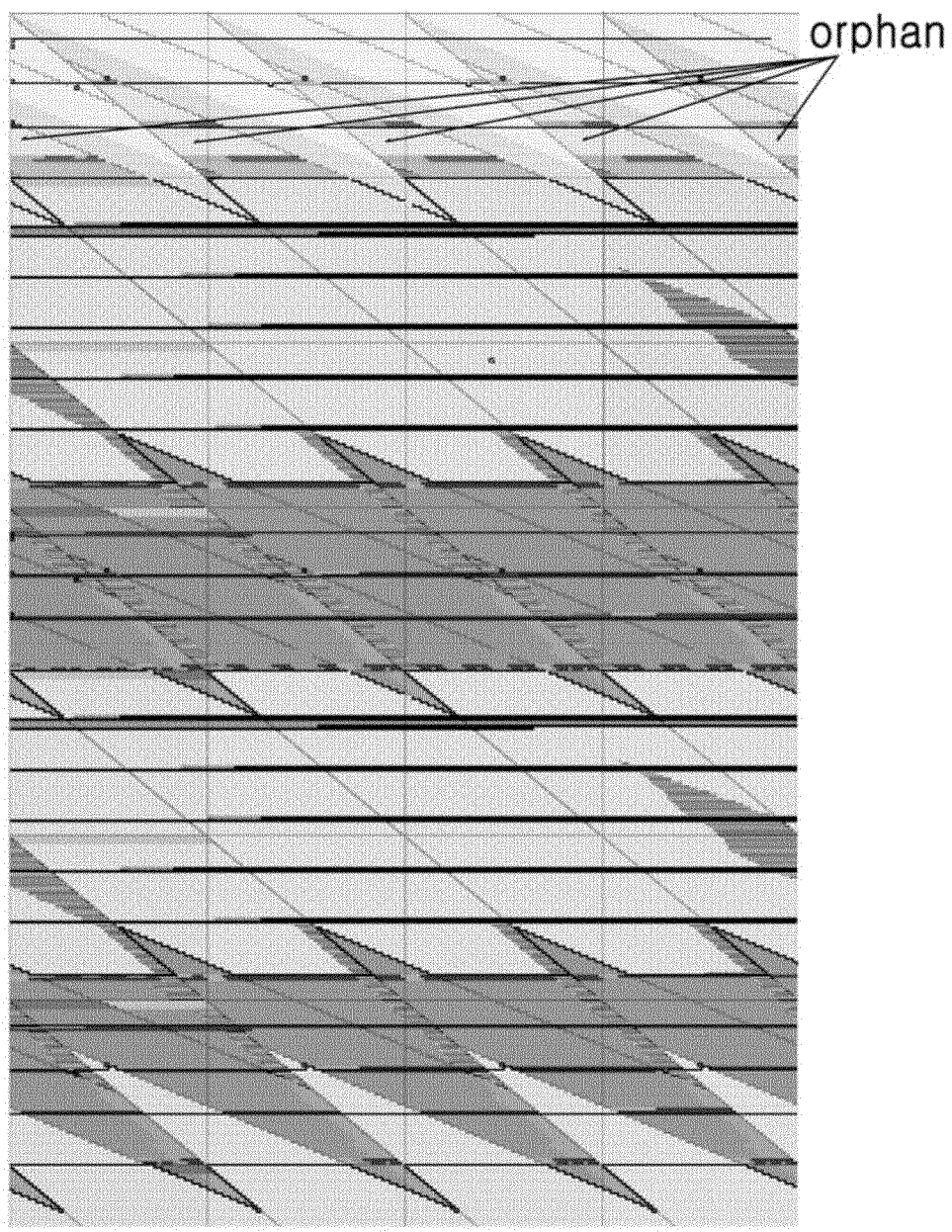
FIG. 58 is a view illustrating a stream configuration indicating a first type orphan region after interleaving, according to an exemplary embodiment.
Figure 59:
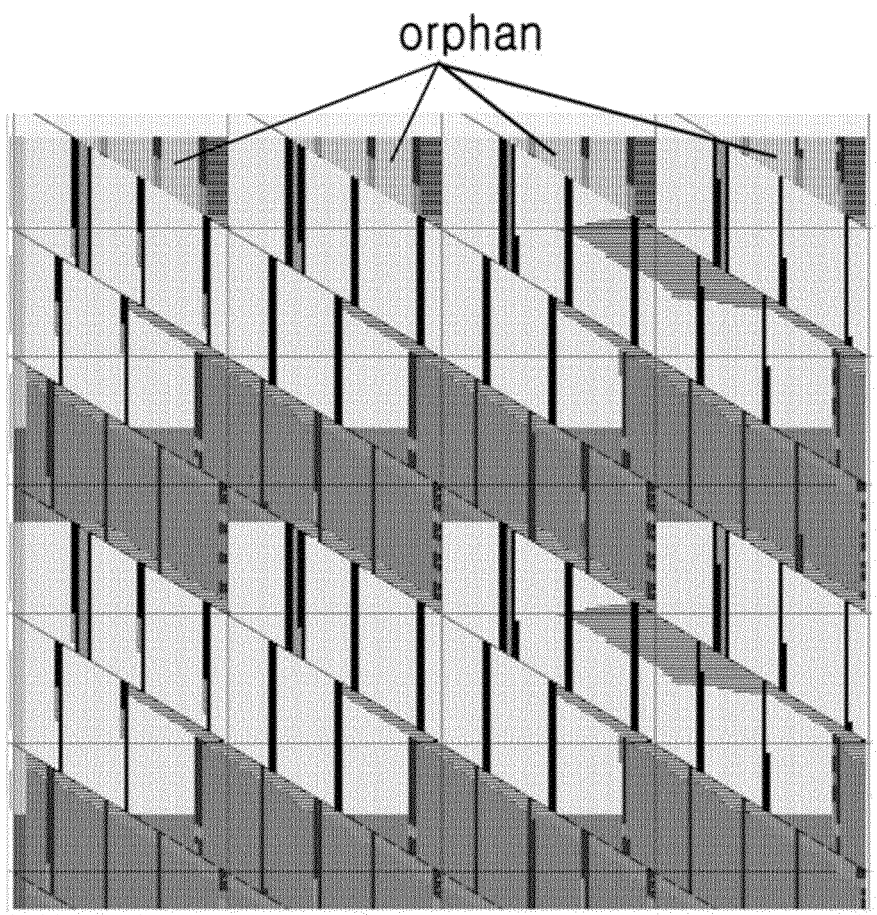
FIG. 59 is a view illustrating a stream configuration indicating a first type orphan region before interleaving, according to an exemplary embodiment.

FIG. 58 illustrates a stream configuration indicating the orphan region of type 1 after interleaving, and FIG. 59 illustrates a stream configuration indicating the orphan region of type 1 before interleaving.

Figure 60:
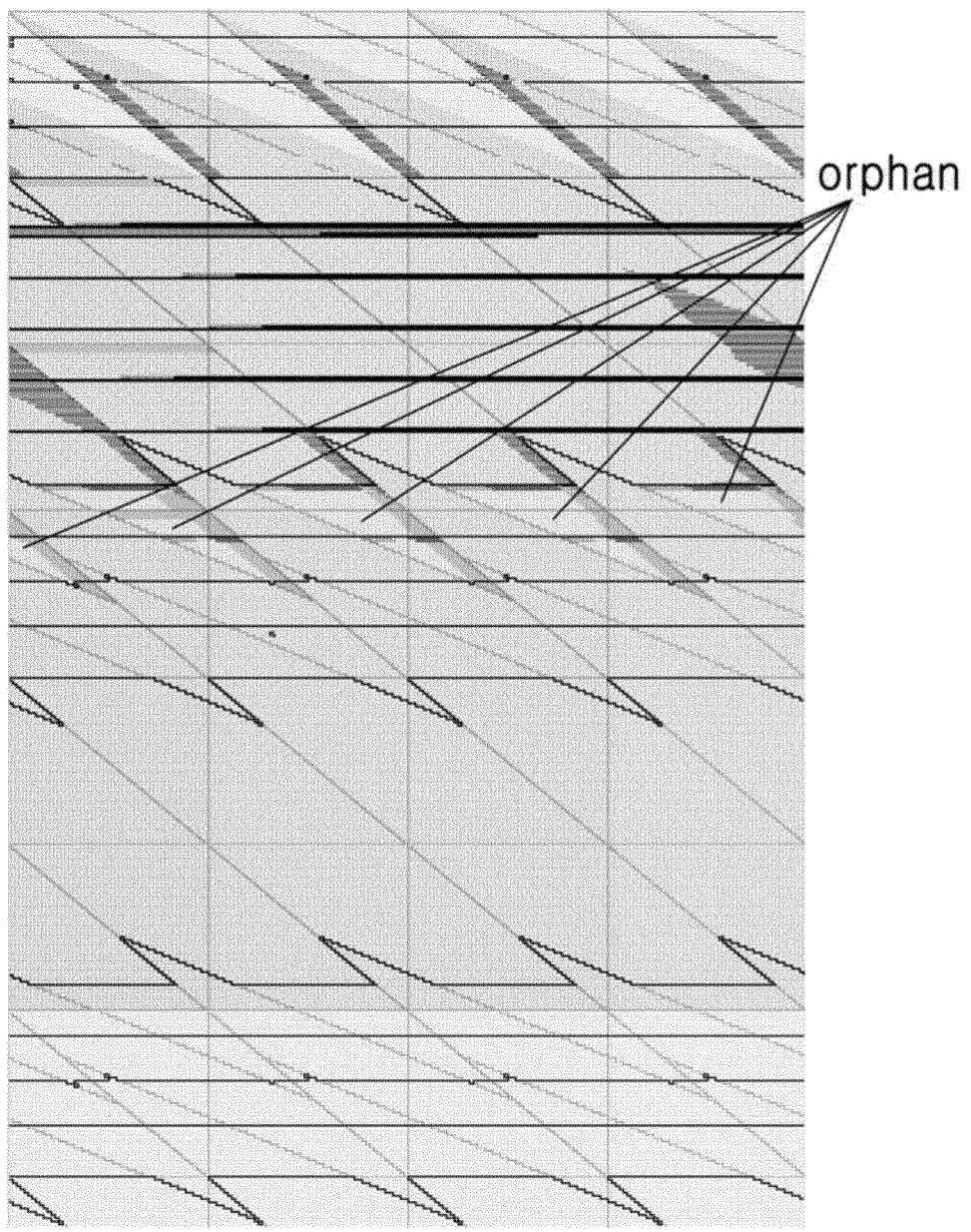
FIG. 60 is a view illustrating a stream configuration indicating a second type orphan region after interleaving, according to an exemplary embodiment.
Figure 61:
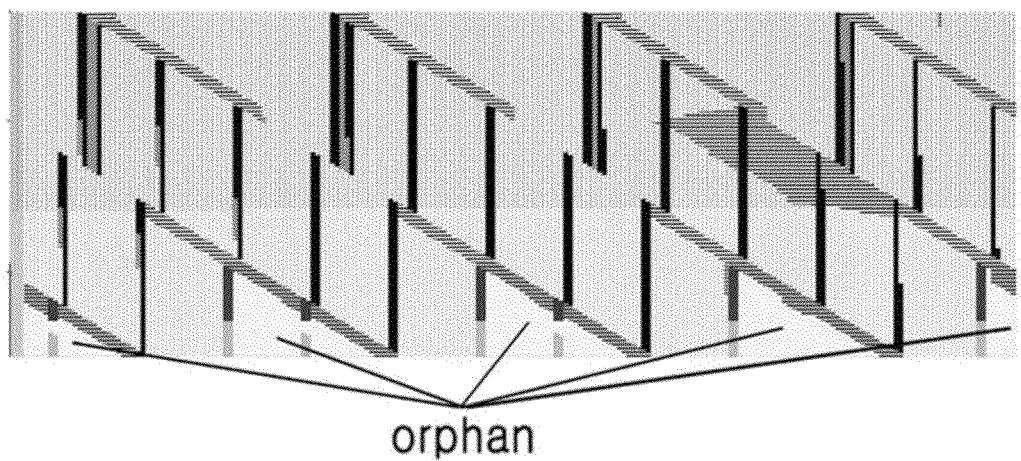
FIG. 61 is a view illustrating a stream configuration indicating a second type orphan region before interleaving, according to an exemplary embodiment.

FIG. 60 illustrates a stream configuration indicating the orphan region of type 2 after interleaving, and FIG. 61 illustrates a stream configuration indicating the orphan region of type 2 before interleaving.

Figure 62:
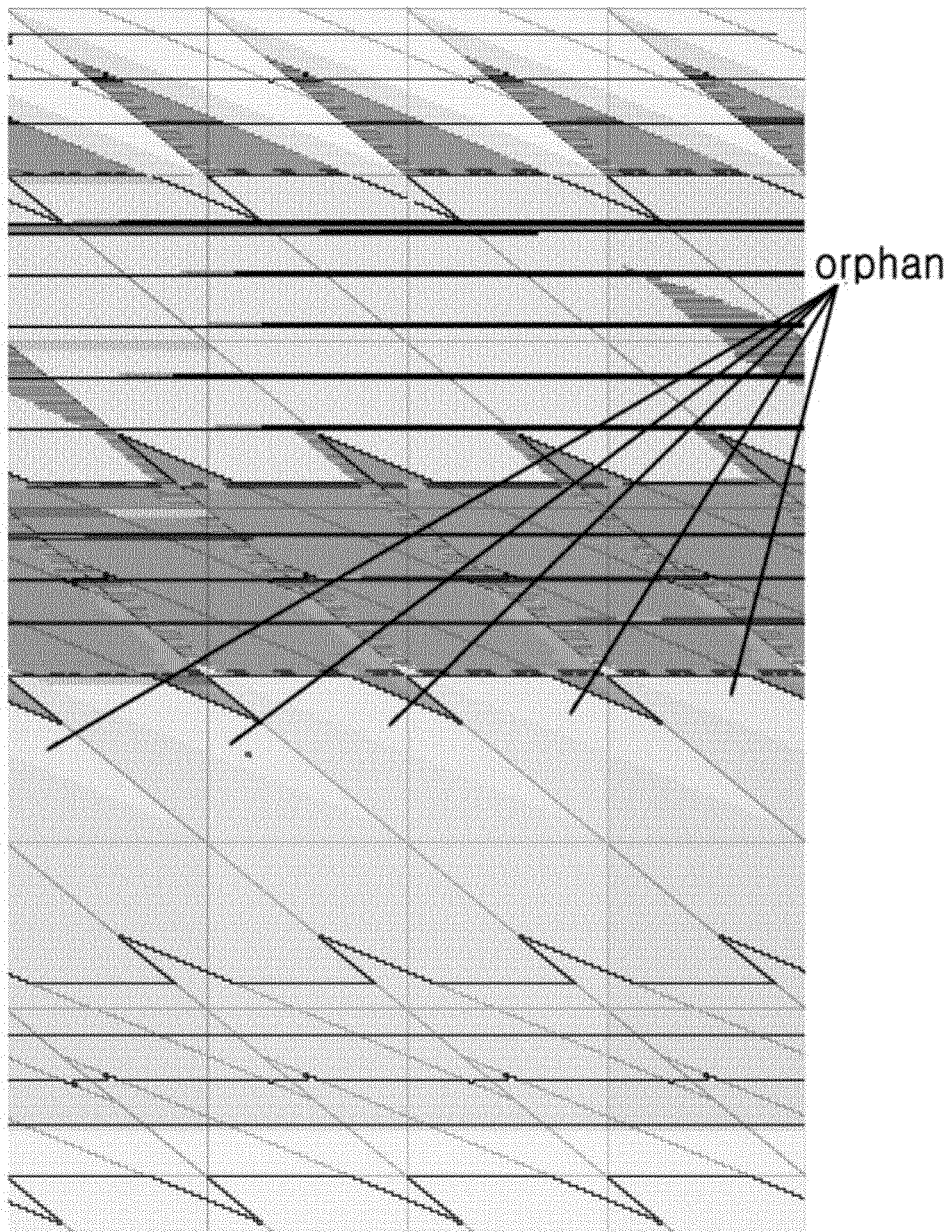
FIG. 62 is a view illustrating a stream configuration indicating a third type orphan region after interleaving, according to an exemplary embodiment.
Figure 63:
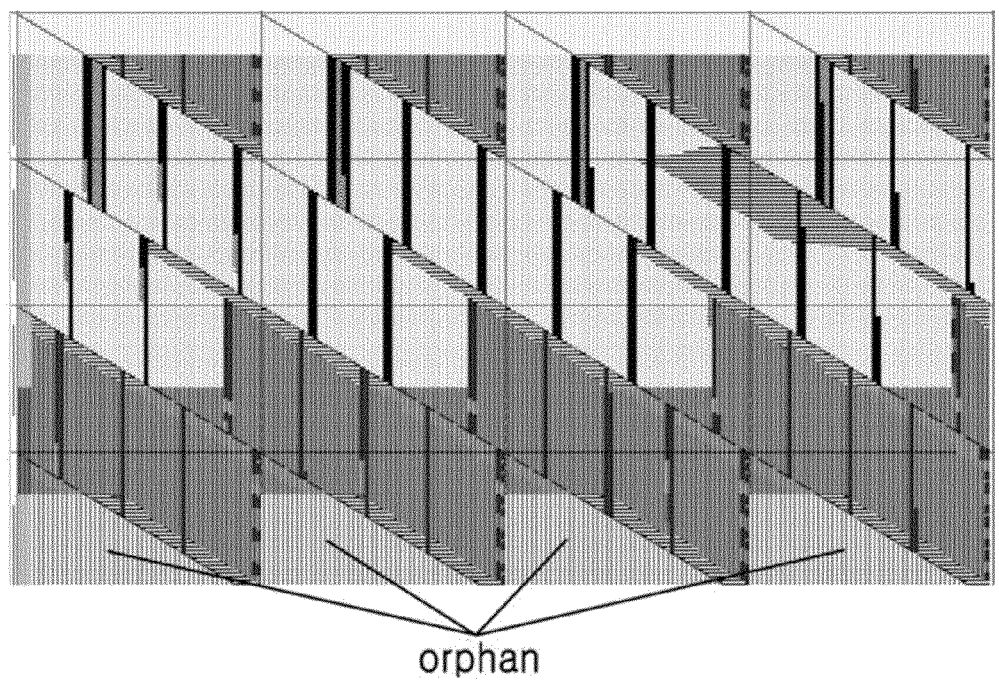
FIG. 63 is a view illustrating a stream configuration indicating a third type orphan region before interleaving, according to an exemplary embodiment.

FIG. 62 illustrates a stream configuration indicating the orphan region of type 3 after interleaving, and FIG. 63 illustrates a stream configuration indicating the orphan region of type 3 before interleaving.

Referring to these drawings, the orphan may be generated in various locations according to a placing pattern of the slot.

The transport stream transmitted from the digital broadcast transmitter is received and processed by the digital broadcast receiver.

That is, the digital broadcast receiver includes a receiving unit to receive a transport stream which is encoded and interleaved with a plurality of slots of different types, in which at least one of existing mobile data, normal data, and new mobile is placed in a different format, being continuously arranged, a demodulator to demodulate the transport stream, an equalizer to equalize the demodulated transport stream, and a decoding unit to decode new mobile data from the equalized stream. The transport stream may include an orphan region to which data is not allocated due to a difference in the format between the consecutive slots, and at least one of the new mobile data, training data, and dummy data may be placed in the orphan region.

The digital broadcast receiver may detect only the data that it can process according to a type of the digital broadcast receiver, that is, according to whether the digital broadcast receiver is a normal data receiver, a CMM-dedicated receiver, a SFCMM-dedicated receiver, or a common receiver.

Also, as described above, the presence/absence of data in the orphan region and a type of the data may be informed using signaling information. That is, the digital broadcast receiver may further include a signaling decoder to decode the signaling information and identify the presence/absence of data in the orphan region and a type of the data.

[Signaling Data]

Information such as the number of added existing or new mobile data packets or the code rate may be transmitted to the receiver as signaling information.

For instance, such signaling information may be transmitted using a reserved region of a TPC. In this case, a certain sub-frame transmits information on a current frame and another sub frame transmits information on a next frame, so that "Signaling in Advance" can be realized. That is, a predetermined TPC parameter and FIC data may be signaled in advance.

Figure 55:
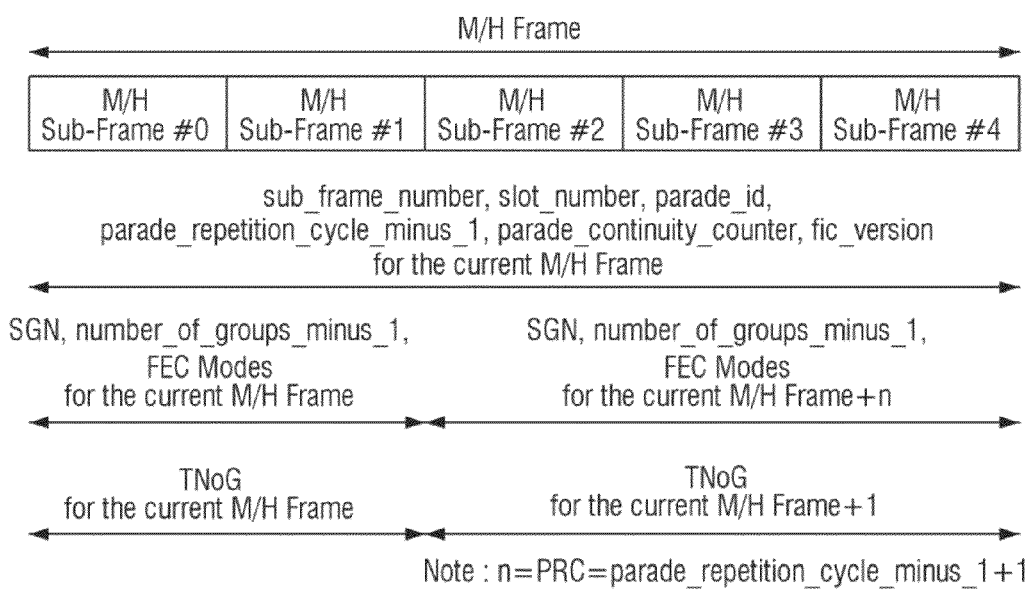
FIG. 55 is a view to explain an example of a method of signaling information of a next frame in advance, according to an exemplary embodiment.

Specifically, as shown in FIG. 55, one M/H frame may be divided into 5 sub-frames. TPS parameters such as sub_frame_number, slot_number, parade_id, parade_repitition_cycle_minus_1, parade_continuity_counter, fic_version, and the added slot mode described above may transmit information on a current frame in the five sub-frames. Also, the TPC parameters such as SGN, number_of_groups_minus_1, FEC modes, TNoG, the number of added existing or new mobile data packets described above, and a code rate may be recorded differently according to the number of the sub-frame. That is, sub-frames #0 and #1 may transmit information on the current frame and sub-frames #2, #3, and #4 may transmit information on the next frame considering a parade repetition cycle (PRC). In the case of TNoG, sub-frames #0 and #1 transmit only the information on the current frame and sub-frames #2, #3, #4 transmit the information on the current frame and the next frame.

Specifically, the TPC information may be configured as in table 18 below:

TABLE 18

| Syntax | No. of Bits | Format |
|---|---|---|
| TPC_data { | | |
|   sub-frame_number | 3 | uimsbf |
|   slot_number | 4 | uimsbf |

TABLE 18-continued

| Syntax | No. of Bits | Format |
|---|---|---|
|   parade_id | 7 | uimsbf |
|   if (sub-frame_number ≤ 1)( | | |
|     current_starting_group_number | 4 | uimsbf |
|     current_number_of_groups_minus_1 } | 3 | uimsbf |
|   if (sub-frame_number ≥ 2){ | | |
|     next_starting_group_number | 4 | uimsbf |
|     next_number_of_groups_minus_1 } | 3 | uimsbf |
|   parade_repitition_cycle_minus_1 | 3 | uimsbf |
|   if(sub-frame_number ≤ 1){ | | |
|     current_rs_frame_mode | 2 | bslbf |
|     current_rs_code_mode_primary | 2 | bslbf |
|     current_rs_code_mode_secondary | 2 | bslbf |
|     current_sccc_block_mode | 2 | bslbf |
|     current_sccc_outer_code_mode_a | 2 | bslbf |
|     current_sccc_outer_code_mode_b | 2 | bslbf |
|     current_sccc_outer_code_mode_c | 2 | bslbf |
|     current_sccc_outer_code_mode_d } | 2 | bslbf |
| if(sub-frame_number ≥ 2){ | | |
|     next_rs_frame_mode | 2 | bslbf |
|     next_rs_code_mode_primary | 2 | bslbf |
|     next_rs_code_mode_secondary | 2 | bslbf |
|     next_sccc_block_mode | 2 | bslbf |
|     next_sccc_outer_code_mode_a | 2 | bslbf |
|     next_sccc_outer_code_mode_b | 2 | bslbf |
|     next_sccc_outer_code_mode_c | 2 | bslbf |
|     next_sccc_outer_code_mode_d } | 2 | bslbf |
|   fic_version | 5 | uimsbf |
|   parade_continuity_counter | 4 | uimsbf |
|   if(sub-frame_number ≤ 1){ | | |
|     current_TNoG | 5 | uimsbf |
|     reserved } | 5 | bslbf |
|   if(sub-frame_number ≥ 2){ | | |
|     next_TNoG | 5 | uimsbf |
|     current_TNoG } | 5 | uimsbf |
|   if(sub-frame_number ≤ 1){ | | |
|     current_sccc_outer_code_mode_e | 2 | bslbf |
|     current_scalable_mode } | 2 | uimsbf |
|   if(sub-frame_number ≥ 2){ | | |
|     next_sccc_outer_code_mode_e | 2 | bslbf |
|     next_scalable_mode } | 2 | uimsbf |
|   slot mode | 2 | uimsbf |
|   reserved | 10 | bslbf |
|   tpc_protocol_version | 5 | bslbf |
| } | | |

As shown in table 18, if the number of the sub-frame is lower than or equal to 1, that is, #0 or #1, a variety of information on the current M/H frame is transmitted, and, if the number of the sub-frame is higher than or equal to 2, that is, #2, #3, and #4, a variety of information on the next M/H frame may be transmitted considering a PRC. Accordingly, the information on the next frame can be known in advance so that a processing speed can be further improved.

The configuration of the receiver may be modified according to the above-described variation of the exemplary embodiment.

That is, the receiver decodes the data that have been block-coded by being combined variously according to the block mode, thereby recovering the existing mobile data, the normal data, and the new mobile data. Also, the signaling information on the next frame is identified in advance, so that processing can be prepared according to the identified information.

Specifically, in the digital broadcast receiver having the configuration shown in FIG. 51, the receiving unit 5100 receives a stream that is configured by performing SCCC coding by combining data placed in an existing mobile data region and new mobile data placed in a normal data region in a unit of a block.

The stream is divided to frames and one frame is divided into a plurality of sub-frames. Some of the sub-frames include signaling information on a current frame and the other sub-frames include signaling information on a next frame considering a PRC. For instance, from among the 5 sub-frames in total, sub-frame #0 and #1 include information on the current frame and sub-frames #2, #3, and #4 includes information on the next frame considering the PRC.

The above-described stream may be a stream that is SCCC-coded by the digital broadcast transmitter at one of rates of ½, ⅓, and ¼.

If the above-described stream is transmitted, the demodulator 5200 demodulates the stream and the equalizer 5300 equalizes the demodulated stream.

The decoding unit 5400 decodes at least one of the existing mobile data and the new mobile data from the equalized stream. In this case, processing for the next frame can be prepared in advance using the frame information included in each sub-frame.

As described above, the digital broadcast receiver can appropriately process the stream transmitted from the digital broadcast transmitter according to various exemplary embodiments. The method for processing the stream of the digital broadcast receiver will not be explained and illustrated.

The configuration of the receiver according to the various exemplary embodiments described above is similar to that of the other exemplary embodiments described above, and thus illustration and explanation thereof are omitted.

FIG. 56 is a view illustrating an M/H group format before data is interleaved in the above-described compatible mode, that is, the scalable mode 11a.

Referring to FIG. 56, the M/H group including mobile data includes 208 data segments. If the M/H group in the M/H slot configured in a unit of 156 packets is distributed over the 156 packets, the 156 packets are distributed over the 208 data segments as a result of interleaving according to an interleaving rule of the interleaver 430.

The mobile data group of the 208 data segments in total is divided into 15 mobile data blocks. Specifically, the mobile data group includes blocks B1 to B10 and blocks SB1 to SB5. Blocks B1 to B10 may correspond to the mobile data placed in the existing mobile data region as shown in FIG. 8. On the other hand, blocks SB1 to SB5 may correspond to the new mobile data allocated to the existing normal data region. Block SB5 is a region including an MPEG header and an RS parity for the sake of backward compatibility.

Each of blocks B1 to B10 may include 16 segments like the existing mobile data region, and block SB4 may include 31 segments and each of blocks SB2 and SB3 may include 14 segments. In block SB1, a length of the segments distributed may vary according to a mode. If normal data is not transmitted through all of the frames, that is, if an entire data rate of 19.4 Mbps is filled with mobile data, block SB1 may include 32 segments. If normal data is transmitted in part, block SB1 may include 31 segments.

Block SB5 is a region in which an MPEG header and an RS parity existing in the 51 segments of a body region are distributed. If normal data is not transmitted through all of the frames, that is, if the entire data rate of 19.4 Mbps is filled with mobile data, block SB5 may be defined as being filled with mobile data. This corresponds to the above-described incompatible mode. If all data is allocated as mobile data and thus compatibility does not need to be considered, the region in which the MPEG header and the RS parity, which exist for the sake of compatibility with an existing normal data receiver, are distributed may be re-defined as mobile data.

As described above, these blocks, that is, blocks B1 to B10 and blocks SB1 to SB5 may be block-coded by being combined in various formats.

That is, if the SCCC block mode is 00 (a separate block), the SCCC outer code mode may be differently applied according to group regions A, B, C, and D. On the other hand, if the SCCC block mode is 01 (a paired block), the SCCC outer code mode of all of the regions should be the same. For instance, blocks SB1 and SB4, which are newly added mobile data blocks, adopt the SCCC outer coder mode set for group region C, and blocks SB2 and SB3 adopt the SCCC outer code mode set for group region C. Finally, block SB5 adopt the SCCC outer code mode set for group region A.

In particular, block SB 5 is generated if a service is performed with only mobile data. In this case, considering compatibility between a receiver for receiving existing mobile data and a receiver for receiving new mobile data additionally, block SB5 may be differently coded.

If the block mode of the slot from which block SB5 is generated is a separate mode, the primary ensemble should be filled with 1.0 mobile data and the secondary ensemble should be filled with 1.1 mobile data, and thus compatibility with the receiver for receiving mobile data should be maintained. Accordingly, block SB5 may be coded independently.

If the block mode of the slot from which block SB5 is generated is a paired mode, the frame is a single frame, which is filled with only 1.1 mobile data and thus compatibility with the existing mobile data receiver does not need to be considered. Accordingly, block SB5 may be coded by being absorbed into a part of the body region.

Specifically, if new mobile data is placed in the entire second region in one slot as in the compatible mode, that is, in the scalable mode 11, block SB5 may be differently coded according to a block mode. if the block mode set for the corresponding slot is a separate mode in which existing mobile data and new mobile data coexist, the block including the MPEG header and the RS parity region, that is, block SB5 may be coded independently from the body region in the corresponding slot. On the other hand, if the block mode is a paired mode in which only new mobile data exists, the block including the MPEG header and the RS parity region, that is, block SB5 may be coded along with the remaining part of the body region. As described above, the block coding may be performed in various ways.

Accordingly, the digital broadcast receiver, which receives the transport stream, identifies the mode according to the signaling data and then detects new mobile data according to the mode and reproduces the new mobile data. That is, if the block mode is a paired mode in the above-described incompatible mode (that is, the fifth mode or scalable mode 11) and new mobile data is transmitted, block SB5 may not be decoded separately and may be decoded along with the mobile data included in the existing body region.

Also, if known data, that is, a training sequence exists as described above, the memories in the trellis encoder should be initialized before the training sequence is trellis-encoded. In this case, a region for initializing the memory, that is, an initialization byte should be placed before the training sequence.

FIG. 56 illustrates a stream configuration after interleaving. Referring to FIG. 56, the training sequence appears in the body region in the format of a plurality of long training sequences, and appears in the head/tail region in the form of a plurality of long training sequences. Specifically, in the head/tail region, 5 long training sequences in total appear. Unlike in the first and the fifth training sequences, in the second, the third, and the fifth training sequences, the trellis initialization byte does not start from the first byte of each segment and is set to start after a predetermined byte.

Such movement of the location of the trellis initialization byte is not limited to the head/tail region. That is, in some of the plurality of long training sequences included in the body region, the trellis initialization byte may be set to start after a predetermined byte.

[Sizes of PL, SOBL, and SIBL According to Block Mode]

The sizes of a RS frame portion length (PL), a SCCC output block length (SOBL), and a SCCC input block length (SIBL) may be differently realized according to a block mode. The following table indicates a PL of a primary RS frame if the RS frame mode is 00 (that is, a single frame), the SCCC block mode is 00 (that is, a separate block), and the SCCC block extension mode is 01:

TABLE 19

| SCCC Outer Code Mode Combinations | | | | PL | | | | |
|---|---|---|---|---|---|---|---|---|
| For Region A and M/H Block SB5 | For Region B | For Region C, M/H Blocks SB1 and SB4 | For Region D, M/H Blocks SB2 and SB3 | Scalable Mode 00 | Scalable Mode 01 | Scalable Mode 10 | Scalable Mode 11 | Scalable Mode 11a |
| 00 | 00 | 00 | 00 | 10440 | 11094 | 11748 | 13884 | 12444 |
| 00 | 00 | 00 | 10 | 10138 | 10678 | 11216 | 13126 | 11766 |
| 00 | 00 | 00 | 01 | 9987 | 10470 | 10950 | 12747 | 11427 |
| 00 | 00 | 10 | 00 | 9810 | 10360 | 10912 | 12698 | 11522 |
| 00 | 00 | 10 | 10 | 9508 | 9944 | 10380 | 11940 | 10844 |
| 00 | 00 | 10 | 01 | 9357 | 9736 | 10114 | 11561 | 10505 |
| 00 | 00 | 01 | 00 | 9495 | 9993 | 10494 | 12105 | 11061 |
| 00 | 00 | 01 | 10 | 9193 | 9577 | 9962 | 11347 | 10383 |
| 00 | 00 | 01 | 01 | 9042 | 9369 | 9696 | 10968 | 10044 |
| 00 | 10 | 00 | 00 | 9626 | 10280 | 10934 | 13070 | 11630 |
| 00 | 10 | 00 | 10 | 9324 | 9864 | 10402 | 12312 | 10952 |
| 00 | 10 | 00 | 01 | 9173 | 9656 | 10136 | 11933 | 10613 |
| 00 | 10 | 10 | 00 | 8996 | 9546 | 10098 | 11884 | 10708 |
| 00 | 10 | 10 | 10 | 8694 | 9130 | 9566 | 11126 | 10030 |
| 00 | 10 | 10 | 01 | 8543 | 8922 | 9300 | 10747 | 9691 |
| 00 | 10 | 01 | 00 | 8681 | 9179 | 9680 | 11291 | 10247 |
| 00 | 10 | 01 | 10 | 8379 | 8763 | 9148 | 10533 | 9569 |
| 00 | 10 | 01 | 01 | 8228 | 8555 | 8882 | 10154 | 9230 |
| 00 | 01 | 00 | 00 | 9219 | 9873 | 10527 | 12663 | 11223 |
| 00 | 01 | 00 | 10 | 8917 | 9457 | 9995 | 11905 | 10545 |
| 00 | 01 | 00 | 01 | 8766 | 9249 | 9729 | 11526 | 10206 |
| 00 | 01 | 10 | 00 | 8589 | 9139 | 9691 | 11477 | 10301 |
| 00 | 01 | 10 | 10 | 8287 | 8723 | 9159 | 10719 | 9623 |
| 00 | 01 | 10 | 01 | 8136 | 8515 | 8893 | 10340 | 9284 |
| 00 | 01 | 01 | 00 | 8274 | 8772 | 9273 | 10884 | 9840 |
| 00 | 01 | 01 | 10 | 7972 | 8356 | 8741 | 10126 | 9162 |
| 00 | 01 | 01 | 01 | 7821 | 8148 | 8475 | 9747 | 8823 |
| 10 | 00 | 00 | 00 | 8706 | 9360 | 10014 | 12422 | 10710 |
| 10 | 00 | 00 | 10 | 8404 | 8944 | 9482 | 11256 | 10032 |
| 10 | 00 | 00 | 01 | 8253 | 8736 | 9216 | 10877 | 9693 |
| 10 | 00 | 10 | 00 | 8076 | 8626 | 9178 | 10828 | 9788 |
| 10 | 00 | 10 | 10 | 7774 | 8210 | 8646 | 10070 | 9110 |
| 10 | 00 | 10 | 01 | 7623 | 8002 | 8380 | 9691 | 8771 |
| 10 | 00 | 01 | 00 | 7761 | 8259 | 8760 | 10235 | 9327 |
| 10 | 00 | 01 | 10 | 7459 | 7843 | 8228 | 9477 | 8649 |
| 10 | 00 | 01 | 01 | 7308 | 7635 | 7962 | 9098 | 8310 |
| 10 | 10 | 00 | 00 | 7892 | 8546 | 9200 | 11200 | 9896 |
| 10 | 10 | 00 | 10 | 7590 | 8130 | 8668 | 10442 | 9218 |
| 10 | 10 | 00 | 01 | 7439 | 7922 | 8402 | 10063 | 8879 |
| 10 | 10 | 10 | 00 | 7262 | 7812 | 8364 | 10014 | 8974 |
| 10 | 10 | 10 | 10 | 6960 | 7396 | 7832 | 9256 | 8296 |
| 10 | 10 | 10 | 01 | 6809 | 7188 | 7566 | 8877 | 7957 |
| 10 | 10 | 01 | 00 | 6947 | 7445 | 7946 | 9421 | 8513 |
| 10 | 10 | 01 | 10 | 6645 | 7029 | 7414 | 8663 | 7835 |
| 10 | 10 | 01 | 01 | 6494 | 6821 | 7148 | 8284 | 7496 |
| 10 | 01 | 00 | 00 | 7485 | 8139 | 8793 | 10793 | 9489 |
| 10 | 01 | 00 | 10 | 7183 | 7723 | 8261 | 10035 | 8811 |
| 10 | 01 | 00 | 01 | 7032 | 7515 | 7995 | 9656 | 8472 |
| 10 | 01 | 10 | 00 | 6855 | 7405 | 7957 | 9607 | 8567 |
| 10 | 01 | 10 | 10 | 6553 | 6989 | 7425 | 8849 | 7889 |
| 10 | 01 | 10 | 01 | 6402 | 6781 | 7159 | 8470 | 7550 |
| 10 | 01 | 01 | 00 | 6540 | 7038 | 7539 | 9014 | 8106 |
| 10 | 01 | 01 | 10 | 6238 | 6622 | 7007 | 8256 | 7428 |
| 10 | 01 | 01 | 01 | 6087 | 6414 | 6741 | 7877 | 7089 |
| 01 | 00 | 00 | 00 | 7839 | 8493 | 9147 | 11079 | 9843 |
| 01 | 00 | 00 | 10 | 7537 | 8077 | 8615 | 10321 | 9165 |
| 01 | 00 | 00 | 01 | 7386 | 7869 | 8349 | 9942 | 8826 |
| 01 | 00 | 10 | 00 | 7209 | 7759 | 8311 | 9893 | 8921 |
| 01 | 00 | 10 | 10 | 6907 | 7343 | 7779 | 9135 | 8243 |
| 01 | 00 | 10 | 01 | 6756 | 7135 | 7513 | 8756 | 7904 |
| 01 | 00 | 01 | 00 | 6894 | 7392 | 7893 | 9300 | 8460 |

TABLE 19-continued

SCCC Outer Code Mode Combinations

| For Region A and M/H Block SB5 | For Region B | For Region C, M/H Blocks SB1 and SB4 | For Region D, M/H Blocks SB2 and SB3 | PL Scalable Mode 00 | Scalable Mode 01 | Scalable Mode 10 | Scalable Mode 11 | Scalable Mode 11a |
|---|---|---|---|---|---|---|---|---|
| 01 | 00 | 01 | 10 | 6592 | 6976 | 7361 | 8542 | 7782 |
| 01 | 00 | 01 | 01 | 6441 | 6768 | 7095 | 8163 | 7443 |
| 01 | 10 | 00 | 00 | 7025 | 7679 | 8333 | 10265 | 9029 |
| 01 | 10 | 00 | 10 | 6723 | 7263 | 7801 | 9507 | 8351 |
| 01 | 10 | 00 | 01 | 6572 | 7055 | 7535 | 9128 | 8012 |
| 01 | 10 | 10 | 00 | 6395 | 6945 | 7497 | 9079 | 8107 |
| 01 | 10 | 10 | 10 | 6093 | 6529 | 6965 | 8321 | 7429 |
| 01 | 10 | 10 | 01 | 5942 | 6321 | 6699 | 7942 | 7090 |
| 01 | 10 | 01 | 00 | 6080 | 6578 | 7079 | 8486 | 7646 |
| 01 | 10 | 01 | 10 | 5778 | 6162 | 6547 | 7728 | 6968 |
| 01 | 10 | 01 | 01 | 5627 | 5954 | 6281 | 7349 | 6629 |
| 01 | 01 | 00 | 00 | 6618 | 7272 | 7926 | 9858 | 8622 |
| 01 | 01 | 00 | 10 | 6316 | 6856 | 7394 | 9100 | 7944 |
| 01 | 01 | 00 | 01 | 6165 | 6648 | 7128 | 8721 | 7605 |
| 01 | 01 | 10 | 00 | 5988 | 6538 | 7090 | 8672 | 7700 |
| 01 | 01 | 10 | 10 | 5686 | 6122 | 6558 | 7914 | 7022 |
| 01 | 01 | 10 | 01 | 5535 | 5914 | 6292 | 7535 | 6683 |
| 01 | 01 | 01 | 00 | 5673 | 6171 | 6672 | 8079 | 7239 |
| 01 | 01 | 01 | 10 | 5371 | 5755 | 6140 | 7321 | 6561 |
| 01 | 01 | 01 | 01 | 5220 | 5547 | 5874 | 6942 | 6222 |
| Others | | | | Undefined | Undefined | Undefined | Undefined | Undefined |

The following table indicates the PL of the primary RS frame if the RS frame mode is 00 (that is, a single frame), the SCCC block mode is 01 (that is, a paired block), and the SCCC block extension mode is 01:

TABLE 20

| SCCC Outer Code Mode | PL Scalable Mode 00 | Scalable Mode 01 | Scalable Mode 10 | Scalable Mode 11 | Scalable Mode 11a |
|---|---|---|---|---|---|
| 00 | 10440 | 11094 | 11748 | 13884 | 12444 |
| 10 | 6960 | 7396 | 7832 | 9256 | 8296 |
| 01 | 5220 | 5547 | 5874 | 6942 | 6222 |
| Others | Undefined | | | | |

The following table indicates the PL of the secondary RS frame if the RS frame mode is 01 (that is, a dual frame), the SCCC block mode is 00 (that is, a separated block), and the SCCC block extension mode is 01:

TABLE 21

SCCC Outer Code Mode Combinations

| For Region C, M/H Blocks SB1 and SB4 | For Region D, M/H Blocks SB2 and SB3 | For M/H Block SB5 | PL Scalable Mode 00 | Scalable Mode 01 | Scalable Mode 10 | Scalable Mode 11 | Scalable Mode 11a |
|---|---|---|---|---|---|---|---|
| 00 | 00 | 00 | 2796 | 3450 | 4104 | 6240 | 4800 |
| 00 | 10 | 00 | 2494 | 3034 | 3572 | 5482 | 4122 |
| 00 | 01 | 00 | 2343 | 2826 | 3306 | 5103 | 3783 |
| 10 | 00 | 00 | 2166 | 2716 | 3268 | 5054 | 3878 |
| 10 | 10 | 00 | 1864 | 2300 | 2736 | 4296 | 3200 |
| 10 | 01 | 00 | 1713 | 2092 | 2470 | 3917 | 2861 |
| 01 | 00 | 00 | 1851 | 2349 | 2850 | 4461 | 3417 |
| 01 | 10 | 00 | 1549 | 1933 | 2318 | 3703 | 2739 |
| 01 | 01 | 00 | 1398 | 1725 | 2052 | 3324 | 2400 |
| 00 | 00 | 01 | 2796 | 3450 | 4104 | 6036 | 4800 |
| 00 | 10 | 01 | 2494 | 3034 | 3572 | 5278 | 4122 |
| 00 | 01 | 01 | 2343 | 2826 | 3306 | 4899 | 3783 |
| 10 | 00 | 01 | 2166 | 2716 | 3268 | 4850 | 3878 |
| 10 | 10 | 01 | 1864 | 2300 | 2736 | 4092 | 3200 |
| 10 | 01 | 01 | 1713 | 2092 | 2470 | 3713 | 2861 |
| 01 | 00 | 01 | 1851 | 2349 | 2850 | 4257 | 3417 |
| 01 | 10 | 01 | 1549 | 1933 | 2318 | 3499 | 2739 |
| 01 | 01 | 01 | 1398 | 1725 | 2052 | 3120 | 2400 |
| Others | | | Undefined | Undefined | Undefined | Undefined | Undefined |

Also, the following table indicates the SOBL and the SIBL if the SCCC block mode is 00 (that is, a separated block), the RS frame mode is 00 (that is, a single frame), and the SCCC block extension mode is 01:

TABLE 22

| | SOBL | | | | | SIBL | | | | |
|---|---|---|---|---|---|---|---|---|---|---|
| SCCC Block | Scalable Mode 00 | Scalable Mode 01 | Scalable Mode 10 | Scalable Mode 11 | Scalable Mode 11a | Scalable Mode 00 | Scalable Mode 01 | Scalable Mode 10 | Scalable Mode 11 | Scalable Mode 11a |
| ½ rate | | | | | | | | | | |
| SCB1 (B1 + SB3) | 888 | 1212 | 1536 | 2280 | 1932 | 444 | 606 | 768 | 1140 | 966 |
| SCB2 (B2 + SB4) | 1872 | 2160 | 2412 | 3432 | 2568 | 936 | 1080 | 1206 | 1716 | 1284 |
| SCB3 (B3) | 2376 | 2376 | 2376 | 2376 | 2376 | 1188 | 1188 | 1188 | 1188 | 1188 |
| SCB4 (B4) | 2388 | 2388 | 2388 | 2388 | 2388 | 1194 | 1194 | 1194 | 1194 | 1194 |
| SCB5 (B5) | 2772 | 2772 | 2772 | 2772 | 2772 | 1386 | 1386 | 1386 | 1386 | 1386 |
| SCB6 (B6) | 2472 | 2472 | 2472 | 2472 | 2472 | 1236 | 1236 | 1236 | 1236 | 1236 |
| SCB7 (B7) | 2772 | 2772 | 2772 | 2772 | 2772 | 1386 | 1386 | 1386 | 1386 | 1386 |
| SCB8 (B8) | 2508 | 2508 | 2508 | 2508 | 2508 | 1254 | 1254 | 1254 | 1254 | 1254 |
| SCB9 (B9 + SB1) | 1908 | 2244 | 2604 | 3684 | 2964 | 954 | 1122 | 1302 | 1842 | 1482 |
| SCB10 (B10 + SB2) | 924 | 1284 | 1656 | 2268 | 2136 | 462 | 642 | 828 | 1134 | 1068 |
| SCB11 (SB5) | 0 | 0 | 0 | 816 | 0 | 0 | 0 | 0 | 408 | 0 |
| ⅓ rate | | | | | | | | | | |
| SCB1 (B1 + SB3) | 888 | 1212 | 1536 | 2280 | 1932 | 296 | 404 | 512 | 760 | 644 |
| SCB2 (B2 + SB4) | 1872 | 2160 | 2412 | 3432 | 2568 | 624 | 720 | 804 | 1144 | 856 |
| SCB3 (B3) | 2376 | 2376 | 2376 | 2376 | 2376 | 792 | 792 | 792 | 792 | 792 |
| SCB4 (B4) | 2388 | 2388 | 2388 | 2388 | 2388 | 796 | 796 | 796 | 796 | 796 |
| SCB5 (B5) | 2772 | 2772 | 2772 | 2772 | 2772 | 924 | 924 | 924 | 924 | 924 |
| SCB6 (B6) | 2472 | 2472 | 2472 | 2472 | 2472 | 824 | 824 | 824 | 824 | 824 |
| SCB7 (B7) | 2772 | 2772 | 2772 | 2772 | 2772 | 924 | 924 | 924 | 924 | 924 |
| SCB8 (B8) | 2508 | 2508 | 2508 | 2508 | 2508 | 836 | 836 | 836 | 836 | 836 |
| SCB9 (B9 + SB1) | 1908 | 2244 | 2604 | 3684 | 2964 | 636 | 748 | 868 | 1228 | 988 |
| SCB10 (B10 + SB2) | 924 | 1284 | 1656 | 2268 | 2136 | 308 | 428 | 552 | 756 | 712 |
| SCB11 (SB5) | 0 | 0 | 0 | 816 | 0 | 0 | 0 | 0 | 272 | 0 |
| ¼ rate | | | | | | | | | | |
| SCB1 (B1 + SB3) | 888 | 1212 | 1536 | 2280 | 1932 | 222 | 303 | 384 | 570 | 483 |
| SCB2 (B2 + SB4) | 1872 | 2160 | 2412 | 3432 | 2568 | 468 | 540 | 603 | 858 | 642 |
| SCB3 (B3) | 2376 | 2376 | 2376 | 2376 | 2376 | 594 | 594 | 594 | 594 | 594 |
| SCB4 (B4) | 2388 | 2388 | 2388 | 2388 | 2388 | 597 | 597 | 597 | 597 | 597 |
| SCB5 (B5) | 2772 | 2772 | 2772 | 2772 | 2772 | 693 | 693 | 693 | 693 | 693 |
| SCB6 (B6) | 2472 | 2472 | 2472 | 2472 | 2472 | 618 | 618 | 618 | 618 | 618 |
| SCB7 (B7) | 2772 | 2772 | 2772 | 2772 | 2772 | 693 | 693 | 693 | 693 | 693 |
| SCB8 (B8) | 2508 | 2508 | 2508 | 2508 | 2508 | 627 | 627 | 627 | 627 | 627 |
| SCB9 (B9 + SB1) | 1908 | 2244 | 2604 | 3684 | 2964 | 477 | 561 | 651 | 921 | 741 |
| SCB10 (B10 + SB2) | 924 | 1284 | 1656 | 2268 | 2136 | 231 | 321 | 414 | 567 | 534 |
| SCB11 (SB5) | 0 | 0 | 0 | 816 | 0 | 0 | 0 | 0 | 204 | 0 |

Also, the following table indicates the SOBL and the SIBL if the SCCC block mode is 01 (that is, a paired block), the RS frame mode is 01 (that is, a dual frame), and the SCCC block extension mode is 01:

TABLE 23

| | SOBL | | | | | SIBL | | | | |
|---|---|---|---|---|---|---|---|---|---|---|
| SCCC Block | Scalable Mode 00 | Scalable Mode 01 | Scalable Mode 10 | Scalable Mode 11 | Scalable Mode 11a | Scalable Mode 00 | Scalable Mode 01 | Scalable Mode 10 | Scalable Mode 11 | Scalable Mode 11a |
| ½ rate | | | | | | | | | | |
| SCB1 (B1 + B6 + SB3) | 3360 | 3684 | 4008 | 4752 | 4404 | 1680 | 1842 | 2004 | 2376 | 2202 |

TABLE 23-continued

| | SOBL | | | | | SIBL | | | | |
|---|---|---|---|---|---|---|---|---|---|---|
| SCCC Block | Scalable Mode 00 | Scalable Mode 01 | Scalable Mode 10 | Scalable Mode 11 | Scalable Mode 11a | Scalable Mode 00 | Scalable Mode 01 | Scalable Mode 10 | Scalable Mode 11 | Scalable Mode 11a |
| SCB2 (B2 + B7 + SB4) | 4644 | 4932 | 5184 | 6204 | 5340 | 2322 | 2466 | 2592 | 3102 | 2670 |
| SCB3 (B3 + B8) | 4884 | 4884 | 4884 | 4884 | 4884 | 2442 | 2442 | 2442 | 2442 | 2442 |
| SCB4 (B4 + B9 + SB1) | 4296 | 4632 | 4992 | 6072 | 5352 | 2148 | 2316 | 2496 | 3036 | 2676 |
| SCB5 (B5 + B10 + SB2) | 3696 | 4056 | 4428 | 5040 | 4908 | 1848 | 2028 | 2214 | 2520 | 2454 |
| SCB6 (SB5) | 0 | 0 | 0 | 816 | 0 | 0 | 0 | 0 | 408 | 0 |
| ⅓ rate | | | | | | | | | | |
| SCB1 (B1 + B6 + SB3) | 3360 | 3684 | 4008 | 4752 | 4404 | 1120 | 1228 | 1336 | 1584 | 1468 |
| SCB2 (B2 + B7 + SB4) | 4644 | 4932 | 5184 | 6204 | 5340 | 1548 | 1644 | 1728 | 2068 | 1780 |
| SCB3 (B3 + B8) | 4884 | 4884 | 4884 | 4884 | 4884 | 1628 | 1628 | 1628 | 1628 | 1628 |
| SCB4 (B4 + B9 + SB1) | 4296 | 4632 | 4992 | 6072 | 5352 | 1432 | 1544 | 1664 | 2024 | 1784 |
| SCB5 (B5 + B10 + SB2) | 3696 | 4056 | 4428 | 5040 | 4908 | 1232 | 1352 | 1476 | 1680 | 1636 |
| SCB6 (SB5) | 0 | 0 | 0 | 816 | 0 | 0 | 0 | 0 | 272 | 0 |
| ¼ rate | | | | | | | | | | |
| SCB1 (B1 + B6 + SB3) | 3360 | 3684 | 4008 | 4752 | 4404 | 840 | 921 | 1002 | 1188 | 1101 |
| SCB2 (B2 + B7 + SB4) | 4644 | 4932 | 5184 | 6204 | 5340 | 1161 | 1233 | 1296 | 1551 | 1335 |
| SCB3 (B3 + B8) | 4884 | 4884 | 4884 | 4884 | 4884 | 1221 | 1221 | 1221 | 1221 | 1221 |
| SCB4 (B4 + B9 + SB1) | 4296 | 4632 | 4992 | 6072 | 5352 | 1074 | 1158 | 1248 | 1518 | 1338 |
| SCB5 (B5 + B10 + SB2) | 3696 | 4056 | 4428 | 5040 | 4908 | 924 | 1014 | 1107 | 1260 | 1227 |
| SCB6 (SB5) | 0 | 0 | 0 | 816 | 0 | 0 | 0 | 0 | 204 | 0 |

As described above, the PL, the SOBL, and the SIBL may have various sizes according to the block mode. The data set forth in the above tables are merely an example and should not be considered as limiting.

[Initialization]

As described above, if known data, that is, training data, is included in the stream, initialization should be performed. That is, in the ATSC-M/H transceiving system, the trellis encoder is initialized according to a training sequence to be generated and then a known byte is defined, so that the receiver can recognize the training sequence.

In the group format of the BEM 00 MODE, a trellis initialization byte is placed on a boundary surface between sawteeth and a known byte is distributed after that. If the trellis encoding is performed in a segment order from the top to the bottom and in a byte order from the left to the right, trellis encoding is performed on a boundary surface between sawteeth filled with data of another slot and thus a trellis encoder memory value cannot be predicted on a boundary surface between sawteeth filled with data of a next slot. Therefore, the trellis encoder should be initialized on every boundary surface of the sawteeth. As shown in FIGS. 56 and 57, the initialization byte may be distributed on each sawtooth boundary of the head region including blocks B1 and B2, and the initialization byte may also be distributed on each sawtooth boundary of the tail region including blocks SB1 to SB4.

If two certain slots are adjacent to each other in the BEM 00 MODE, short training data of each head/tail region is located on the same segment and is continuously connected, thereby serving as one long training. If the two BEM 00 slots are adjacent to each other and training data are concatenated, only the first maximum 12 initialization bytes of the segment in which the training data exists is used as an initialization mode and the initialization byte existing in a region where the sawteeth are engaged with each other may be input like the known byte and may be trellis encoded.

Except for the first maximum 12 initialization bytes of the segment, the intermediate initialization bytes existing in the region where the sawteeth are engaged with each other may be input as a known byte or an initialization byte according to whether the BEM 00 slot is adjacent to the same slot or a different slot. That is, the operation of the trellis encoder may be multiplexed in the normal mode or may be multiplexed in the initialization mode during the intermediate initialization byte. Since the number of symbols generated is different according to the mode in which the trellis encoder multiplexes an input, a symbol value to be used by the receiver as training may be different. In order to minimize confusion of the receiver, with reference to a symbol generated by multiplexing an intermediate initialization byte into a known byte if a long training is configured by two adjacent BEM 00 slots, an intermediate initialization byte value to be used as an initialization mode if the BEM 00 slot is not adjacent to the same slot may be determined. That is, the intermediate initialization byte value may be determined to create the same value as the long training symbol value generated if the slots are concatenated. At this time, the first two symbol values of the intermediate initialization byte may be different from the symbol value generated if the slots are concatenated.

As described above, the method for processing the stream of the digital broadcast transmitter is realized so that a long training sequence can be generated on a boundary between consecutive slots.

That is, the method for processing the stream of the transmitter includes configuring a stream in which slots including a plurality of blocks are continuously placed, and encoding and interleaving the stream to be output as a transport stream.

In the operation of configuring the stream, if slots of a block extension mode 00 in which all of the blocks in a corresponding slots are used are continuously placed, known data may be placed in a predetermined segment of each of adjacent slots so that a long training sequence is generated on a boundary between the adjacent slots engaged with each other in a saw-toothed configuration. The block extension mode 00 is a mode in which all of the blocks including blocks B1 and B2 are used in that slot. Accordingly, on a boundary of a next slot, a sawtooth of the preceding slot and a sawtooth of the following slot are engaged with each other. In this case, known data is placed in an appropriate segment location of the preceding slot and an appropriate segment location of the following slot so that the known data are connected to each other on the sawteeth of the two slots. Specifically, if the known data is placed in the about $130^{th}$ segment of the preceding slot and the $15^{th}$ segment of the following slot, respectively, the known data are connected to each other on the boundary so that a single long training sequence is generated.

As described above, if first known data placed in the sawtooth of the preceding slot of the adjacent slots and second known data placed in the sawtooth of the following slot are alternately connected to each other on the boundary, a value of the first known data and a value of the second known data may be predetermined values to generate a long training sequence known to the digital broadcast receiver.

The known data may be inserted to have the same sequence as the long training sequence used in the slot of the block extension mode 01 in which some block of a corresponding slot is provided to another slot.

FIG. 64 illustrates a stream configuration before interleaving if the block extension mode is 00, and FIG. 65 illustrates a stream configuration after interleaving if the block extension mode 00.

If the known data is placed in the format of a long training sequence, every portion of the known data is not required to be initialized. Accordingly, in this case, the method may include initializing the trellis encoder before the known data corresponding to an initial portion of the long training sequence is trellis-encoded.

On the other hand, if slots of different block extension modes are continuously placed, known data is not continuous on the boundary. Accordingly, in the operation of transmitting, the trellis encoder may be initialized before known data placed in the sawtooth portion on the boundary of the consecutive slots is trellis encoded.

If the known data is placed in the boundary in the format of the long training sequence and transmitted as described above, the method for processing the stream of the digital broadcast receiver may be realized accordingly.

That is, the method for processing the stream of the digital broadcast receiver includes receiving a transport stream which is encoded and interleaved with slots including a plurality of blocks being continuously placed, demodulating the received transport stream, equalizing the demodulated transport stream, and decoding new mobile data from the equalized stream.

Each slot of the transport stream may include at least one of the normal data, the existing mobile data, and the new mobile data.

If slots of the block extension mode 00 in which all blocks in a corresponding slot are used are continuously placed, the transport stream may have known data that is placed in a predetermined segment of each of adjacent slots so that a long training sequence is generated on a boundary between the adjacent slots which are engaged with each other in a saw-toothed configuration.

As described above, the known data placed in the boundary between the preceding slot and the following slot may be continuously connected to each other to generate a long training sequence known to the digital broadcast transmitter and the digital broadcast receiver.

Such a long training sequence may have the same sequence as the long training sequence used in the slot of the block extension mode 01 in which some block in a corresponding slot is provided to another slot.

The digital broadcast receiver may know whether such a long training sequence is used or not by identifying the block extension mode of each slot.

That is, the method for processing the stream of the digital broadcast receiver may further include decoding signaling data of each slot and identifying a block extension mode of each slot. Specifically, the block extension mode may be recorded on a TPC of each slot.

In this case, even if one slot has been received, the digital broadcast receiver may defer to detect and process known data until a block extension mode of the next slot is identified. That is, the method may include, if the decoding of the signaling data of the following one of the adjacent slots is completed and it is identified that the block extension mode of the following slot is 00, detecting known data of the sawtooth portion on the boundary of the adjacent slots as the long training sequence, and processing the known data.

According to another exemplary embodiment, the signaling data of each slot may be realized to inform information on the surrounding slots in advance.

In this case, the digital broadcast receiver may decode the signaling data of the preceding one of the adjacent slots and identify the block extension modes of the preceding slot and the following slot.

The method for processing the stream of the digital broadcast transmitter and the digital broadcast receiver may be performed in the digital broadcast transmitter and the digital broadcast receiver, which have the various configurations as shown in the drawings. For example, the digital broadcast receiver may further include a detection unit to detect and process known data, in addition to the basic elements such as the receiving unit, the demodulator, the equalizer, and the decoding unit. In this case, if it is identified that two slots of the block extension mode 00 are received, the detection unit detects long training data placed in the boundary of the slots and use the long training data to correct an error. Also, the detection unit may provide a result of the detection to at least one of the demodulator, the equalizer, and the decoding unit.

[Training Data Location considering RS Parity]

Regarding a segment having an already determined RS parity value, the already calculated RS parity value should be changed as data of the segment is changed during the trellis encoder initialization, so that the receiver does not incur an error and is normally operated. In the case of a packet in which a trellis initialization byte exists, 20 bytes of a non-systematic RS parity of the packet do not precede the trellis initialization byte. The trellis initialization byte exists only in a location where this condition is satisfied, and training data may be generated by such an initialization byte.

As shown in FIGS. 64 and 65, in order to place the trellis initialization byte before the RS parity, the RS parity location is changed differently from the group format of the BEM 01 slot. That is, in the group format of the BEM 01 slot, the RS parity is placed in the first 5 segments from among the 208 data segments after interleaving, but, in the case of the BEM 00 slot, the RS parity location may be changed so that a portion under block B2 is filled with as shown in FIGS. 64 and 65.

Considering the changed RS parity, the training data distributed in the BEM 00 slot is placed so that the first, the second, and the third training are placed in the 7th and the 8th segments, the 20th and the 21st segments, and the 31st and the 32nd segments, respectively, in blocks B1 and B2. Also, the changed RS parities may be located in the 33rd to the 37th segments of blocks B1 and B2. Also, in the tail region, the first, the second, the third, the fourth, and the fifth training may be located in the 134th and 135th segments, the 150th and the 151st segments, the 163rd and the 164th segments, the 176th and the 177th segments, and the 187th and the 188th segments, respectively. If two BEM 00 slots are adjacent to each other and generate concatenated long training, the first training of blocks B1 and B2 and the third training of the tail region are connected to each other, the second training of blocks B1 and B2 and the fourth training of the tail region are connected to each other, and the third training of blocks B1 and B2 and the fifth training of the tail reguib are connected to each other.

As described above, the training data is placed in various ways and the initialization thereof is performed accordingly.

The digital broadcast receiver detects the training data from the location where the training data is placed. Specifically, the detection unit or the signaling decoder of FIG. 52 may detect information indicating the location of the training data. Accordingly, the training data is detected from the identified location and an error can be corrected.

While not restricted thereto, an exemplary embodiment can be embodied as computer-readable code on a computer-readable recording medium. The computer-readable recording medium is any data storage device that can store data that can be thereafter read by a computer system. Examples of the computer-readable recording medium include read-only memory (ROM), random-access memory (RAM), CD-ROMs, magnetic tapes, floppy disks, and optical data storage devices. The computer-readable recording medium can also be distributed over network-coupled computer systems so that the computer-readable code is stored and executed in a distributed fashion. Also, an exemplary embodiment may be written as a computer program transmitted over a computer-readable transmission medium, such as a carrier wave, and received and implemented in general-use or special-purpose digital computers that execute the programs. Moreover, it is understood that in exemplary embodiments, one or more units of the above-described apparatuses, transmitters, and receivers can include circuitry, a processor, a microprocessor, etc., and may execute a computer program stored in a computer-readable medium.

The foregoing exemplary embodiments and advantages are merely exemplary and are not to be construed as limiting the present inventive concept. Exemplary embodiments can be readily applied to other types of apparatuses. Also, the description of exemplary embodiments is intended to be illustrative, and not to limit the scope of the claims, and many alternatives, modifications, and variations will be apparent to those skilled in the art.

What is claimed is:

1. A method for processing a stream of a digital broadcast transmitter, the method comprising:
   configuring a stream in which slots comprising a plurality of blocks are placed;
   encoding and interleaving the configured stream; and
   outputting the encoded and interleaved stream as a transport stream,
   wherein the configuring the stream comprises, if slots of a block extension mode 00 are continuously placed, connecting known data placed in predetermined locations of adjacent slots to each other in order to generate a long training sequence.

2. The method as claimed in claim 1, wherein first known data which is placed in a tail portion of a preceding slot among the adjacent slots and second known data which is placed in a head portion of a following slot among the adjacent slots are alternately connected to each other on a boundary, and a value of the first known data and a value of the second known data are predetermined values to generate a long training sequence which is known to the digital broadcast transmitter and a digital broadcast receiver.

3. The method as claimed in claim 1, wherein the known data has a same sequence as a long training sequence that is used in a slot of a block extension mode 01 in which some block of a corresponding slot is provided to another slot.

4. The method as claimed in claim 1, wherein the outputting comprises initializing a trellis encoder before known data corresponding to an initial portion of the long training sequence is trellis-encoded.

5. The method as claimed in claim 1, wherein the outputting comprises, if slots of different block extension modes are continuously placed, initializing a trellis encoder before known data which is placed in a sawtooth portion of a boundary between the continuously placed slots is trellis encoded.

6. A digital broadcast transmitter comprising:
   a stream configurator which configures a stream in which slots comprising a plurality of blocks are placed; and
   an exciter which encodes and interleaves the configured stream and outputs the encoded and interleaved stream as a transport stream,
   wherein, if slots of a block extension mode 00 are continuously placed, the stream configurator connects known data placed in predetermined locations of adjacent slots to each other in order to generate a long training sequence.

7. The digital broadcast transmitter as claimed in claim 6, wherein first known data which is placed in a tail portion of a preceding slot among the adjacent slots and second known data which is placed in a head portion of a following slot among the adjacent slots are alternately connected to each other on a boundary, and a value of the first known data and a value of the second known data are predetermined values to generate a long training sequence which is known to the digital broadcast transmitter and a digital broadcast receiver.

8. The digital broadcast transmitter as claimed in claim 6, wherein the known data has a same sequence as a long training sequence that is used in a slot of a block extension mode 01, in which some block of a corresponding slot is provided to another slot.

9. The digital broadcast transmitter as claimed in claim 6, wherein the exciter comprises:
   an encoder which encodes the stream;
   an interleaver which interleaves the encoded stream; and
   a trellis encoder which trellis-encodes the interleaved stream,
   wherein the trellis encoder is initialized before known data corresponding to an initial portion of the long training sequence is trellis-encoded.

10. The digital broadcast transmitter as claimed in claim 9, wherein, if slots of different block extension modes are continuously placed, the trellis encoder is initialized before known data which is placed in a sawtooth portion of a boundary between the continuously placed slots is trellis encoded.

11. A method for processing a stream of a digital broadcast receiver, the method comprising:
- receiving a transport stream which is encoded and interleaved in a state that slots comprising a plurality of blocks are placed;
- demodulating the received transport stream;
- equalizing the demodulated transport stream; and
- decoding second mobile data from the equalized stream,
- wherein each slot of the transport stream comprises at least one of normal data, first mobile data, and the second mobile data,
- wherein, if slots of a block extension mode 00 are continuously placed, in the transport stream, known data which is placed in predetermined locations of adjacent slots are connected to each other in order to generate a long training sequence.

12. The method as claimed in claim 11, wherein first known data which is placed in a tail portion of a preceding slot among the adjacent slots and second known data which is placed in a head portion of a following slot among the adjacent slots are alternately connected to each other on a boundary, and a value of the first known data and a value of the second known data are predetermined values to generate a long training sequence which is known to a digital broadcast transmitter and the digital broadcast receiver.

13. The method as claimed in claim 11, wherein the known data has a same sequence as a long training sequence that is used in a slot of a block extension mode 01, in which some block of a corresponding slot is provided to another slot.

14. The method as claimed in claim 11, further comprising decoding signaling data of each slot and identifying a block extension mode of each of the slots.

15. The method as claimed in claim 14, further comprising, if decoding of signaling data of a following slot among the adjacent slots is completed and a block extension mode of the following slot is identified as 00, detecting known data placed in a sawtooth portion of a boundary between the adjacent slots as the long training sequence and processing the known data.

16. The method as claimed in claim 11, further comprising decoding signaling data of a preceding slot among the adjacent slots and identifying block extension modes of both the preceding slot and a following slot among the adjacent slots.

17. A digital broadcast receiver comprising:
- a receiver which receives a transport stream which is encoded and interleaved in a state that slots comprising a plurality of blocks are placed;
- a demodulator which demodulates the received transport stream;
- an equalizer which equalizes the demodulated transport stream; and
- a decoder which decodes second mobile data from the equalized stream,
- wherein each slot of the transport stream comprises at least one of normal data, first mobile data, and the second mobile data,
- wherein, if slots of a block extension mode 00 are continuously placed, in the transport stream, known data which is placed in predetermined locations of adjacent slots are connected to each other in order to generate a long training sequence.

18. The digital broadcast receiver as claimed in claim 17, wherein first known data which is placed in a tail portion of a preceding slot among the adjacent slots and second known data which is placed in a head portion of a following slot among the adjacent slots are alternately connected to each other on a boundary, and a value of the first known data and a value of the second known data are predetermined values to generate a long training sequence which is known to a digital broadcast transmitter and the digital broadcast receiver.

19. The digital broadcast receiver as claimed in claim 17, wherein the long training sequence has a same sequence as a long training sequence that is used in a slot of a block extension mode 01, in which some block of a corresponding slot is provided to another slot.

20. The digital broadcast receiver as claimed in claim 17, further comprising a signaling decoder which decodes signaling data of each slot and identifies a block extension mode of each of the slots.

21. The digital broadcast receiver as claimed in claim 20, further comprising a detector which, if decoding of signaling data of a following slot among the adjacent slots is completed and a block extension mode of the following slot is identified as 00, detects known data placed in a sawtooth portion of a boundary between the adjacent slots as the long training sequence and processing the known data.

22. The digital broadcast receiver as claimed in claim 17, further comprising a signaling decoder which decodes signaling data of a preceding slot among the adjacent slots and identifies block extension modes of both the preceding slot and a following slot among the adjacent slots.

23. A non-transitory computer readable recording medium having recorded thereon a program executable by a computer for performing the method of claim 1.

24. A non-transitory computer readable recording medium having recorded thereon a program executable by a computer for performing the method of claim 11.

* * * * *